United States Patent
Huang et al.

(10) Patent No.: US 11,063,700 B2
(45) Date of Patent: Jul. 13, 2021

(54) METHOD AND APPARATUS FOR CONSTRUCTING CODING SEQUENCE

(71) Applicant: HUAWEI TECHNOLOGIES CO., LTD., Guangdong (CN)

(72) Inventors: Lingchen Huang, Hangzhou (CN); Gongzheng Zhang, Hangzhou (CN); Ying Chen, Hangzhou (CN); Yunfei Qiao, Hangzhou (CN); Rong Li, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 12 days.

(21) Appl. No.: 16/579,532

(22) Filed: Sep. 23, 2019

(65) Prior Publication Data
US 2020/0092042 A1 Mar. 19, 2020

Related U.S. Application Data

(63) Continuation of application No. PCT/CN2018/080379, filed on Mar. 24, 2018.

(30) Foreign Application Priority Data

Mar. 24, 2017 (CN) .......................... 201710184944.2

(51) Int. Cl.
*H03M 13/00* (2006.01)
*H04L 1/00* (2006.01)
*H03M 13/13* (2006.01)

(52) U.S. Cl.
CPC .......... *H04L 1/0069* (2013.01); *H03M 13/13* (2013.01); *H03M 13/6356* (2013.01);
(Continued)

(58) Field of Classification Search
None
See application file for complete search history.

(56) References Cited

U.S. PATENT DOCUMENTS

2016/0285479 A1* 9/2016 El-Khamy .......... H03M 13/616
2017/0005753 A1* 1/2017 Shen .................... H04L 1/1819
(Continued)

FOREIGN PATENT DOCUMENTS

CN           1534874 A     10/2004
CN       104242957 A     12/2014
(Continued)

OTHER PUBLICATIONS

R1-1703454 LG Electronics,"Design of Polar code for control channel",3GPP TSG RAN WG1 NR Meeting #88 , Athens, Greece, Feb. 13-17, 2017,total 7 pages.
(Continued)

*Primary Examiner* — Mujtaba M Chaudry
(74) *Attorney, Agent, or Firm* — Womble Bond Dickinson (US) LLP

(57) ABSTRACT

Embodiments of this application provide a method and an apparatus for constructing a coding sequence. The method includes: storing a reliability sequence corresponding to a basic sequence, where a length of the reliability sequence corresponding to the basic sequence is less than or equal to a length of a reliability sequence corresponding to a mother code sequence; storing a reliability reference sequence, where the reliability reference sequence includes at least one element remaining after the reliability sequence corresponding to the basic sequence is excluded from the reliability sequence corresponding to the mother code sequence; and constructing a coding sequence by using the reliability sequence corresponding to the basic sequence and an element in the reliability reference sequence. During implementation of this application, during storage, only the reli-
(Continued)

Reliability sequence (a length is $N_{max}$) corresponding to a mother code sequence Reliability sequence (a length is $N_s$) corresponding to a basic sequence Reliability reference sequence (a length is $l_{max} - l_s$)

ability sequence corresponding to the basic sequence and the reliability reference sequence are stored. Because a sum of the length of the reliability sequence corresponding to the basic sequence and a length of the reliability reference sequence is far less than the length of the original reliability sequence, storage overheads can be reduced.

20 Claims, 8 Drawing Sheets

(52) U.S. Cl.
CPC ...... *H03M 13/6375* (2013.01); *H04L 1/0041* (2013.01); *H04L 1/0058* (2013.01)

(56) References Cited

U.S. PATENT DOCUMENTS

| | | | | |
|---|---|---|---|---|
| 2017/0012739 A1* | 1/2017 | Shen | ..................... | H04L 1/0041 |
| 2017/0047947 A1* | 2/2017 | Hong | ................ | H03M 13/2906 |
| 2017/0222757 A1* | 8/2017 | Huang | ................ | H03M 13/13 |

FOREIGN PATENT DOCUMENTS

| | | |
|---|---|---|
| CN | 105281785 A | 1/2016 |
| CN | 106059596 A | 10/2016 |
| CN | 106506079 A | 3/2017 |
| CN | 108631793 A | 10/2018 |
| EP | 1211682 A3 | 12/2003 |
| EP | 2724467 A1 | 4/2014 |
| EP | 2899911 B1 | 2/2018 |

OTHER PUBLICATIONS

R1-1702498 LG Electronics,"Design of Polar code for control channel",3GPP TSG RAN WG1 NR Meeting #88,Athens, Greece, Feb. 13-17, 2017,total 6 pages.

Huawei et al.,"Construction schemes for polar codes",3GPP TSG RAN WG1 Meeting #88 R1-1701702,Athens, Greece, Feb. 13-17, 2017,total 8 pages.

Huawei et al.,"Details of the Polar code design",3GPP TSG RAN WG1 Meeting #87 R1-1611254,Reno, USA, Nov. 10-14, 2016,total 16 pages.

\* cited by examiner

METHOD AND APPARATUS FOR CONSTRUCTING CODING SEQUENCE

CROSS-REFERENCE TO RELATED APPLICATIONS

This application is a continuation of International Application No. PCT/CN2018/080379, filed on Mar. 24, 2018, which claims priority to Chinese Patent Application No. 201710184944.2, filed on Mar. 24, 2017. The disclosures of the aforementioned applications are hereby incorporated by reference in their entireties.

TECHNICAL FIELD

This application relates to the communications field, and in particular, to a technical solution for constructing a coding sequence.

BACKGROUND

The rapid evolution of wireless communication indicates that a 5G communications system will present some new characteristics in the future. Three most typical communication scenarios include an Enhanced Mobile Broadband (eMBB) scenario, a Massive Machine Type Communication (mMTC), scenario, and an Ultra Reliable Low Latency (URLLC) scenario. Demands of these communication scenarios pose a new challenge to an existing LTE technology.

As a most basic wireless access technology, channel coding is one of important research objects that satisfy a 5G communication demand. Since the Shannon theory was put forward, scholars of various countries have being devoted to finding a coding/decoding method that can reach a Shannon limit and that has relatively low complexity. In the progress of 5G standard formulation, a low density parity code (LDPC) has been accepted as a data channel coding scheme for the eMBB scenario, and a polar code has been accepted as a control channel coding scheme for the eMBB scenario. However, the URLLC scenario and the mMTC scenario impose a strict requirement on a latency and reliability of channel coding.

A polar code is a coding scheme proposed by Arikan based on channel polarization. The polar code is the first and the only known channel coding method that can strictly provably "reach" a channel capacity.

Brief description of polar coding/decoding is as follows:

A polar code is a linear block code. A generator matrix of the polar code is $F_N$, and a polar coding process is $x_1^N = u_1^N F_N$, where $u_1^N = (u_1, u_2, \ldots u_N)$ is a binary row vector with a length of N (that is, a code length), $F_N$ is an N×N matrix, and $F_N = F_2^{\otimes (\log_2 N)}$. Herein, $$F_2 = \begin{bmatrix} 1 & 0 \\ 1 & 1 \end{bmatrix},$$

and $F_2^{\otimes (\log_2 N)}$ is defined as a Kronecker product of $\log_2^N$ matrices $F_2$. All the foregoing addition and multiplication operations are addition and multiplication operations in a binary Galois field. In the polar coding process, some bits in $u_1^N$ are used to carry information and are referred to as information bits, and a set of indexes of these bits is denoted as A; and the other bits are set to fixed values pre-agreed on between a receive end and a transmit end and are referred to as fixed bits, and a set of indexes of these bits is denoted as a complementary set $A^c$ of A.

It is noted that, in a classical polar code, an information bit is a part carrying information. Actually, because an information bit further undergoes cyclic redundancy check coding, parity check coding, and the like before undergoing polar code coding, an index set A in a polar code construction process includes sequences of $K_{info}+K_{check}$ information bit sequence numbers with highest reliability other than a sequence number of a to-be-punctured bit, where $K_{info}$ is a quantity of information bits, $K_{check}$ is a quantity of check bits, and the check bit includes but is not limited to a cyclic redundancy check (CRC) bit and a dynamic check bit, and $K_{check} \geq 0$. Without loss of generality, in the following example of polar code construction, K information bits are used as an example, and a check bit is included in the information bits.

A process for determining an information bit set A based on an information bit length and a coding codeword length is referred to as a polar code construction process. Currently, polar code construction includes methods such as online calculation of reliability (an error probability) of each sub-channel and offline storage of a reliability sequence and a reliability sorting sequence.

However, in a creation process of this application, the inventor found that, storage overheads of a reliability sequence in the prior art are very large, and this is not conducive to product implementation.

SUMMARY

To resolve a problem in the prior art that storage overheads for constructing a polar code are large, this application provides a method for constructing a coding sequence and a corresponding apparatus.

In this application, some transformations are performed on a reliability sequence corresponding to a mother code sequence with a maximum length of $N_{max}$, and the reliability sequence corresponding to the mother code sequence is indicated by a reliability sequence corresponding to a basic sequence and a reliability reference sequence. Then, a coding sequence is constructed based on the stored reliability sequence corresponding to the basic sequence and the stored reliability reference sequence. In an implementation, a coding sequence in embodiments of this application is a polar code sequence.

A length of the reliability sequence corresponding to the basic sequence is less than or equal to a length of the reliability sequence corresponding to the mother code sequence; the basic sequence is a subset of the mother code sequence; the reliability sequence corresponding to the basic sequence is a subset of the reliability sequence corresponding to the mother code sequence; and the reliability reference sequence includes at least one element remaining after the reliability sequence corresponding to the basic sequence is excluded from the reliability sequence corresponding to the mother code sequence.

During storage, only the reliability sequence corresponding to the basic sequence and the reliability reference sequence are stored. Because a sum of the length of the reliability sequence corresponding to the basic sequence and a length of the reliability reference sequence is far less than the length of the reliability sequence corresponding to the mother code sequence, storage overheads can be reduced, and the reliability sequence corresponding to the mother code sequence can be indicated.

In addition, the method provided in this application further includes: storing a reliability quantization sequence and a reliability quantization reference sequence. The reliability quantization sequence is a sequence obtained through quantization of the reliability sequence corresponding to the basic sequence, and the reliability quantization reference sequence is obtained through quantization of the reliability reference sequence According to another aspect, this application provides an apparatus for constructing a coding sequence, including:

a memory, configured to store a reliability sequence corresponding to a basic sequence, where a length of the reliability sequence corresponding to the basic sequence is less than or equal to a length of a reliability sequence corresponding to a mother code sequence, where the memory is further configured to store a reliability reference sequence, where the reliability reference sequence includes at least one element remaining after the reliability sequence corresponding to the basic sequence is excluded from the reliability sequence corresponding to the mother code sequence; and a processor, configured to construct a coding sequence by using the reliability sequence corresponding to the basic sequence and the reliability reference sequence that are stored in the memory.

In this embodiment of this application, the apparatus for constructing a coding sequence is a terminal or a network side device.

An embodiment of this application provides a terminal, where the function may be implemented by hardware; and a structure of the terminal includes a transceiver and processor. The function may be alternatively implemented by hardware by executing corresponding software. The hardware or software includes one or more modules corresponding to the foregoing function. The module may be software and/or hardware.

According to still another aspect, an embodiment of this application provides a network side device, where the network side device may be a base station, or may be a control node.

According to still another aspect, an embodiment of this application provides a base station, where the base station has a function of implementing an actual behavior of a base station in the foregoing method. The function may be implemented by hardware, or may be implemented by hardware by executing corresponding software. The hardware or software includes one or more modules corresponding to the foregoing function.

In an embodiment, a structure of the base station includes a processor and a transceiver, where the processor is configured to support the base station in performing the corresponding function in the foregoing method. The transceiver is configured to support communication between the base station and a terminal, send information or signaling in the foregoing method to the terminal, and receive information or an instruction sent by the base station. The base station may further include a memory, where the memory is configured to be coupled to the processor and stores a program instruction and data that are necessary for the base station.

According to still another aspect, an embodiment of this application provides a control node, where the control node may include a controller/processor, a memory, and a communications unit. The controller/processor may be configured to coordinate resource management and configuration between a plurality of base stations and perform the method described in the foregoing embodiment. The memory may be configured to store program code and data of the control node. The communications unit is configured to support communication between the control node and a base station.

According to still another aspect, an embodiment of this application provides a communications system, where the system includes the base station and the terminal that are described in the foregoing aspects. Optionally, the system may further include the control node in the foregoing embodiment.

According to still another aspect, an embodiment of this application provides a computer storage medium, configured to store a computer software instruction used by the foregoing base station. The computer storage medium includes a program designed for performing the method in the foregoing aspects.

According to still another aspect, an embodiment of this application provides a computer storage medium, configured to store a computer software instruction used by the foregoing terminal. The computer storage medium includes a program designed for performing the method in foregoing aspects.

This application provides a reliability sequence and a reliability reference sequence that are used for constructing a coding sequence, where the reliability sequence includes reliability corresponding to a basic sequence.

For a form of the reliability sequence, refer to a description in the embodiments about a reliability sequence corresponding to a basic sequence, or a description in the embodiments about a reliability quantization sequence corresponding to a basic sequence.

The foregoing reliability sequence and reliability reference sequence may exist in a terminal or a network device.

DESCRIPTION OF DRAWINGS

To describe the technical solutions in embodiments of this application, the following briefly describes the accompanying drawings required for describing the embodiments in this application. The accompanying drawings in the following description show merely some embodiments of this application, and a person of ordinary skill in the art may derive other drawings from these accompanying drawings without creative efforts.

DESCRIPTION OF EMBODIMENTS

The following describes the embodiments provided in this application.

Figure 1:
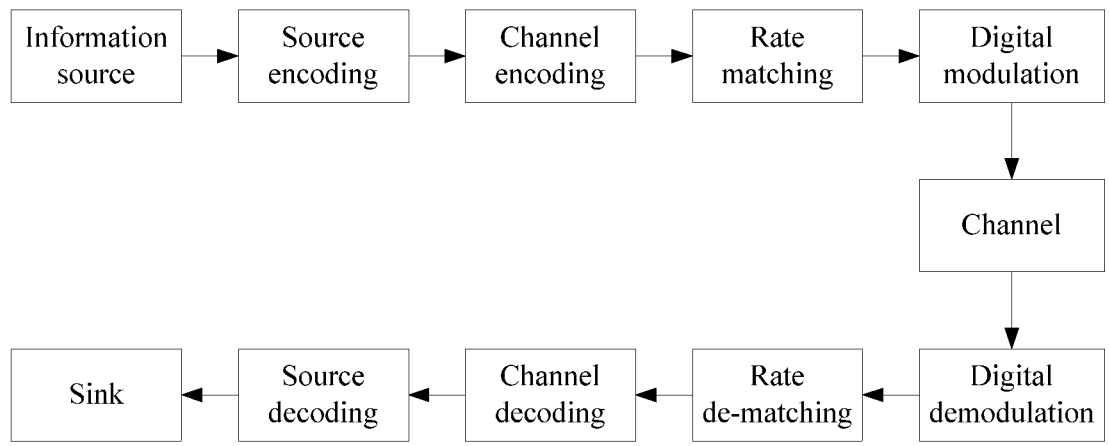
FIG. 1 is a schematic diagram of an implementation scenario of a method for constructing a coding sequence according to this application.

In a next generation communications network, three most typical communication scenarios include an eMBB scenario, an mMTC scenario, and a URLLC scenario. Demands of these communication scenarios pose a new challenge to an existing LTE technology. Channel coding for improving data transmission reliability and ensuring communication quality is a most basic wireless access technology. As shown in FIG. 1, channel coding is first performed on source information; modulation is performed on encoded information; information having undergone coding and modulation is transmitted to a receive end through a channel; corresponding digital demodulation and rate de-matching are performed on received information at the receive end; and finally, the information is obtained by using a decoding technology corresponding to channel coding.

This application provides a technical solution for constructing a reliability sequence and constructing a coding sequence based on the reliability sequence in a channel coding process shown in FIG. 1.

In the embodiments of this application, that a coding sequence is a polar (polar) code sequence is used as an example for description.

During polar code construction, for a mother code sequence with a given length of $N_{max}=2^{l_{max}}$, different methods such as density evolution, capacity transfer, and an empirical formula may be used to perform calculation to obtain a reliability sequence with a length of $N_{max}$; and sorting is performed on the reliability sequence with the length of $N_{max}$ in descending order or ascending order of reliability values, to obtain a reliability sorting sequence Q.

For the reliability sorting sequence Q with the given length of $N_{max}$, reliability of a subchannel corresponding to an element $Q_i$ whose sequence number i is relatively small is relatively low (according to an ascending order), or reliability of a subchannel corresponding to an element $Q_i$ whose sequence number i is relatively small is relatively high (according to a descending order). During construction of a polar code with an information length of K and a coding length of M by using the sequence, operations of reading the sequence Q include the following:

1. Determine, based on the coding length M and the information length $K_{info}$, a code length N of a reliability sequence used for constructing a coding sequence. In a possible implementation, $N=2^{\lceil log_2 M \rceil}$, where M is a coding length, $\lceil \cdot \rceil$ is a rounding up operation, a reliability sorting sequence Q with a length of N is read from the reliability sorting sequence Q with the length of $N_{max}$.

2. Calculate N−M rate matching positions based on a rate matching condition.

3. Successively read, starting from i=0 (or N−1), elements whose reliability values are relatively small from the reliability sorting sequence Q with the length of; and if the element belongs to a rate matching position, skip the element until M−K elements are read.

A frozen position set is a union set of position sets obtained in operation 2 and operation 3, and an information bit sequence number set (with a size of K) is a complementary set of the frozen position set.

The foregoing reliability sorting sequence Q is obtained through reliability sequence sorting, and this process may be completed in an off-line manner.

Figure 2:
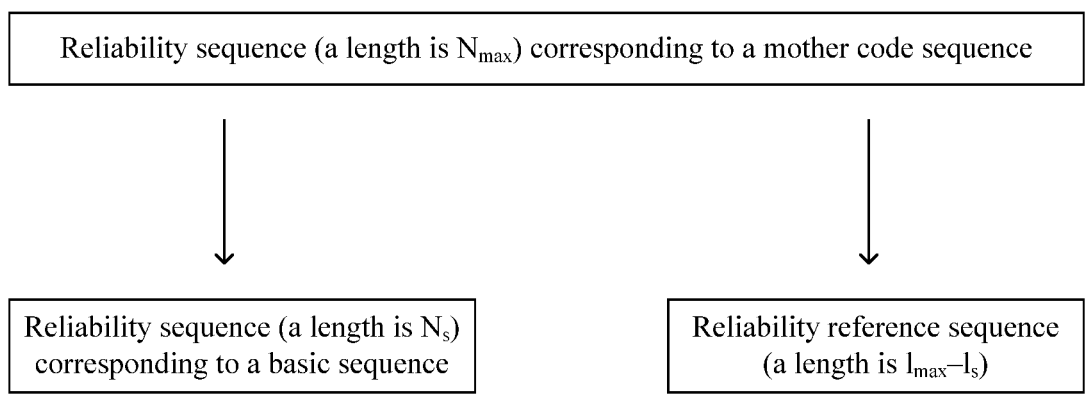
FIG. 2 is a schematic diagram of Embodiment 1 of a method for constructing a coding sequence according to this application.

In a method for constructing a coding sequence provided in an embodiment of this application, as shown in FIG. 2, a reliability sequence corresponding to a basic sequence and a reliability reference sequence are stored first, where a length of the reliability sequence corresponding to the basic sequence is less than or equal to a length of a reliability sequence corresponding to a mother code sequence, and the reliability reference sequence includes at least one element remaining after the reliability sequence corresponding to the basic sequence is excluded from the reliability sequence corresponding to the mother code sequence.

Then, a coding sequence is constructed by using the reliability sequence corresponding to the basic sequence and the reliability reference sequence.

The reliability sequence corresponding to the mother code sequence is indicated by using $\{PW_i, 0 \leq i \leq 2^{l_{max}}\}$, the reliability sequence corresponding to the basic sequence is indicated by using $PW_i = \sum_{j=0}^{n-1} B_j(\beta)^j$, and $(i)_{dec} \stackrel{\Delta}{=} (B_{n-1} B_{n-2} \ldots B_0)_{bin}$, where $(i)_{dec}$ indicates that i is a decimal number, $(B_{n-1} B_{n-2} \ldots B_0)_{bin}$ indicates a binary number, and $\beta$ is an exponent base. The reliability sequence corresponding to the basic sequence may also be indicated by using $\{PW_i, 0 \leq i \leq 2^{l_s}\}$. The length of the reliability sequence $\{PW_i, 0 \leq i \leq 2^{l_{max}}\}$ corresponding to the mother code sequence is $N^{max}=2^{l_{max}}$, and the length of the reliability sequence corresponding to the basic sequence is $N_s=2^{l_s}$, where $0 \leq l_s < l_{max}$.

The length $N_s$ of the reliability sequence corresponding to the basic sequence is less than the length $N_{max}$ of the reliability sequence corresponding to the mother code sequence, and the reliability reference sequence stores several elements that can indicate the reliability sequence corresponding to the mother code sequence, the reliability reference sequence may be indicated by using $$PW_{2^{l_s}} = (\beta)^{l_s}, PW_{2^{l_s}+1} = (\beta)^{l_s+1}, \ldots, PW_{2^{l_{max}-1}} = (\beta)^{l_{max}-1}$$

or $\{PW_i, i=2^{l_s}, 2^{l_s+1}, \ldots, 2^{l_{max}-1}\}$, and a length of the reliability reference sequence is only $l_{max}-l_s$. Therefore, during storage, only $N_s+(l_{max}-l_s)$ values need to be stored, and the value is far less than $N_{max}$, thereby greatly reducing storage overheads. In a reading process, extension is performed on the reference sequence or a plurality of times of reading are performed on the reference sequence, to obtain a subchannel set with high reliability, and a manner of extension or a plurality of times of reading is related to a type of the reliability sequence.

If the length of the stored reliability sequence corresponding to the basic sequence is $N_s=2^{l_s}$, according to a calculation formula $PW_i = \sum_{j=0}^{n-1} B_j(\beta)^j$ of a PW sequence, where $(i)_{dec} \stackrel{\Delta}{=} (B_{n-1} B_{n-2} \ldots B_0)_{bin}$, and based on a stored sequence $\{PW_i, i=2^{l_s}, 2^{l_s+1}, \ldots, 2^{l_{max}-1}\}$ formed by reliability reference values such as $$PW_{2^{l_s}}, PW_{2^{l_s}+1}, \ldots, PW_{2^{l_{max}-1}},$$

the reliability sequence corresponding to the mother code sequence with the length of $N_{max}$ can be completely indicated.

Based on this, during construction of a coding sequence such as a polar code sequence, the stored reliability sequence with the length of $N_s=2^{l_s}$ and corresponding to the basic sequence is read based on a length of the polar code that needs to be constructed; extension is performed or a plurality of times of reading are performed, based on a value of an element in the reliability reference sequence, on the reliability sequence with the length of $N_s=2^{l_s}$ and corresponding to the basic sequence; and ($K_{info}+K_{check}$) information bit sequence numbers with highest reliability other than a sequence number of a to-be-punctured bit are selected to form an information bit sequence number set A, where $K_{info}$ is a quantity of information bits, $K_{check}$ is a quantity of check bits, and the check bit includes but is not limited to a CRC bit and a dynamic check bit, and $K_{check} \geq 0$. Then, a corresponding information bit sequence and a dynamic check bit sequence (if exists) are mapped to these sequence numbers; and remaining sequence numbers are a static frozen-bit sequence number set, and a value of a frozen bit is a fixed value agreed on between a receive end and a transmit end.

In examples of subsequent embodiments, obtaining an information bit sequence number set first is used as an example for description. A principle of obtaining a frozen-bit sequence number set first and then selecting a complementary set of the frozen-bit sequence number set to obtain an information bit sequence is the same as that of obtaining an information bit sequence number set first, and details are not repeated.

In an embodiment, constructing a coding sequence, the reliability sequence with the length of N is obtained by performing, by using an element in the reliability reference sequence $$PW_{2^{l_s}} = (\beta)^{l_s}, PW_{2^{l_s}+1} = (\beta)^{l_s+1}, \ldots, PW_{2^{l_{max}}-1} = (\beta)^{l_{max}-1},$$

extension on elements $PW_i=\Sigma_{j=0}^{n-1}B_j(\beta)^j$ in the reliability sequence with a length of $N_s$ and corresponding to the basic sequence, and $\beta$ is an exponent base.

In an aspect, constructing a coding sequence includes:
recording a reliability sorting sequence Q, wherein the reliability sorting sequence Q is obtained through sorting performed on elements in the reliability sequence with the length of N based on reliability values.

In an aspect, constructing a coding sequence includes:
obtaining an information bit sequence number set A, wherein a quantity of elements in the information bit sequence number set A is equal to a threshold K; and the elements in the information bit sequence number set A are most reliable K elements that are in the reliability sorting sequence Q and whose sequence numbers do not satisfy a rate matching condition.

In an aspect, constructing a coding sequence includes:
obtaining an information bit sequence number set A, wherein a quantity of elements in the information bit sequence number set A is equal to a threshold K; and the information bit sequence number set A is a complementary set of a frozen-bit sequence number set $A^c$, and elements in the frozen-bit sequence number set $A^c$ are (N−K) elements that are in the reliability sorting sequence Q and whose sequence numbers satisfy a rate matching condition or whose reliability is lowest.

In an aspect, constructing a coding sequence includes:
obtaining an information bit sequence number set A, wherein a quantity of elements in the information bit sequence number set A is equal to a threshold K; and an element in the information bit sequence number set A is an element that is in the reliability sequence with the length of N, whose value is greater than or equal to a threshold $PW_{th}$ of a polar code, and whose sequence number does not satisfy a rate matching condition.

In an aspect, constructing a coding sequence includes:
obtaining an information bit sequence number set A, wherein a quantity of elements in the information bit sequence number set A is equal to a threshold K; and the information bit sequence number set A is a complementary set of a frozen-bit sequence number set $A^c$, and an element in the frozen-bit sequence number set $A^c$ is an element that is in the reliability sequence with the length of N and whose value is less than a threshold $PW_{th}$ of a polar code or whose sequence number satisfies a rate matching condition.

The following describes, by using Embodiment 1 to Embodiment 4, a method for constructing a coding sequence provided in this application.

Embodiment 1

Embodiment 1 describes storage processes of a reliability sequence corresponding to a basic sequence and a reliability reference sequence.

First, a reliability sequence corresponding to a mother code sequence with a length $N_{max}=2^{l_{max}}$ is transformed into the following according to a p w formula:

$$PW_i = \sum_{j=0}^{l_{max}-1} B_j(\beta)^j =$$

$$\sum_{j=0}^{l_s-1} B_j(\beta)^j + B_{l_s}(\beta)^{l_s} + B_{l_s+1}(\beta)^{l_s+1} + \ldots + B_{l_{max}-1}(\beta)^{l_{max}-1}$$

Based on this, a reliability sequence corresponding to a basic sequence is as follows:

$PW_i = \Sigma_{j=0}^{n-1}B_j(\beta)^j$, $0 \leq i \leq 2^{l_s}$, and $(i)_{dec} \stackrel{\Delta}{=} (B_{n-1} B_{n-2} \ldots B_0)_{bin}$, where $(i)_{dec}$ indicates that i is a decimal number, $(B_{n-1} B_{n-2} \ldots B_0)_{bin}$ indicates a binary number, and $\beta$ is a exponent base. A length of the reliability sequence corresponding to the basic sequence is $N_s=2^{l_s}$, where $0 \leq l_s < l_{max}$.

The reliability reference sequence is $$PW_{2^{l_s}} = (\beta)^{l_s}, PW_{2^{l_s}+1} = (\beta)^{l_s+1}, \ldots, PW_{2^{l_{max}}-1} = (\beta)^{l_{max}-1}.$$

A length of the reliability reference sequence is $l_{max}-l_s$.

According to the reliability sequence $PW_j=\Sigma_{j=0}^{n-1}B_j(\beta)^j$ corresponding to the basic sequence, $0 \leq i \leq 2^{l_s}$, and the reliability reference sequence $$PW_{2^{l_s}} = (\beta)^{l_s}, PW_{2^{l_s}+1} = (\beta)^{l_s+1}, \ldots, PW_{2^{l_{max}}-1} = (\beta)^{l_{max}-1},$$

the reliability sequence corresponding to the mother code sequence with the length of $N_{max}$ can be completely indicated.

According to the foregoing formula, for reliability sequences corresponding to mother code sequences with different lengths $N_{max}$, for example, when $l_{max} \in [8, 9, 10, 11,$ 12], the mother code length is $N_{max}=2^{l_{max}} \in [256, 512, 1024, 2048, 4096]$; $l_s \in [0, 1, 2, 3, 4, 5, 6, 7, 8, 9, 10, 11]$, and the length of the reliability sequence corresponding to the basic sequence is $N_s=2^{l_s} \in [1, 2, 4, 8, 16, 32, 64, 128, 256, 512, 1024, 2048]$.

These cases are only used as examples. In this application, a reliability sequence corresponding to a mother code sequence with a length and a value range of the length of the reliability sequence corresponding to the basic sequence are not limited thereto. All the reliability sequences can be stored by using a method provided in an embodiment of this application, and the following separately uses mother code sequences with lengths of $N_{max}=512, 1024, 2048$ as examples for description.

1. For a long reliability sequence corresponding to a mother code sequence with a length of $N_{max}=2^{l_{max}}=2^9=512$, $\beta=20^{0.25}$ is set; and according to a prior-art storage manner, 13-bit quantization is performed on stored values of 512 elements in the reliability sequence, as shown in Table 1:

TABLE 1

| 0 | 413 | 491 | 903 | 583 | 996 | 1074 | 1487 |
|---|---|---|---|---|---|---|---|
| 694 | 1106 | 1184 | 1597 | 1277 | 1690 | 1768 | 2180 |
| 825 | 1238 | 1316 | 1728 | 1408 | 1821 | 1899 | 2312 |
| 1519 | 1931 | 2009 | 2422 | 2102 | 2515 | 2593 | 3005 |
| 981 | 1394 | 1472 | 1884 | 1565 | 1977 | 2055 | 2468 |
| 1675 | 2087 | 2166 | 2578 | 2258 | 2671 | 2749 | 3161 |
| 1806 | 2219 | 2297 | 2709 | 2390 | 2802 | 2880 | 3293 |
| 2500 | 2913 | 2991 | 3403 | 3083 | 3496 | 3574 | 3987 |
| 1167 | 1579 | 1657 | 2070 | 1750 | 2163 | 2241 | 2653 |
| 1861 | 2273 | 2351 | 2764 | 2444 | 2857 | 2935 | 3347 |
| 1992 | 2404 | 2482 | 2895 | 2575 | 2988 | 3066 | 3478 |
| 2686 | 3098 | 3176 | 3589 | 3269 | 3682 | 3760 | 4172 |
| 2148 | 2560 | 2639 | 3051 | 2731 | 3144 | 3222 | 3634 |
| 2842 | 3254 | 3332 | 3745 | 3425 | 3838 | 3916 | 4328 |
| 2973 | 3386 | 3464 | 3876 | 3556 | 3969 | 4047 | 4460 |
| 3667 | 4079 | 4157 | 4570 | 4250 | 4663 | 4741 | 5153 |
| 1388 | 1800 | 1878 | 2291 | 1971 | 2384 | 2462 | 2874 |
| 2081 | 2494 | 2572 | 2984 | 2665 | 3077 | 3155 | 3568 |
| 2213 | 2625 | 2703 | 3116 | 2796 | 3209 | 3287 | 3699 |
| 2906 | 3319 | 3397 | 3810 | 3490 | 3902 | 3980 | 4393 |
| 2369 | 2781 | 2859 | 3272 | 2952 | 3365 | 3443 | 3855 |
| 3063 | 3475 | 3553 | 3966 | 3646 | 4058 | 4137 | 4549 |
| 3194 | 3606 | 3684 | 4097 | 3777 | 4190 | 4268 | 4680 |
| 3888 | 4300 | 4378 | 4791 | 4471 | 4884 | 4962 | 5374 |
| 2554 | 2967 | 3045 | 3457 | 3138 | 3550 | 3628 | 4041 |
| 3248 | 3661 | 3739 | 4151 | 3832 | 4244 | 4322 | 4735 |
| 3379 | 3792 | 3870 | 4283 | 3963 | 4375 | 4453 | 4866 |
| 4073 | 4486 | 4564 | 4976 | 4657 | 5069 | 5147 | 5560 |
| 3536 | 3948 | 4026 | 4439 | 4119 | 4531 | 4610 | 5022 |
| 4229 | 4642 | 4720 | 5132 | 4813 | 5225 | 5303 | 5716 |
| 4361 | 4773 | 4851 | 5264 | 4944 | 5357 | 5435 | 5847 |
| 5054 | 5467 | 5545 | 5957 | 5638 | 6050 | 6128 | 6541 |
| 1650 | 2063 | 2141 | 2553 | 2234 | 2646 | 2724 | 3137 |
| 2344 | 2756 | 2834 | 3247 | 2927 | 3340 | 3418 | 3830 |
| 2475 | 2888 | 2966 | 3378 | 3059 | 3471 | 3549 | 3962 |
| 3169 | 3581 | 3660 | 4072 | 3752 | 4165 | 4243 | 4655 |
| 2631 | 3044 | 3122 | 3534 | 3215 | 3627 | 3705 | 4118 |
| 3325 | 3738 | 3816 | 4228 | 3908 | 4321 | 4399 | 4812 |
| 3456 | 3869 | 3947 | 4359 | 4040 | 4452 | 4530 | 4943 |
| 4150 | 4563 | 4641 | 5053 | 4734 | 5146 | 5224 | 5637 |
| 2817 | 3229 | 3307 | 3720 | 3400 | 3813 | 3891 | 4303 |
| 3511 | 3923 | 4001 | 4414 | 4094 | 4507 | 4585 | 4997 |
| 3642 | 4054 | 4133 | 4545 | 4225 | 4638 | 4716 | 5128 |
| 4336 | 4748 | 4826 | 5239 | 4919 | 5332 | 5410 | 5822 |
| 3798 | 4211 | 4289 | 4701 | 4381 | 4794 | 4872 | 5285 |
| 4492 | 4904 | 4982 | 5395 | 5075 | 5488 | 5566 | 5978 |
| 4623 | 5036 | 5114 | 5526 | 5207 | 5619 | 5697 | 6110 |
| 5317 | 5729 | 5807 | 6220 | 5900 | 6313 | 6391 | 6803 |
| 3038 | 3450 | 3528 | 3941 | 3621 | 4034 | 4112 | 4524 |
| 3731 | 4144 | 4222 | 4635 | 4315 | 4727 | 4805 | 5218 |
| 3863 | 4275 | 4353 | 4766 | 4446 | 4859 | 4937 | 5349 |
| 4557 | 4969 | 5047 | 5460 | 5140 | 5552 | 5631 | 6043 |
| 4019 | 4431 | 4509 | 4922 | 4602 | 5015 | 5093 | 5505 |
| 4713 | 5125 | 5203 | 5616 | 5296 | 5709 | 5787 | 6199 |
| 4844 | 5256 | 5334 | 5747 | 5427 | 5840 | 5918 | 6330 |
| 5538 | 5950 | 6028 | 6441 | 6121 | 6534 | 6612 | 7024 |
| 4204 | 4617 | 4695 | 5108 | 4788 | 5200 | 5278 | 5691 |
| 4898 | 5311 | 5389 | 5801 | 5482 | 5894 | 5972 | 6385 |
| 5030 | 5442 | 5520 | 5933 | 5613 | 6025 | 6104 | 6516 |
| 5723 | 6136 | 6214 | 6626 | 6307 | 6719 | 6797 | 7210 |
| 5186 | 5598 | 5676 | 6089 | 5769 | 6182 | 6260 | 6672 |
| 5879 | 6292 | 6370 | 6783 | 6463 | 6875 | 6953 | 7366 |
| 6011 | 6423 | 6501 | 6914 | 6594 | 7007 | 7085 | 7497 |
| 6704 | 7117 | 7195 | 7608 | 7288 | 7700 | 7778 | 8191 |

There may be the following several implementations, provided in this application, for transforming the reliability sequence with a length of 512 to a reliability sequence corresponding to a basic sequence and a reliability reference sequence:

(1) It is set that $l_s=3$, $N_s=8$, and $PW_i$, $0 \leq I < 8$. A reliability sequence corresponding to a basic sequence can be obtained according to the foregoing formula, and after 13-bit quantization is performed on values of elements in the reliability sequence, an obtained reliability quantization sequence corresponding to the basic sequence is shown in Table 2:

TABLE 2

| 0 | 1 | 2 | 3 | 4 | 5 | 6 | 7 |
|---|---|---|---|---|---|---|---|
| 0 | 413 | 491 | 903 | 583 | 996 | 1074 | 1487 |

A quantized reliability reference sequence obtained according to the foregoing formula is shown in Table 3:

TABLE 3

| 8 | 16 | 32 | 64 | 128 | 256 |
|---|---|---|---|---|---|
| 694 | 825 | 981 | 1167 | 1388 | 1650 |

It can be learned from Table 2 and Table 3 that, during storage of the quantized reliability sequence corresponding to the basic sequence or the reliability quantization sequence, only $2^{l_s}=2^3=8$ values need to be stored; during storage of the quantized reliability reference sequence or the reliability quantization reference sequence, $l_{max}-l_s=9-3=6$ values need to be stored; and only a total of $8+6=14$ values need to be stored. Therefore, compared with a previous case in which 512 values need to be stored (Table 1), storage space of $(512-14)/512=97.3\%$ can be saved, thereby greatly reducing storage overheads and improving storage efficiency.

(2) It is set that $l_s=4$, $N_s=16$, and $PW_i$, $0 \leq i < 16$. A reliability sequence corresponding to a basic sequence can be obtained according to the foregoing formula, and after 13-bit quantization is performed on values of elements in the reliability sequence, an obtained reliability quantization sequence corresponding to the basic sequence is shown in Table 4:

TABLE 4

| 0 | 1 | 2 | 3 | 4 | 5 | 6 | 7 |
|---|---|---|---|---|---|---|---|
| 0 | 413 | 491 | 903 | 583 | 996 | 1074 | 1487 |
| 8 | 9 | 10 | 11 | 12 | 13 | 14 | 15 |
| 694 | 1106 | 1184 | 1597 | 1277 | 1690 | 1768 | 2180 |

A quantized reliability reference sequence obtained according to the foregoing formula is shown in Table 5:

TABLE 5

| 16 | 32 | 64 | 128 | 256 |
|---|---|---|---|---|
| 825 | 981 | 1167 | 1388 | 1650 |

It can be learned from Table 4 and Table 5 that, during storage of the quantized reliability sequence corresponding to the basic sequence or the reliability quantization sequence, only $2^{l_s}=2^4=16$ values need to be stored; during storage of the quantized reliability reference sequence or the reliability quantization reference sequence, $l_{max}-l_s=9-4=5$ values need to be stored; and only a total of 16+5=21 values need to be stored. Therefore, compared with a previous case in which 512 values need to be stored (Table 1), storage space of (512−21)/512=95% can be saved, thereby greatly reducing storage overheads and improving storage efficiency.

(3) It is set that $l_s=5$, $N_s=32$, and $PW_i$, $0 \le i < 32$. A reliability sequence corresponding to a basic sequence can be obtained according to the foregoing formula, and after 13-bit quantization is performed on values of elements in the reliability sequence, an obtained reliability quantization sequence corresponding to the basic sequence is shown in Table 6:

TABLE 6

| 0 | 1 | 2 | 3 | 4 | 5 | 6 | 7 |
|---|---|---|---|---|---|---|---|
| 0 | 413 | 491 | 903 | 583 | 996 | 1074 | 1487 |
| 8 | 9 | 10 | 11 | 12 | 13 | 14 | 15 |
| 694 | 1106 | 1184 | 1597 | 1277 | 1690 | 1768 | 2180 |
| 16 | 17 | 18 | 19 | 20 | 21 | 22 | 23 |
| 825 | 1238 | 1316 | 1728 | 1408 | 1821 | 1899 | 2312 |
| 24 | 25 | 26 | 27 | 28 | 29 | 30 | 31 |
| 1519 | 1931 | 2009 | 2422 | 2102 | 2515 | 2593 | 3005 |

A quantized reliability reference sequence obtained according to the foregoing formula is shown in Table 7:

TABLE 7

| 32 | 64 | 128 | 256 |
|---|---|---|---|
| 981 | 1167 | 1388 | 1650 |

It can be learned from Table 6 and Table 7 that, during storage of the reliability sequence corresponding to the basic sequence or the reliability quantization sequence, only $2^{l_s}=2^5=32$ values need to be stored; during storage of the quantized reliability reference sequence or the reliability quantization reference sequence, $l_{max}-l_s=9-5=4$ values need to be stored; and only a total of 32+4=36 values need to be stored. Therefore, compared with a case in which 512 values need to be stored for original reliability (Table 1), storage space of (512−36)/512=92.9% can be saved, thereby greatly reducing storage overheads and improving storage efficiency.

(4) It is set that $l_s=6$, $N_s=64$, and $PW_i$, $0 \le i < 64$. A reliability sequence can be obtained according to the foregoing formula, and after 13-bit quantization is performed on values in the reliability sequence, an obtained reliability sequence is shown in Table 8:

TABLE 8

| 0 | 1 | 2 | 3 | 4 | 5 | 6 | 7 |
|---|---|---|---|---|---|---|---|
| 0 | 413 | 491 | 903 | 583 | 996 | 1074 | 1487 |
| 8 | 9 | 10 | 11 | 12 | 13 | 14 | 15 |
| 694 | 1106 | 1184 | 1597 | 1277 | 1690 | 1768 | 2180 |
| 16 | 17 | 18 | 19 | 20 | 21 | 22 | 23 |
| 825 | 1238 | 1316 | 1728 | 1408 | 1821 | 1899 | 2312 |
| 24 | 25 | 26 | 27 | 28 | 29 | 30 | 31 |
| 1519 | 1931 | 2009 | 2422 | 2102 | 2515 | 2593 | 3005 |
| 32 | 33 | 34 | 35 | 36 | 37 | 38 | 39 |
| 981 | 1394 | 1472 | 1884 | 1565 | 1977 | 2055 | 2468 |
| 40 | 41 | 42 | 43 | 44 | 45 | 46 | 47 |
| 1675 | 2087 | 2166 | 2578 | 2258 | 2671 | 2749 | 3161 |
| 48 | 49 | 50 | 51 | 52 | 53 | 54 | 55 |
| 1806 | 2219 | 2297 | 2709 | 2390 | 2802 | 2880 | 3293 |
| 56 | 57 | 58 | 59 | 60 | 61 | 62 | 63 |
| 2500 | 2913 | 2991 | 3403 | 3083 | 3496 | 3574 | 3987 |

A quantized reliability reference sequence obtained according to the foregoing formula is shown in Table 9:

TABLE 9

| 64 | 128 | 256 |
|---|---|---|
| 1167 | 1388 | 1650 |

It can be learned from Table 7 and Table 8 that, during storage of the quantized reliability sequence corresponding to a basic sequence, only $2^{l_s}=2^6=64$ values need to be stored; during storage of the values in the quantized reliability reference sequence, $l_{max}-l_s=9-6=3$ values need to be stored; and only a total of 64+3=67 values need to be stored. Therefore, compared with a previous case in which 512 values need to be stored (Table 1), storage space of (512−67)/512=86.9% can be saved, thereby greatly reducing storage overheads and improving storage efficiency.

(5) It is set that $l_s=7$, $N_s=128$, and $PW_i$, $0 \le i < 128$. A reliability sequence corresponding to a basic sequence can be obtained according to the foregoing formula, and after 13-bit quantization is performed on values in the reliability sequence, an obtained quantized reliability sequence corresponding to the basic sequence is shown in Table 10:

TABLE 10

| 0 | 1 | 2 | 3 | 4 | 5 | 6 | 7 |
|---|---|---|---|---|---|---|---|
| 0 | 413 | 491 | 903 | 583 | 996 | 1074 | 1487 |
| 8 | 9 | 10 | 11 | 12 | 13 | 14 | 15 |
| 694 | 1106 | 1184 | 1597 | 1277 | 1690 | 1768 | 2180 |

TABLE 10-continued

| 16 | 17 | 18 | 19 | 20 | 21 | 22 | 23 |
|---|---|---|---|---|---|---|---|
| 825 | 1238 | 1316 | 1728 | 1408 | 1821 | 1899 | 2312 |
| 24 | 25 | 26 | 27 | 28 | 29 | 30 | 31 |
| 1519 | 1931 | 2009 | 2422 | 2102 | 2515 | 2593 | 3005 |
| 32 | 33 | 34 | 35 | 36 | 37 | 38 | 39 |
| 981 | 1394 | 1472 | 1884 | 1565 | 1977 | 2055 | 2468 |
| 40 | 41 | 42 | 43 | 44 | 45 | 46 | 47 |
| 1675 | 2087 | 2166 | 2578 | 2258 | 2671 | 2749 | 3161 |
| 48 | 49 | 50 | 51 | 52 | 53 | 54 | 55 |
| 1806 | 2219 | 2297 | 2709 | 2390 | 2802 | 2880 | 3293 |
| 56 | 57 | 58 | 59 | 60 | 61 | 62 | 63 |
| 2500 | 2913 | 2991 | 3403 | 3083 | 3496 | 3574 | 3987 |
| 64 | 65 | 66 | 67 | 68 | 69 | 70 | 71 |
| 1167 | 1579 | 1657 | 2070 | 1750 | 2163 | 2241 | 2653 |
| 72 | 73 | 74 | 75 | 76 | 77 | 78 | 79 |
| 1861 | 2273 | 2351 | 2764 | 2444 | 2857 | 2935 | 3347 |
| 80 | 81 | 82 | 83 | 84 | 85 | 86 | 87 |
| 1992 | 2404 | 2482 | 2895 | 2575 | 2988 | 3066 | 3478 |
| 88 | 89 | 90 | 91 | 92 | 93 | 94 | 95 |
| 2686 | 3098 | 3176 | 3589 | 3269 | 3682 | 3760 | 4172 |
| 96 | 97 | 98 | 99 | 100 | 101 | 102 | 103 |
| 2148 | 2560 | 2639 | 3051 | 2731 | 3144 | 3222 | 3634 |
| 104 | 105 | 106 | 107 | 108 | 109 | 110 | 111 |
| 2842 | 3254 | 3332 | 3745 | 3425 | 3838 | 3916 | 4328 |
| 112 | 113 | 114 | 115 | 116 | 117 | 118 | 119 |
| 2973 | 3386 | 3464 | 3876 | 3556 | 3969 | 4047 | 4460 |
| 120 | 121 | 122 | 123 | 124 | 125 | 126 | 127 |
| 3667 | 4079 | 4157 | 4570 | 4250 | 4663 | 4741 | 5153 |

A quantized reliability reference sequence obtained according to the foregoing formula is shown in Table 11:

TABLE 11

| 128 | 256 |
|---|---|
| 1388 | 1650 |

It can be learned from Table 10 and Table 11 that, during storage of the reliability sequence, only $2^{l_s}=2^7=128$ values need to be stored; during storage of the reliability reference sequence, $l_{max}-l_s=9-7=2$ values need to be stored; and only a total of 128+2=130 values need to be stored. Therefore, compared with a case in which 512 values need to be stored for original reliability (Table 1), storage space of (512−130)/512=74.6% can be saved, thereby greatly reducing storage overheads and improving storage efficiency.

(5) It is set that $l_s=8$, $N_s=256$, and $PW_i$, $0 \le i \le 256$. A reliability sequence can be obtained according to the foregoing formula, and after 13-bit quantization is performed on values in the reliability sequence, an obtained reliability sequence is shown in Table 12:

TABLE 12

| 0 | 1 | 2 | 3 | 4 | 5 | 6 | 7 |
|---|---|---|---|---|---|---|---|
| 0 | 413 | 491 | 903 | 583 | 996 | 1074 | 1487 |
| 8 | 9 | 10 | 11 | 12 | 13 | 14 | 15 |
| 694 | 1106 | 1184 | 1597 | 1277 | 1690 | 1768 | 2180 |
| 16 | 17 | 18 | 19 | 20 | 21 | 22 | 23 |
| 825 | 1238 | 1316 | 1728 | 1408 | 1821 | 1899 | 2312 |
| 24 | 25 | 26 | 27 | 28 | 29 | 30 | 31 |
| 1519 | 1931 | 2009 | 2422 | 2102 | 2515 | 2593 | 3005 |
| 32 | 33 | 34 | 35 | 36 | 37 | 38 | 39 |
| 981 | 1394 | 1472 | 1884 | 1565 | 1977 | 2055 | 2468 |
| 40 | 41 | 42 | 43 | 44 | 45 | 46 | 47 |
| 1675 | 2087 | 2166 | 2578 | 2258 | 2671 | 2749 | 3161 |
| 48 | 49 | 50 | 51 | 52 | 53 | 54 | 55 |
| 1806 | 2219 | 2297 | 2709 | 2390 | 2802 | 2880 | 3293 |
| 56 | 57 | 58 | 59 | 60 | 61 | 62 | 63 |
| 2500 | 2913 | 2991 | 3403 | 3083 | 3496 | 3574 | 3987 |
| 64 | 65 | 66 | 67 | 68 | 69 | 70 | 71 |
| 1167 | 1579 | 1657 | 2070 | 1750 | 2163 | 2241 | 2653 |
| 72 | 73 | 74 | 75 | 76 | 77 | 78 | 79 |
| 1861 | 2273 | 2351 | 2764 | 2444 | 2857 | 2935 | 3347 |
| 80 | 81 | 82 | 83 | 84 | 85 | 86 | 87 |
| 1992 | 2404 | 2482 | 2895 | 2575 | 2988 | 3066 | 3478 |
| 88 | 89 | 90 | 91 | 92 | 93 | 94 | 95 |
| 2686 | 3098 | 3176 | 3589 | 3269 | 3682 | 3760 | 4172 |
| 96 | 97 | 98 | 99 | 100 | 101 | 102 | 103 |
| 2148 | 2560 | 2639 | 3051 | 2731 | 3144 | 3222 | 3634 |
| 104 | 105 | 106 | 107 | 108 | 109 | 110 | 111 |
| 2842 | 3254 | 3332 | 3745 | 3425 | 3838 | 3916 | 4328 |
| 112 | 113 | 114 | 115 | 116 | 117 | 118 | 119 |
| 2973 | 3386 | 3464 | 3876 | 3556 | 3969 | 4047 | 4460 |
| 120 | 121 | 122 | 123 | 124 | 125 | 126 | 127 |
| 3667 | 4079 | 4157 | 4570 | 4250 | 4663 | 4741 | 5153 |
| 128 | 129 | 130 | 131 | 132 | 133 | 134 | 135 |
| 1388 | 1800 | 1878 | 2291 | 1971 | 2384 | 2462 | 2874 |
| 136 | 137 | 138 | 139 | 140 | 141 | 142 | 143 |
| 2081 | 2494 | 2572 | 2984 | 2665 | 3077 | 3155 | 3568 |
| 144 | 145 | 146 | 147 | 148 | 149 | 150 | 151 |
| 2213 | 2625 | 2703 | 3116 | 2796 | 3209 | 3287 | 3699 |

TABLE 12-continued

| 152 | 153 | 154 | 155 | 156 | 157 | 158 | 159 |
|---|---|---|---|---|---|---|---|
| 2906 | 3319 | 3397 | 3810 | 3490 | 3902 | 3980 | 4393 |
| 160 | 161 | 162 | 163 | 164 | 165 | 166 | 167 |
| 2369 | 2781 | 2859 | 3272 | 2952 | 3365 | 3443 | 3855 |
| 168 | 169 | 170 | 171 | 172 | 173 | 174 | 175 |
| 3063 | 3475 | 3553 | 3966 | 3646 | 4058 | 4137 | 4549 |
| 176 | 177 | 178 | 179 | 180 | 181 | 182 | 183 |
| 3194 | 3606 | 3684 | 4097 | 3777 | 4190 | 4268 | 4680 |
| 184 | 185 | 186 | 187 | 188 | 189 | 190 | 191 |
| 3888 | 4300 | 4378 | 4791 | 4471 | 4884 | 4962 | 5374 |
| 192 | 193 | 194 | 195 | 196 | 197 | 198 | 199 |
| 2554 | 2967 | 3045 | 3457 | 3138 | 3550 | 3628 | 4041 |
| 200 | 201 | 202 | 203 | 204 | 205 | 206 | 207 |
| 3248 | 3661 | 3739 | 4151 | 3832 | 4244 | 4322 | 4735 |
| 208 | 209 | 210 | 211 | 212 | 213 | 214 | 215 |
| 3379 | 3792 | 3870 | 4283 | 3963 | 4375 | 4453 | 4866 |
| 216 | 217 | 218 | 219 | 220 | 221 | 222 | 223 |
| 4073 | 4486 | 4564 | 4976 | 4657 | 5069 | 5147 | 5560 |
| 224 | 225 | 226 | 227 | 228 | 229 | 230 | 231 |
| 3536 | 3948 | 4026 | 4439 | 4119 | 4531 | 4610 | 5022 |
| 232 | 233 | 234 | 235 | 236 | 237 | 238 | 239 |
| 4229 | 4642 | 4720 | 5132 | 4813 | 5225 | 5303 | 5716 |
| 240 | 241 | 242 | 243 | 244 | 245 | 246 | 247 |
| 4361 | 4773 | 4851 | 5264 | 4944 | 5357 | 5435 | 5847 |
| 248 | 249 | 250 | 251 | 252 | 253 | 254 | 255 |
| 5054 | 5467 | 5545 | 5957 | 5638 | 6050 | 6128 | 6541 |

A reliability reference sequence obtained according to the foregoing formula is shown in Table 13:

TABLE 13

| 256 |
|---|
| 1650 |

It can be learned from Table 12 and Table 13 that, during storage of the reliability sequence, only $2^{l_s}=2^8=256$ values need to be stored; during storage of the reliability reference sequence, $l_{max}-l_s=9-8=1$ value needs to be stored; and only a total of 256+1=257 values need to be stored. Therefore, compared with a case in which 512 values need to be stored for original reliability (Table 1), storage space of (512−257)/512=49.8% can be saved, thereby greatly reducing storage overheads and improving storage efficiency.

2. For a maximum-mother-code-length reliability sequence with a maximum mother code length of $N_{max}=2^{l_{max}}=2^{10}=1024$, $\beta=2^{0.25}$ is set; and according to a prior-art storage manner, 14-bit quantization is performed on values in the sequence, and 1024 values are stored, as shown in Table 14:

TABLE 14

| 0 | 666 | 792 | 1457 | 941 | 1607 | 1733 | 2399 |
|---|---|---|---|---|---|---|---|
| 1119 | 1785 | 1911 | 2577 | 2061 | 2726 | 2852 | 3518 |
| 1331 | 1997 | 2123 | 2788 | 2273 | 2938 | 3064 | 3730 |
| 2451 | 3116 | 3242 | 3908 | 3392 | 4058 | 4184 | 4849 |
| 1583 | 2249 | 2375 | 3040 | 2525 | 3190 | 3316 | 3982 |
| 2703 | 3368 | 3494 | 4160 | 3644 | 4310 | 4436 | 5101 |
| 2914 | 3580 | 3706 | 4372 | 3856 | 4521 | 4647 | 5313 |
| 4034 | 4700 | 4825 | 5491 | 4975 | 5641 | 5767 | 6432 |
| 1883 | 2548 | 2674 | 3340 | 2824 | 3490 | 3616 | 4281 |
| 3002 | 3668 | 3794 | 4459 | 3944 | 4609 | 4735 | 5401 |
| 3214 | 3880 | 4006 | 4671 | 4155 | 4821 | 4947 | 5613 |
| 4333 | 4999 | 5125 | 5791 | 5275 | 5940 | 6066 | 6732 |
| 3466 | 4132 | 4257 | 4923 | 4407 | 5073 | 5199 | 5864 |
| 4585 | 5251 | 5377 | 6043 | 5527 | 6192 | 6318 | 6984 |
| 4797 | 5463 | 5589 | 6254 | 5739 | 6404 | 6530 | 7196 |
| 5917 | 6582 | 6708 | 7374 | 6858 | 7524 | 7650 | 8315 |
| 2239 | 2905 | 3031 | 3696 | 3180 | 3846 | 3972 | 4638 |
| 3358 | 4024 | 4150 | 4816 | 4300 | 4965 | 5091 | 5757 |
| 3570 | 4236 | 4362 | 5027 | 4512 | 5177 | 5303 | 5969 |
| 4690 | 5355 | 5481 | 6147 | 5631 | 6297 | 6423 | 7088 |
| 3822 | 4488 | 4614 | 5279 | 4763 | 5429 | 5555 | 6221 |
| 4942 | 5607 | 5733 | 6399 | 5883 | 6549 | 6674 | 7340 |
| 5153 | 5819 | 5945 | 6611 | 6095 | 6760 | 6886 | 7552 |
| 6273 | 6938 | 7064 | 7730 | 7214 | 7880 | 8006 | 8671 |
| 4122 | 4787 | 4913 | 5579 | 5063 | 5729 | 5855 | 6520 |
| 5241 | 5907 | 6033 | 6698 | 6182 | 6848 | 6974 | 7640 |
| 5453 | 6119 | 6244 | 6910 | 6394 | 7060 | 7186 | 7851 |
| 6572 | 7238 | 7364 | 8030 | 7514 | 8179 | 8305 | 8971 |
| 5705 | 6370 | 6496 | 7162 | 6646 | 7312 | 7438 | 8103 |
| 6824 | 7490 | 7616 | 8281 | 7766 | 8431 | 8557 | 9223 |
| 7036 | 7702 | 7828 | 8493 | 7977 | 8643 | 8769 | 9435 |
| 8156 | 8821 | 8947 | 9613 | 9097 | 9763 | 9888 | 10554 |
| 2663 | 3328 | 3454 | 4120 | 3604 | 4270 | 4395 | 5061 |
| 3782 | 4448 | 4574 | 5239 | 4723 | 5389 | 5515 | 6181 |

TABLE 14-continued

| | | | | | | | |
|---|---|---|---|---|---|---|---|
| 3994 | 4659 | 4785 | 5451 | 4935 | 5601 | 5727 | 6392 |
| 5113 | 5779 | 5905 | 6571 | 6055 | 6720 | 6846 | 7512 |
| 4246 | 4911 | 5037 | 5703 | 5187 | 5853 | 5979 | 6644 |
| 5365 | 6031 | 6157 | 6822 | 6307 | 6972 | 7098 | 7764 |
| 5577 | 6243 | 6369 | 7034 | 6518 | 7184 | 7310 | 7976 |
| 6696 | 7362 | 7488 | 8154 | 7638 | 8303 | 8429 | 9095 |
| 4545 | 5211 | 5337 | 6002 | 5487 | 6152 | 6278 | 6944 |
| 5665 | 6330 | 6456 | 7122 | 6606 | 7272 | 7398 | 8063 |
| 5877 | 6542 | 6668 | 7334 | 6818 | 7484 | 7609 | 8275 |
| 6996 | 7662 | 7788 | 8453 | 7937 | 8603 | 8729 | 9395 |
| 6128 | 6794 | 6920 | 7586 | 7070 | 7735 | 7861 | 8527 |
| 7248 | 7914 | 8039 | 8705 | 8189 | 8855 | 8981 | 9646 |
| 7460 | 8125 | 8251 | 8917 | 8401 | 9067 | 9193 | 9858 |
| 8579 | 9245 | 9371 | 10036 | 9521 | 10186 | 10312 | 10978 |
| 4901 | 5567 | 5693 | 6359 | 5843 | 6508 | 6634 | 7300 |
| 6021 | 6687 | 6813 | 7478 | 6962 | 7628 | 7754 | 8420 |
| 6233 | 6898 | 7024 | 7690 | 7174 | 7840 | 7966 | 8631 |
| 7352 | 8018 | 8144 | 8809 | 8294 | 8959 | 9085 | 9751 |
| 6485 | 7150 | 7276 | 7942 | 7426 | 8092 | 8218 | 8883 |
| 7604 | 8270 | 8396 | 9061 | 8545 | 9211 | 9337 | 10003 |
| 7816 | 8482 | 8608 | 9273 | 8757 | 9423 | 9549 | 10214 |
| 8935 | 9601 | 9727 | 10393 | 9877 | 10542 | 10668 | 11334 |
| 6784 | 7450 | 7576 | 8241 | 7726 | 8391 | 8517 | 9183 |
| 7904 | 8569 | 8695 | 9361 | 8845 | 9511 | 9637 | 10302 |
| 8115 | 8781 | 8907 | 9573 | 9057 | 9722 | 9848 | 10514 |
| 9235 | 9901 | 10027 | 10692 | 10176 | 10842 | 10968 | 11634 |
| 8367 | 9033 | 9159 | 9825 | 9309 | 9974 | 10100 | 10766 |
| 9487 | 10152 | 10278 | 10944 | 10428 | 11094 | 11220 | 11885 |
| 9699 | 10364 | 10490 | 11156 | 10640 | 11306 | 11432 | 12097 |
| 10818 | 11484 | 11610 | 12275 | 11759 | 12425 | 12551 | 13217 |
| 3166 | 3832 | 3958 | 4624 | 4108 | 4773 | 4899 | 5565 |
| 4286 | 4951 | 5077 | 5743 | 5227 | 5893 | 6019 | 6684 |
| 4498 | 5163 | 5289 | 5955 | 5439 | 6105 | 6231 | 6896 |
| 5617 | 6283 | 6409 | 7074 | 6558 | 7224 | 7350 | 8016 |
| 4749 | 5415 | 5541 | 6207 | 5691 | 6356 | 6482 | 7148 |
| 5869 | 6535 | 6661 | 7326 | 6810 | 7476 | 7602 | 8268 |
| 6081 | 6746 | 6872 | 7538 | 7022 | 7688 | 7814 | 8479 |
| 7200 | 7866 | 7992 | 8657 | 8142 | 8807 | 8933 | 9599 |
| 5049 | 5715 | 5841 | 6506 | 5990 | 6656 | 6782 | 7448 |
| 6169 | 6834 | 6960 | 7626 | 7110 | 7775 | 7901 | 8567 |
| 6380 | 7046 | 7172 | 7838 | 7322 | 7987 | 8113 | 8779 |
| 7500 | 8165 | 8291 | 8957 | 8441 | 9107 | 9233 | 9898 |
| 6632 | 7298 | 7424 | 8089 | 7574 | 8239 | 8365 | 9031 |
| 7752 | 8417 | 8543 | 9209 | 8693 | 9359 | 9485 | 10150 |
| 7963 | 8629 | 8755 | 9421 | 8905 | 9570 | 9696 | 10362 |
| 9083 | 9749 | 9875 | 10540 | 10024 | 10690 | 10816 | 11482 |
| 5405 | 6071 | 6197 | 6862 | 6347 | 7012 | 7138 | 7804 |
| 6525 | 7190 | 7316 | 7982 | 7466 | 8132 | 8258 | 8923 |
| 6737 | 7402 | 7528 | 8194 | 7678 | 8344 | 8469 | 9135 |
| 7856 | 8522 | 8648 | 9313 | 8797 | 9463 | 9589 | 10255 |
| 6988 | 7654 | 7780 | 8446 | 7930 | 8595 | 8721 | 9387 |
| 8108 | 8774 | 8899 | 9565 | 9049 | 9715 | 9841 | 10506 |
| 8320 | 8985 | 9111 | 9777 | 9261 | 9927 | 10053 | 10718 |
| 9439 | 10105 | 10231 | 10896 | 10381 | 11046 | 11172 | 11838 |
| 7288 | 7954 | 8080 | 8745 | 8229 | 8895 | 9021 | 9687 |
| 8407 | 9073 | 9199 | 9865 | 9349 | 10014 | 10140 | 10806 |
| 8619 | 9285 | 9411 | 10076 | 9561 | 10226 | 10352 | 11018 |
| 9739 | 10404 | 10530 | 11196 | 10680 | 11346 | 11472 | 12137 |
| 8871 | 9537 | 9663 | 10328 | 9812 | 10478 | 10604 | 11270 |
| 9991 | 10656 | 10782 | 11448 | 10932 | 11598 | 11724 | 12389 |
| 10202 | 10868 | 10994 | 11660 | 11144 | 11809 | 11935 | 12601 |
| 11322 | 11988 | 12113 | 12779 | 12263 | 12929 | 13055 | 13720 |
| 5829 | 6495 | 6620 | 7286 | 6770 | 7436 | 7562 | 8227 |
| 6948 | 7614 | 7740 | 8406 | 7890 | 8555 | 8681 | 9347 |
| 7160 | 7826 | 7952 | 8617 | 8102 | 8767 | 8893 | 9559 |
| 8280 | 8945 | 9071 | 9737 | 9221 | 9887 | 10013 | 10678 |
| 7412 | 8078 | 8204 | 8869 | 8353 | 9019 | 9145 | 9811 |
| 8532 | 9197 | 9323 | 9989 | 9473 | 10139 | 10264 | 10930 |
| 8743 | 9409 | 9535 | 10201 | 9685 | 10350 | 10476 | 11142 |
| 9863 | 10528 | 10654 | 11320 | 10804 | 11470 | 11596 | 12261 |
| 7712 | 8377 | 8503 | 9169 | 8653 | 9319 | 9445 | 10110 |
| 8831 | 9497 | 9623 | 10288 | 9772 | 10438 | 10564 | 11230 |
| 9043 | 9709 | 9834 | 10500 | 9984 | 10650 | 10776 | 11441 |
| 10162 | 10828 | 10954 | 11620 | 11104 | 11769 | 11895 | 12561 |
| 9295 | 9960 | 10086 | 10752 | 10236 | 10902 | 11028 | 11693 |
| 10414 | 11080 | 11206 | 11871 | 11356 | 12021 | 12147 | 12813 |
| 10626 | 11292 | 11418 | 12083 | 11567 | 12233 | 12359 | 13025 |
| 11745 | 12411 | 12537 | 13203 | 12687 | 13352 | 13478 | 14144 |
| 8068 | 8733 | 8859 | 9525 | 9009 | 9675 | 9801 | 10466 |
| 9187 | 9853 | 9979 | 10644 | 10129 | 10794 | 10920 | 11586 |

TABLE 14-continued

| | | | | | | | |
|---|---|---|---|---|---|---|---|
| 9399 | 10065 | 10191 | 10856 | 10340 | 11006 | 11132 | 11798 |
| 10519 | 11184 | 11310 | 11976 | 11460 | 12126 | 12251 | 12917 |
| 9651 | 10317 | 10443 | 11108 | 10592 | 11258 | 11384 | 12050 |
| 10770 | 11436 | 11562 | 12228 | 11712 | 12377 | 12503 | 13169 |
| 10982 | 11648 | 11774 | 12439 | 11924 | 12589 | 12715 | 13381 |
| 12102 | 12767 | 12893 | 13559 | 13043 | 13709 | 13835 | 14500 |
| 9951 | 10616 | 10742 | 11408 | 10892 | 11558 | 11683 | 12349 |
| 11070 | 11736 | 11862 | 12527 | 12011 | 12677 | 12803 | 13469 |
| 11282 | 11947 | 12073 | 12739 | 12223 | 12889 | 13015 | 13680 |
| 12401 | 13067 | 13193 | 13858 | 13343 | 14008 | 14134 | 14800 |
| 11534 | 12199 | 12325 | 12991 | 12475 | 13141 | 13267 | 13932 |
| 12653 | 13319 | 13445 | 14110 | 13595 | 14260 | 14386 | 15052 |
| 12865 | 13531 | 13657 | 14322 | 13806 | 14472 | 14598 | 15264 |
| 13984 | 14650 | 14776 | 15442 | 14926 | 15591 | 15717 | 16383 |

There may be the following several implementations, provided in this application, for transforming a reliability sequence corresponding to a mother code sequence with a length of 1024 to a reliability sequence corresponding to a basic sequence and a reliability reference sequence:

(1) It is set that $l_s=3$, $N_s=8$, and $PW_i$, $0 \le i < 8$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 15:

TABLE 15

| 0 | 1 | 2 | 3 | 4 | 5 | 6 | 7 |
|---|---|---|---|---|---|---|---|
| 0 | 666 | 792 | 1457 | 941 | 1607 | 1733 | 2399 |

A quantized reliability reference sequence obtained according to the foregoing formula is shown in Table 16:

TABLE 16

| 8 | 16 | 32 | 64 | 128 | 256 | 512 |
|---|---|---|---|---|---|---|
| 1119 | 1331 | 1583 | 1883 | 2239 | 2663 | 3166 |

It can be learned from Table 15 and Table 16 that, during storage of the quantized reliability sequence corresponding to the basic sequence, only $2^{l_s}=2^3=8$ values need to be stored; during storage of the quantized reliability reference sequence, $l_{max}-l_s=10-3=7$ values need to be stored; and only a total of $8+7=15$ values need to be stored. Therefore, compared with a previous case in which 1024 values need to be stored (Table 14), storage space of $(1024-15)/1024=98.5\%$ can be saved, thereby greatly reducing storage overheads and improving storage efficiency.

(2) It is set that $l_s=4$, $N_s=16$, and $PW_i$, $0 \le i < 16$. A reliability sequence corresponding to a basic sequence can be obtained according to the foregoing formula, as shown in Table 17:

TABLE 17

| 0 | 1 | 2 | 3 | 4 | 5 | 6 | 7 |
|---|---|---|---|---|---|---|---|
| 0 | 1 | 1.189207 | 2.189207 | 1.414214 | 2.414214 | 2.603421 | 3.603421 |
| 8 | 9 | 10 | 11 | 12 | 13 | 14 | 15 |
| 1.681793 | 2.681793 | 2.871 | 3.871 | 3.096006 | 4.096006 | 4.285214 | 5.285214 |

A reliability reference sequence obtained according to the foregoing formula is shown in Table 18:

TABLE 18

| 16 | 32 | 64 | 128 | 256 | 512 |
|---|---|---|---|---|---|
| 2 | 2.378414 | 2.828427 | 3.363586 | 4 | 4.756828 |

The reliability sequence may be alternatively a limited precision quantization value of the original reliability sequence $PW_i$, as long as a quantized reliability sequence still satisfies a same relative size relationship as the original reliability sequence.

For example, 14-bit quantization $PW_{\_quantization_i}=\lceil(PW_i/\max\{PW\})g(2^{14}-1)\rceil$ may be performed based on Table 17 and Table 18, where $PW_i$ is a PW sequence before quantization, $PW_{\_quantization_i}$ is a quantized PW sequence, $\max\{PW\}$ is a maximum value of the PW sequence before quantization, $\lceil g \rceil$ is a rounding up function, and a quantization precision is 14 bits. Table 19 and Table 20 are obtained after quantization is performed. The quantization precision is positively correlated with the length $N_{max}$ of the mother code sequence. For larger $N_{max}$, higher quantization precision is usually needed to ensure that the quantized reliability sequence corresponding to the mother code sequence still satisfies the same relative size relationship as the original reliability sequence. Herein, the foregoing is only an example, a principle of a quantization manner of a reliability sequence of a mother code sequence with another length is the same as that in the foregoing, and details are not repeated.

TABLE 19

| 0 | 1 | 2 | 3 | 4 | 5 | 6 | 7 |
|---|---|---|---|---|---|---|---|
| 0 | 666 | 792 | 1457 | 941 | 1607 | 1733 | 2399 |
| 8 | 9 | 10 | 11 | 12 | 13 | 14 | 15 |
| 1119 | 1785 | 1911 | 2577 | 2061 | 2726 | 2852 | 3518 |

TABLE 20

| 16 | 32 | 64 | 128 | 256 | 512 |
|---|---|---|---|---|---|
| 1331 | 1583 | 1883 | 2239 | 2663 | 3166 |

It can be learned from Table 19 and Table 20 that, during storage of a quantized reliability sequence corresponding to a basic sequence, only $2^{l_s}=2^4=16$ values need to be stored; during storage of a quantized reliability reference sequence, $l_{max}-l_s=10-4=6$ values need to be stored; and only a total of 16+6=22 values need to be stored. Therefore, compared with a previous case in which 1024 values need to be stored (Table 14), storage space of (1024−22)/1024=97.8% can be saved, thereby greatly reducing storage overheads and improving storage efficiency.

(3) It is set that $l_s=5$, $N_s=32$, and $PW_i$, $0 \leq i < 32$. A reliability sequence corresponding to a basic sequence can be obtained according to the foregoing formula, and after 14-bit quantization is performed on values of elements in the reliability sequence, an obtained quantized reliability sequence corresponding to the basic sequence is shown in Table 21:

TABLE 21

| 0 | 1 | 2 | 3 | 4 | 5 | 6 | 7 |
|---|---|---|---|---|---|---|---|
| 0 | 666 | 792 | 1457 | 941 | 1607 | 1733 | 2399 |
| 8 | 9 | 10 | 11 | 12 | 13 | 14 | 15 |
| 1119 | 1785 | 1911 | 2577 | 2061 | 2726 | 2852 | 3518 |
| 16 | 17 | 18 | 19 | 20 | 21 | 22 | 23 |
| 1331 | 1997 | 2123 | 2788 | 2273 | 2938 | 3064 | 3730 |
| 24 | 25 | 26 | 27 | 28 | 29 | 30 | 31 |
| 2451 | 3116 | 3242 | 3908 | 3392 | 4058 | 4184 | 4849 |

A quantized reliability reference sequence obtained according to the foregoing formula is shown in Table 22:

TABLE 22

| 32 | 64 | 128 | 256 | 512 |
|---|---|---|---|---|
| 1583 | 1883 | 2239 | 2663 | 3166 |

It can be learned from Table 21 and Table 22 that, during storage of the quantized reliability sequence corresponding to the basic sequence, only $2^{l_s}=2^5=32$ values need to be stored; during storage of the values in the quantized reliability reference sequence, $l_{max}-l_s=10-5=5$ values need to be stored; and only a total of 32+5=37 values need to be stored. Therefore, compared with a previous case in which 1024 values need to be stored (Table 14), storage space of (1024−37)/1024=96.4% can be saved, thereby greatly reducing storage overheads and improving storage efficiency.

(4) It is set that $l_s=6$, $N_s=64$, and $PW_i$, $0 \leq i < 64$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 23:

TABLE 23

| 0 | 1 | 2 | 3 | 4 | 5 | 6 | 7 |
|---|---|---|---|---|---|---|---|
| 0 | 666 | 792 | 1457 | 941 | 1607 | 1733 | 2399 |
| 8 | 9 | 10 | 11 | 12 | 13 | 14 | 15 |
| 1119 | 1785 | 1911 | 2577 | 2061 | 2726 | 2852 | 3518 |
| 16 | 17 | 18 | 19 | 20 | 21 | 22 | 23 |
| 1331 | 1997 | 2123 | 2788 | 2273 | 2938 | 3064 | 3730 |
| 24 | 25 | 26 | 27 | 28 | 29 | 30 | 31 |
| 2451 | 3116 | 3242 | 3908 | 3392 | 4058 | 4184 | 4849 |
| 32 | 33 | 34 | 35 | 36 | 37 | 38 | 39 |
| 1583 | 2249 | 2375 | 3040 | 2525 | 3190 | 3316 | 3982 |
| 40 | 41 | 42 | 43 | 44 | 45 | 46 | 47 |
| 2703 | 3368 | 3494 | 4160 | 3644 | 4310 | 4436 | 5101 |
| 48 | 49 | 50 | 51 | 52 | 53 | 54 | 55 |

TABLE 23-continued

| 2914 | 3580 | 3706 | 4372 | 3856 | 4521 | 4647 | 5313 |
| --- | --- | --- | --- | --- | --- | --- | --- |
| 56 | 57 | 58 | 59 | 60 | 61 | 62 | 63 |
| 4034 | 4700 | 4825 | 5491 | 4975 | 5641 | 5767 | 6432 |

A quantized reliability reference sequence obtained according to the foregoing formula is shown in Table 24:

TABLE 24

| 64 | 128 | 256 | 512 |
| --- | --- | --- | --- |
| 1883 | 2239 | 2663 | 3166 |

It can be learned from Table 23 and Table 24 that, during storage of the quantized reliability sequence corresponding to the basic sequence, only $2^{l_s}=2^6=64$ values need to be stored; during storage of the values in the quantized reliability reference sequence, $l_{max}-l_s=10-6=4$ values need to be stored; and only a total of 64+4=68 values need to be stored. Therefore, compared with a previous case in which 1024 values need to be stored (Table 14), storage space of (1024−68)/1024=93.3% can be saved, thereby greatly reducing storage overheads and improving storage efficiency.

(5) It is set that $l_s=7$, $N_s=128$, and $PW_i$, $0 \leq i < 128$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 25:

TABLE 25

| 0 | 1 | 2 | 3 | 4 | 5 | 6 | 7 |
| --- | --- | --- | --- | --- | --- | --- | --- |
| 0 | 666 | 792 | 1457 | 941 | 1607 | 1733 | 2399 |
| 8 | 9 | 10 | 11 | 12 | 13 | 14 | 15 |
| 1119 | 1785 | 1911 | 2577 | 2061 | 2726 | 2852 | 3518 |
| 16 | 17 | 18 | 19 | 20 | 21 | 22 | 23 |
| 1331 | 1997 | 2123 | 2788 | 2273 | 2938 | 3064 | 3730 |
| 24 | 25 | 26 | 27 | 28 | 29 | 30 | 31 |
| 2451 | 3116 | 3242 | 3908 | 3392 | 4058 | 4184 | 4849 |
| 32 | 33 | 34 | 35 | 36 | 37 | 38 | 39 |
| 1583 | 2249 | 2375 | 3040 | 2525 | 3190 | 3316 | 3982 |
| 40 | 41 | 42 | 43 | 44 | 45 | 46 | 47 |
| 2703 | 3368 | 3494 | 4160 | 3644 | 4310 | 4436 | 5101 |
| 48 | 49 | 50 | 51 | 52 | 53 | 54 | 55 |
| 2914 | 3580 | 3706 | 4372 | 3856 | 4521 | 4647 | 5313 |
| 56 | 57 | 58 | 59 | 60 | 61 | 62 | 63 |
| 4034 | 4700 | 4825 | 5491 | 4975 | 5641 | 5767 | 6432 |
| 64 | 65 | 66 | 67 | 68 | 69 | 70 | 71 |
| 1883 | 2548 | 2674 | 3340 | 2824 | 3490 | 3616 | 4281 |
| 72 | 73 | 74 | 75 | 76 | 77 | 78 | 79 |
| 3002 | 3668 | 3794 | 4459 | 3944 | 4609 | 4735 | 5401 |
| 80 | 81 | 82 | 83 | 84 | 85 | 86 | 87 |
| 3214 | 3880 | 4006 | 4671 | 4155 | 4821 | 4947 | 5613 |
| 88 | 89 | 90 | 91 | 92 | 93 | 94 | 95 |
| 4333 | 4999 | 5125 | 5791 | 5275 | 5940 | 6066 | 6732 |
| 96 | 97 | 98 | 99 | 100 | 101 | 102 | 103 |
| 3466 | 4132 | 4257 | 4923 | 4407 | 5073 | 5199 | 5864 |
| 104 | 105 | 106 | 107 | 108 | 109 | 110 | 111 |
| 4585 | 5251 | 5377 | 6043 | 5527 | 6192 | 6318 | 6984 |
| 112 | 113 | 114 | 115 | 116 | 117 | 118 | 119 |
| 4797 | 5463 | 5589 | 6254 | 5739 | 6404 | 6530 | 7196 |
| 120 | 121 | 122 | 123 | 124 | 125 | 126 | 127 |
| 5917 | 6582 | 6708 | 7374 | 6858 | 7524 | 7650 | 8315 |

A quantized reliability reference sequence obtained according to the foregoing formula is shown in Table 26:

TABLE 26

| 128 | 256 | 512 |
| --- | --- | --- |
| 2239 | 2663 | 3166 |

It can be learned from Table 25 and Table 26 that, during storage of the quantized reliability sequence corresponding to the basic sequence, only $2^{l_s}=2^7=128$ values need to be stored; during storage of the values in the quantized reliability reference sequence, $l_{max}-l_s=10-7=3$ values need to be stored; and only a total of 128+3=131 values need to be stored. Therefore, compared with a previous case in which 1024 values need to be stored (Table 14), storage space of (1024−131)/1024=87.2% can be saved, thereby greatly reducing storage overheads and improving storage efficiency.

(6) It is set that $l_s=8$, $N_s=256$, and $PW_i$, $0 \leq i < 256$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 27:

TABLE 27

| 0 | 1 | 2 | 3 | 4 | 5 | 6 | 7 |
| --- | --- | --- | --- | --- | --- | --- | --- |
| 0 | 666 | 792 | 1457 | 941 | 1607 | 1733 | 2399 |
| 8 | 9 | 10 | 11 | 12 | 13 | 14 | 15 |
| 1119 | 1785 | 1911 | 2577 | 2061 | 2726 | 2852 | 3518 |
| 16 | 17 | 18 | 19 | 20 | 21 | 22 | 23 |
| 1331 | 1997 | 2123 | 2788 | 2273 | 2938 | 3064 | 3730 |
| 24 | 25 | 26 | 27 | 28 | 29 | 30 | 31 |

TABLE 27-continued

| | | | | | | | |
|---|---|---|---|---|---|---|---|
| 2451 | 3116 | 3242 | 3908 | 3392 | 4058 | 4184 | 4849 |
| 32 | 33 | 34 | 35 | 36 | 37 | 38 | 39 |
| 1583 | 2249 | 2375 | 3040 | 2525 | 3190 | 3316 | 3982 |
| 40 | 41 | 42 | 43 | 44 | 45 | 46 | 47 |
| 2703 | 3368 | 3494 | 4160 | 3644 | 4310 | 4436 | 5101 |
| 48 | 49 | 50 | 51 | 52 | 53 | 54 | 55 |
| 2914 | 3580 | 3706 | 4372 | 3856 | 4521 | 4647 | 5313 |
| 56 | 57 | 58 | 59 | 60 | 61 | 62 | 63 |
| 4034 | 4700 | 4825 | 5491 | 4975 | 5641 | 5767 | 6432 |
| 64 | 65 | 66 | 67 | 68 | 69 | 70 | 71 |
| 1883 | 2548 | 2674 | 3340 | 2824 | 3490 | 3616 | 4281 |
| 72 | 73 | 74 | 75 | 76 | 77 | 78 | 79 |
| 3002 | 3668 | 3794 | 4459 | 3944 | 4609 | 4735 | 5401 |
| 80 | 81 | 82 | 83 | 84 | 85 | 86 | 87 |
| 3214 | 3880 | 4006 | 4671 | 4155 | 4821 | 4947 | 5613 |
| 88 | 89 | 90 | 91 | 92 | 93 | 94 | 95 |
| 4333 | 4999 | 5125 | 5791 | 5275 | 5940 | 6066 | 6732 |
| 96 | 97 | 98 | 99 | 100 | 101 | 102 | 103 |
| 3466 | 4132 | 4257 | 4923 | 4407 | 5073 | 5199 | 5864 |
| 104 | 105 | 106 | 107 | 108 | 109 | 110 | 111 |
| 4585 | 5251 | 5377 | 6043 | 5527 | 6192 | 6318 | 6984 |
| 112 | 113 | 114 | 115 | 116 | 117 | 118 | 119 |
| 4797 | 5463 | 5589 | 6254 | 5739 | 6404 | 6530 | 7196 |
| 120 | 121 | 122 | 123 | 124 | 125 | 126 | 127 |
| 5917 | 6582 | 6708 | 7374 | 6858 | 7524 | 7650 | 8315 |
| 128 | 129 | 130 | 131 | 132 | 133 | 134 | 135 |
| 2239 | 2905 | 3031 | 3696 | 3180 | 3846 | 3972 | 4638 |
| 136 | 137 | 138 | 139 | 140 | 141 | 142 | 143 |
| 3358 | 4024 | 4150 | 4816 | 4300 | 4965 | 5091 | 5757 |
| 144 | 145 | 146 | 147 | 148 | 149 | 150 | 151 |
| 3570 | 4236 | 4362 | 5027 | 4512 | 5177 | 5303 | 5969 |
| 152 | 153 | 154 | 155 | 156 | 157 | 158 | 159 |
| 4690 | 5355 | 5481 | 6147 | 5631 | 6297 | 6423 | 7088 |
| 160 | 161 | 162 | 163 | 164 | 165 | 166 | 167 |
| 3822 | 4488 | 4614 | 5279 | 4763 | 5429 | 5555 | 6221 |
| 168 | 169 | 170 | 171 | 172 | 173 | 174 | 175 |
| 4942 | 5607 | 5733 | 6399 | 5883 | 6549 | 6674 | 7340 |
| 176 | 177 | 178 | 179 | 180 | 181 | 182 | 183 |
| 5153 | 5819 | 5945 | 6611 | 6095 | 6760 | 6886 | 7552 |
| 184 | 185 | 186 | 187 | 188 | 189 | 190 | 191 |
| 6273 | 6938 | 7064 | 7730 | 7214 | 7880 | 8006 | 8671 |
| 192 | 193 | 194 | 195 | 196 | 197 | 198 | 199 |
| 4122 | 4787 | 4913 | 5579 | 5063 | 5729 | 5855 | 6520 |
| 200 | 201 | 202 | 203 | 204 | 205 | 206 | 207 |
| 5241 | 5907 | 6033 | 6698 | 6182 | 6848 | 6974 | 7640 |
| 208 | 209 | 210 | 211 | 212 | 2013 | 214 | 215 |
| 5453 | 6119 | 6244 | 6910 | 6394 | 7060 | 7186 | 7851 |
| 216 | 217 | 218 | 219 | 220 | 221 | 222 | 223 |
| 6572 | 7238 | 7364 | 8030 | 7514 | 8179 | 8305 | 8971 |
| 224 | 225 | 226 | 227 | 228 | 229 | 230 | 231 |
| 5705 | 6370 | 6496 | 7162 | 6646 | 7312 | 7438 | 8103 |
| 232 | 233 | 234 | 235 | 236 | 237 | 238 | 239 |
| 6824 | 7490 | 7616 | 8281 | 7766 | 8431 | 8557 | 9223 |
| 240 | 241 | 242 | 243 | 244 | 245 | 246 | 247 |
| 7036 | 7702 | 7828 | 8493 | 7977 | 8643 | 8769 | 9435 |
| 248 | 249 | 250 | 251 | 252 | 253 | 254 | 255 |
| 8156 | 8821 | 8947 | 9613 | 9097 | 9763 | 9888 | 10554 |

A quantized reliability reference sequence obtained according to the foregoing formula is shown in Table 28:

TABLE 28

| | |
|---|---|
| 256 | 512 |
| 2663 | 3166 |

It can be learned from Table 27 and Table 28 that, during storage of the quantized reliability sequence corresponding to the basic sequence, only $2^{l_s}=2^8=256$ values need to be stored; during storage of the values in the quantized reliability reference sequence, $1_{max}-1_s=10-8=2$ values need to be stored; and only a total of 256+2=258 values need to be stored. Therefore, compared with a case in which 1024 values need to be stored for original reliability (Table 14), storage space of (1024−258)/1024=74.8% can be saved, thereby greatly reducing storage overheads and improving storage efficiency.

(7) It is set that $l_s=9$, $N_s=512$, and $PW_i$, $0 \le i < 512$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 29:

TABLE 29

| 0 | 1 | 2 | 3 | 4 | 5 | 6 | 7 |
|---|---|---|---|---|---|---|---|
| 0 | 666 | 792 | 1457 | 941 | 1607 | 1733 | 2399 |
| 8 | 9 | 10 | 11 | 12 | 13 | 14 | 15 |
| 1119 | 1785 | 1911 | 2577 | 2061 | 2726 | 2852 | 3518 |
| 16 | 17 | 18 | 19 | 20 | 21 | 22 | 23 |
| 1331 | 1997 | 2123 | 2788 | 2273 | 2938 | 3064 | 3730 |
| 24 | 25 | 26 | 27 | 28 | 29 | 30 | 31 |
| 2451 | 3116 | 3242 | 3908 | 3392 | 4058 | 4184 | 4849 |
| 32 | 33 | 34 | 35 | 36 | 37 | 38 | 39 |
| 1583 | 2249 | 2375 | 3040 | 2525 | 3190 | 3316 | 3982 |
| 40 | 41 | 42 | 43 | 44 | 45 | 46 | 47 |
| 2703 | 3368 | 3494 | 4160 | 3644 | 4310 | 4436 | 5101 |
| 48 | 49 | 50 | 51 | 52 | 53 | 54 | 55 |
| 2914 | 3580 | 3706 | 4372 | 3856 | 4521 | 4647 | 5313 |
| 56 | 57 | 58 | 59 | 60 | 61 | 62 | 63 |
| 4034 | 4700 | 4825 | 5491 | 4975 | 5641 | 5767 | 6432 |
| 64 | 65 | 66 | 67 | 68 | 69 | 70 | 71 |
| 1883 | 2548 | 2674 | 3340 | 2824 | 3490 | 3616 | 4281 |
| 72 | 73 | 74 | 75 | 76 | 77 | 78 | 79 |
| 3002 | 3668 | 3794 | 4459 | 3944 | 4609 | 4735 | 5401 |
| 80 | 81 | 82 | 83 | 84 | 85 | 86 | 87 |
| 3214 | 3880 | 4006 | 4671 | 4155 | 4821 | 4947 | 5613 |
| 88 | 89 | 90 | 91 | 92 | 93 | 94 | 95 |
| 4333 | 4999 | 5125 | 5791 | 5275 | 5940 | 6066 | 6732 |
| 96 | 97 | 98 | 99 | 100 | 101 | 102 | 103 |
| 3466 | 4132 | 4257 | 4923 | 4407 | 5073 | 5199 | 5864 |
| 104 | 105 | 106 | 107 | 108 | 109 | 110 | 111 |
| 4585 | 5251 | 5377 | 6043 | 5527 | 6192 | 6318 | 6984 |
| 112 | 113 | 114 | 115 | 116 | 117 | 118 | 119 |
| 4797 | 5463 | 5589 | 6254 | 5739 | 6404 | 6530 | 7196 |
| 120 | 121 | 122 | 123 | 124 | 125 | 126 | 127 |
| 5917 | 6582 | 6708 | 7374 | 6858 | 7524 | 7650 | 8315 |
| 128 | 129 | 130 | 131 | 132 | 133 | 134 | 135 |
| 2239 | 2905 | 3031 | 3696 | 3180 | 3846 | 3972 | 4638 |
| 136 | 137 | 138 | 139 | 140 | 141 | 142 | 143 |
| 3358 | 4024 | 4150 | 4816 | 4300 | 4965 | 5091 | 5757 |
| 144 | 145 | 146 | 147 | 148 | 149 | 150 | 151 |
| 3570 | 4236 | 4362 | 5027 | 4512 | 5177 | 5303 | 5969 |
| 152 | 153 | 154 | 155 | 156 | 157 | 158 | 159 |
| 4690 | 5355 | 5481 | 6147 | 5631 | 6297 | 6423 | 7088 |

TABLE 29-continued

| | | | | | | | |
|---|---|---|---|---|---|---|---|
| 160 | 161 | 162 | 163 | 164 | 165 | 166 | 167 |
| 3822 | 4488 | 4614 | 5279 | 4763 | 5429 | 5555 | 6221 |
| 168 | 169 | 170 | 171 | 172 | 173 | 174 | 175 |
| 4942 | 5607 | 5733 | 6399 | 5883 | 6549 | 6674 | 7340 |
| 176 | 177 | 178 | 179 | 180 | 181 | 182 | 183 |
| 5153 | 5819 | 5945 | 6611 | 6095 | 6760 | 6886 | 7552 |
| 184 | 185 | 186 | 187 | 188 | 189 | 190 | 191 |
| 6273 | 6938 | 7064 | 7730 | 7214 | 7880 | 8006 | 8671 |
| 192 | 193 | 194 | 195 | 196 | 197 | 198 | 199 |
| 4122 | 4787 | 4913 | 5579 | 5063 | 5729 | 5855 | 6520 |
| 200 | 201 | 202 | 203 | 204 | 205 | 206 | 207 |
| 5241 | 5907 | 6033 | 6698 | 6182 | 6848 | 6974 | 7640 |
| 208 | 209 | 210 | 211 | 212 | 213 | 214 | 215 |
| 5453 | 6119 | 6244 | 6910 | 6394 | 7060 | 7186 | 7851 |
| 216 | 217 | 218 | 219 | 220 | 221 | 222 | 223 |
| 6572 | 7238 | 7364 | 8030 | 7514 | 8179 | 8305 | 8971 |
| 224 | 225 | 226 | 227 | 228 | 229 | 230 | 231 |
| 5705 | 6370 | 6496 | 7162 | 6646 | 7312 | 7438 | 8103 |
| 232 | 233 | 234 | 235 | 236 | 237 | 238 | 239 |
| 6824 | 7490 | 7616 | 8281 | 7766 | 8431 | 8557 | 9223 |
| 240 | 241 | 242 | 243 | 244 | 245 | 246 | 247 |
| 7036 | 7702 | 7828 | 8493 | 7977 | 8643 | 8769 | 9435 |
| 248 | 249 | 250 | 251 | 252 | 253 | 254 | 255 |
| 8156 | 8821 | 8947 | 9613 | 9097 | 9763 | 9888 | 10554 |
| 256 | 257 | 258 | 259 | 260 | 261 | 262 | 263 |
| 2663 | 3328 | 3454 | 4120 | 3604 | 4270 | 4395 | 5061 |
| 264 | 265 | 266 | 267 | 268 | 269 | 270 | 271 |
| 3782 | 4448 | 4574 | 5239 | 4723 | 5389 | 5515 | 6181 |
| 272 | 273 | 274 | 275 | 276 | 277 | 278 | 279 |
| 3994 | 4659 | 4785 | 5451 | 4935 | 5601 | 5727 | 6392 |
| 280 | 281 | 282 | 283 | 284 | 285 | 286 | 287 |
| 5113 | 5779 | 5905 | 6571 | 6055 | 6720 | 6846 | 7512 |
| 288 | 289 | 290 | 291 | 292 | 293 | 294 | 295 |
| 4246 | 4911 | 5037 | 5703 | 5187 | 5853 | 5979 | 6644 |
| 296 | 297 | 298 | 299 | 300 | 301 | 302 | 303 |
| 5365 | 6031 | 6157 | 6822 | 6307 | 6972 | 7098 | 7764 |
| 304 | 305 | 306 | 307 | 308 | 309 | 310 | 311 |
| 5577 | 6243 | 6369 | 7034 | 6518 | 7184 | 7310 | 7976 |
| 312 | 313 | 314 | 315 | 316 | 317 | 318 | 319 |
| 6696 | 7362 | 7488 | 8154 | 7638 | 8303 | 8429 | 9095 |

TABLE 29-continued

| | | | | | | | |
|---|---|---|---|---|---|---|---|
| 320 | 321 | 322 | 323 | 324 | 325 | 326 | 327 |
| 4545 | 5211 | 5337 | 6002 | 5487 | 6152 | 6278 | 6944 |
| 328 | 329 | 330 | 331 | 332 | 333 | 334 | 335 |
| 5665 | 6330 | 6456 | 7122 | 6606 | 7272 | 7398 | 8063 |
| 336 | 337 | 338 | 339 | 340 | 341 | 342 | 343 |
| 5877 | 6542 | 6668 | 7334 | 6818 | 7484 | 7609 | 8275 |
| 344 | 345 | 346 | 347 | 348 | 349 | 350 | 351 |
| 6996 | 7662 | 7788 | 8453 | 7937 | 8603 | 8729 | 9395 |
| 352 | 353 | 354 | 355 | 356 | 357 | 358 | 359 |
| 6128 | 6794 | 6920 | 7586 | 7070 | 7735 | 7861 | 8527 |
| 360 | 361 | 362 | 363 | 364 | 365 | 366 | 367 |
| 7248 | 7914 | 8039 | 8705 | 8189 | 8855 | 8981 | 9646 |
| 368 | 369 | 370 | 371 | 372 | 373 | 374 | 375 |
| 7460 | 8125 | 8251 | 8917 | 8401 | 9067 | 9193 | 9858 |
| 376 | 377 | 378 | 379 | 380 | 381 | 382 | 383 |
| 8579 | 9245 | 9371 | 10036 | 9521 | 10186 | 10312 | 10978 |
| 384 | 385 | 386 | 387 | 388 | 389 | 390 | 391 |
| 4901 | 5567 | 5693 | 6359 | 5843 | 6508 | 6634 | 7300 |
| 392 | 393 | 394 | 395 | 396 | 397 | 398 | 399 |
| 6021 | 6687 | 6813 | 7478 | 6962 | 7628 | 7754 | 8420 |
| 400 | 401 | 402 | 403 | 404 | 405 | 406 | 407 |
| 6233 | 6898 | 7024 | 7690 | 7174 | 7840 | 7966 | 8631 |
| 408 | 409 | 410 | 411 | 412 | 413 | 414 | 415 |
| 7352 | 8018 | 8144 | 8809 | 8294 | 8959 | 9085 | 9751 |
| 416 | 417 | 418 | 419 | 420 | 421 | 422 | 423 |
| 6485 | 7150 | 7276 | 7942 | 7426 | 8092 | 8218 | 8883 |
| 424 | 425 | 426 | 427 | 428 | 429 | 430 | 431 |
| 7604 | 8270 | 8396 | 9061 | 8545 | 9211 | 9337 | 10003 |
| 432 | 433 | 434 | 435 | 436 | 437 | 438 | 439 |
| 7816 | 8482 | 8608 | 9273 | 8757 | 9423 | 9549 | 10214 |
| 440 | 441 | 442 | 443 | 444 | 445 | 446 | 447 |
| 8935 | 9601 | 9727 | 10393 | 9877 | 10542 | 10668 | 11334 |
| 448 | 449 | 450 | 451 | 452 | 453 | 454 | 455 |
| 6784 | 7450 | 7576 | 8241 | 7726 | 8391 | 8517 | 9183 |
| 456 | 457 | 458 | 459 | 460 | 461 | 462 | 463 |
| 7904 | 8569 | 8695 | 9361 | 8845 | 9511 | 9637 | 10302 |
| 464 | 465 | 466 | 467 | 468 | 469 | 470 | 471 |
| 8115 | 8781 | 8907 | 9573 | 9057 | 9722 | 9848 | 10514 |
| 472 | 473 | 474 | 475 | 476 | 477 | 478 | 479 |
| 9235 | 9901 | 10027 | 10692 | 10176 | 10842 | 10968 | 11634 |

TABLE 29-continued

| 480 | 481 | 482 | 483 | 484 | 485 | 486 | 487 |
|---|---|---|---|---|---|---|---|
| 8367 | 9033 | 9159 | 9825 | 9309 | 9974 | 10100 | 10766 |
| 488 | 489 | 490 | 491 | 492 | 493 | 494 | 495 |
| 9487 | 10152 | 10278 | 10944 | 10428 | 11094 | 11220 | 11885 |
| 496 | 497 | 498 | 499 | 500 | 501 | 502 | 503 |
| 9699 | 10364 | 10490 | 11156 | 10640 | 11306 | 11432 | 12097 |
| 504 | 505 | 506 | 507 | 508 | 509 | 510 | 511 |
| 10818 | 11484 | 11610 | 12275 | 11759 | 12425 | 12551 | 13217 |

A quantized reliability reference sequence obtained according to the foregoing formula is shown in Table 30:

TABLE 30

| 512 |
|---|
| 3166 |

It can be learned from Table 29 and Table 30 that, during storage of the quantized reliability sequence corresponding to the basic sequence, only $2^{l_s}=2^9=512$ values need to be stored; during storage of the values in the quantized reliability reference sequence, $1_{max}-1_s=10-9=1$ value needs to be stored; and only a total of $512+1=513$ values need to be stored. Therefore, compared with a previous case in which 1024 values need to be stored (Table 14), storage space of $(1024-513)/1024=49.9\%$ can be saved, thereby greatly reducing storage overheads and improving storage efficiency.

3. For a reliability sequence corresponding to a mother code sequence with a length of $N_{max}=2^{7_{max}}=2^{11}=2048$, $\beta=2^{0.25}$ is set, 14-bit quantization is performed, and 2048 values are stored according to a prior-art storage manner, as shown in Table 31:

TABLE 31

| 0 | 541 | 644 | 1185 | 765 | 1307 | 1409 | 1950 |
|---|---|---|---|---|---|---|---|
| 910 | 1451 | 1554 | 2095 | 1676 | 2217 | 2319 | 2861 |
| 1082 | 1624 | 1726 | 2267 | 1848 | 2389 | 2492 | 3033 |
| 1993 | 2534 | 2636 | 3178 | 2758 | 3299 | 3402 | 3943 |
| 1287 | 1829 | 1931 | 2472 | 2053 | 2594 | 2696 | 3238 |
| 2198 | 2739 | 2841 | 3382 | 2963 | 3504 | 3607 | 4148 |
| 2370 | 2911 | 3013 | 3555 | 3135 | 3676 | 3779 | 4320 |
| 3280 | 3821 | 3924 | 4465 | 4045 | 4587 | 4689 | 5230 |
| 1531 | 2072 | 2175 | 2716 | 2296 | 2838 | 2940 | 3481 |
| 2441 | 2982 | 3085 | 3626 | 3207 | 3748 | 3850 | 4391 |
| 2613 | 3155 | 3257 | 3798 | 3379 | 3920 | 4022 | 4564 |
| 3524 | 4065 | 4167 | 4708 | 4289 | 4830 | 4933 | 5474 |
| 2818 | 3359 | 3462 | 4003 | 3584 | 4125 | 4227 | 4768 |
| 3728 | 4270 | 4372 | 4913 | 4494 | 5035 | 5137 | 5679 |
| 3901 | 4442 | 4544 | 5086 | 4666 | 5207 | 5310 | 5851 |
| 4811 | 5352 | 5455 | 5996 | 5576 | 6118 | 6220 | 6761 |
| 1821 | 2362 | 2464 | 3005 | 2586 | 3127 | 3230 | 3771 |
| 2731 | 3272 | 3374 | 3916 | 3496 | 4037 | 4140 | 4681 |
| 2903 | 3444 | 3547 | 4088 | 3668 | 4210 | 4312 | 4853 |
| 3813 | 4354 | 4457 | 4998 | 4579 | 5120 | 5222 | 5764 |
| 3108 | 3649 | 3751 | 4293 | 3873 | 4414 | 4517 | 5058 |
| 4018 | 4559 | 4662 | 5203 | 4783 | 5325 | 5427 | 5968 |
| 4190 | 4732 | 4834 | 5375 | 4956 | 5497 | 5599 | 6141 |
| 5101 | 5642 | 5744 | 6285 | 5866 | 6407 | 6510 | 7051 |
| 3351 | 3893 | 3995 | 4536 | 4117 | 4658 | 4760 | 5302 |
| 4262 | 4803 | 4905 | 5447 | 5027 | 5568 | 5671 | 6212 |
| 4434 | 4975 | 5078 | 5619 | 5199 | 5741 | 5843 | 6384 |
| 5344 | 5885 | 5988 | 6529 | 6110 | 6651 | 6753 | 7294 |
| 4639 | 5180 | 5282 | 5824 | 5404 | 5945 | 6048 | 6589 |
| 5549 | 6090 | 6193 | 6734 | 6314 | 6856 | 6958 | 7499 |
| 5721 | 6262 | 6365 | 6906 | 6487 | 7028 | 7130 | 7671 |
| 6631 | 7173 | 7275 | 7816 | 7397 | 7938 | 8040 | 8582 |
| 2165 | 2706 | 2809 | 3350 | 2930 | 3472 | 3574 | 4115 |
| 3075 | 3616 | 3719 | 4260 | 3841 | 4382 | 4484 | 5026 |
| 3247 | 3789 | 3891 | 4432 | 4013 | 4554 | 4657 | 5198 |
| 4158 | 4699 | 4801 | 5343 | 4923 | 5464 | 5567 | 6108 |
| 3452 | 3994 | 4096 | 4637 | 4218 | 4759 | 4861 | 5403 |
| 4363 | 4904 | 5006 | 5547 | 5128 | 5669 | 5772 | 6313 |
| 4535 | 5076 | 5178 | 5720 | 5300 | 5841 | 5944 | 6485 |
| 5445 | 5986 | 6089 | 6630 | 6210 | 6752 | 6854 | 7395 |
| 3696 | 4237 | 4339 | 4881 | 4461 | 5002 | 5105 | 5646 |
| 4606 | 5147 | 5250 | 5791 | 5372 | 5913 | 6015 | 6556 |
| 4778 | 5320 | 5422 | 5963 | 5544 | 6085 | 6187 | 6729 |

TABLE 31-continued

| | | | | | | | |
|---|---|---|---|---|---|---|---|
| 5689 | 6230 | 6332 | 6873 | 6454 | 6995 | 7098 | 7639 |
| 4983 | 5524 | 5627 | 6168 | 5749 | 6290 | 6392 | 6933 |
| 5893 | 6435 | 6537 | 7078 | 6659 | 7200 | 7302 | 7844 |
| 6066 | 6607 | 6709 | 7250 | 6831 | 7372 | 7475 | 8016 |
| 6976 | 7517 | 7620 | 8161 | 7741 | 8283 | 8385 | 8926 |
| 3985 | 4527 | 4629 | 5170 | 4751 | 5292 | 5395 | 5936 |
| 4896 | 5437 | 5539 | 6081 | 5661 | 6202 | 6305 | 6846 |
| 5068 | 5609 | 5712 | 6253 | 5833 | 6375 | 6477 | 7018 |
| 5978 | 6519 | 6622 | 7163 | 6744 | 7285 | 7387 | 7929 |
| 5273 | 5814 | 5916 | 6458 | 6038 | 6579 | 6682 | 7223 |
| 6183 | 6724 | 6827 | 7368 | 6948 | 7490 | 7592 | 8133 |
| 6355 | 6896 | 6999 | 7540 | 7121 | 7662 | 7764 | 8306 |
| 7266 | 7807 | 7909 | 8450 | 8031 | 8572 | 8675 | 9216 |
| 5516 | 6058 | 6160 | 6701 | 6282 | 6823 | 6925 | 7467 |
| 6427 | 6968 | 7070 | 7611 | 7192 | 7733 | 7836 | 8377 |
| 6599 | 7140 | 7242 | 7784 | 7364 | 7905 | 8008 | 8549 |
| 7509 | 8050 | 8153 | 8694 | 8275 | 8816 | 8918 | 9459 |
| 6804 | 7345 | 7447 | 7989 | 7569 | 8110 | 8213 | 8754 |
| 7714 | 8255 | 8358 | 8899 | 8479 | 9021 | 9123 | 9664 |
| 7886 | 8427 | 8530 | 9071 | 8652 | 9193 | 9295 | 9836 |
| 8796 | 9338 | 9440 | 9981 | 9562 | 10103 | 10205 | 10747 |
| 2575 | 3116 | 3218 | 3759 | 3340 | 3881 | 3984 | 4525 |
| 3485 | 4026 | 4128 | 4670 | 4250 | 4792 | 4894 | 5435 |
| 3657 | 4198 | 4301 | 4842 | 4423 | 4964 | 5066 | 5607 |
| 4567 | 5109 | 5211 | 5752 | 5333 | 5874 | 5976 | 6518 |
| 3862 | 4403 | 4506 | 5047 | 4627 | 5169 | 5271 | 5812 |
| 4772 | 5313 | 5416 | 5957 | 5538 | 6079 | 6181 | 6722 |
| 4944 | 5486 | 5588 | 6129 | 5710 | 6251 | 6353 | 6895 |
| 5855 | 6396 | 6498 | 7040 | 6620 | 7161 | 7264 | 7805 |
| 4105 | 4647 | 4749 | 5290 | 4871 | 5412 | 5515 | 6056 |
| 5016 | 5557 | 5659 | 6201 | 5781 | 6322 | 6425 | 6966 |
| 5188 | 5729 | 5832 | 6373 | 5953 | 6495 | 6597 | 7138 |
| 6098 | 6639 | 6742 | 7283 | 6864 | 7405 | 7507 | 8049 |
| 5393 | 5934 | 6036 | 6578 | 6158 | 6699 | 6802 | 7343 |
| 6303 | 6844 | 6947 | 7488 | 7068 | 7610 | 7712 | 8253 |
| 6475 | 7016 | 7119 | 7660 | 7241 | 7782 | 7884 | 8426 |
| 7385 | 7927 | 8029 | 8570 | 8151 | 8692 | 8795 | 9336 |
| 4395 | 4936 | 5039 | 5580 | 5161 | 5702 | 5804 | 6345 |
| 5305 | 5847 | 5949 | 6490 | 6071 | 6612 | 6714 | 7256 |
| 5478 | 6019 | 6121 | 6662 | 6243 | 6784 | 6887 | 7428 |
| 6388 | 6929 | 7031 | 7573 | 7153 | 7695 | 7797 | 8338 |
| 5682 | 6224 | 6326 | 6867 | 6448 | 6989 | 7091 | 7633 |
| 6593 | 7134 | 7236 | 7778 | 7358 | 7899 | 8002 | 8543 |
| 6765 | 7306 | 7409 | 7950 | 7530 | 8072 | 8174 | 8715 |
| 7675 | 8216 | 8319 | 8860 | 8441 | 8982 | 9084 | 9625 |
| 5926 | 6467 | 6570 | 7111 | 6691 | 7233 | 7335 | 7876 |
| 6836 | 7377 | 7480 | 8021 | 7602 | 8143 | 8245 | 8787 |
| 7008 | 7550 | 7652 | 8193 | 7774 | 8315 | 8418 | 8959 |
| 7919 | 8460 | 8562 | 9104 | 8684 | 9225 | 9328 | 9869 |
| 7213 | 7754 | 7857 | 8398 | 7979 | 8520 | 8622 | 9164 |
| 8124 | 8665 | 8767 | 9308 | 8889 | 9430 | 9533 | 10074 |
| 8296 | 8837 | 8939 | 9481 | 9061 | 9602 | 9705 | 10246 |
| 9206 | 9747 | 9850 | 10391 | 9971 | 10513 | 10615 | 11156 |
| 4740 | 5281 | 5383 | 5924 | 5505 | 6046 | 6149 | 6690 |
| 5650 | 6191 | 6293 | 6835 | 6415 | 6956 | 7059 | 7600 |
| 5822 | 6363 | 6466 | 7007 | 6587 | 7129 | 7231 | 7772 |
| 6732 | 7274 | 7376 | 7917 | 7498 | 8039 | 8141 | 8683 |
| 6027 | 6568 | 6670 | 7212 | 6792 | 7334 | 7436 | 7977 |
| 6937 | 7478 | 7581 | 8122 | 7703 | 8244 | 8346 | 8887 |
| 7109 | 7651 | 7753 | 8294 | 7875 | 8416 | 8518 | 9060 |
| 8020 | 8561 | 8663 | 9204 | 8785 | 9326 | 9429 | 9970 |
| 6270 | 6812 | 6914 | 7455 | 7036 | 7577 | 7679 | 8221 |
| 7181 | 7722 | 7824 | 8366 | 7946 | 8487 | 8590 | 9131 |
| 7353 | 7894 | 7997 | 8538 | 8118 | 8660 | 8762 | 9303 |
| 8263 | 8804 | 8907 | 9448 | 9029 | 9570 | 9672 | 10213 |
| 7558 | 8099 | 8201 | 8743 | 8323 | 8864 | 8967 | 9508 |
| 8468 | 9009 | 9112 | 9653 | 9233 | 9775 | 9877 | 10418 |
| 8640 | 9181 | 9284 | 9825 | 9406 | 9947 | 10049 | 10591 |
| 9550 | 10092 | 10194 | 10735 | 10316 | 10857 | 10960 | 11501 |
| 6560 | 7101 | 7204 | 7745 | 7325 | 7867 | 7969 | 8510 |
| 7470 | 8012 | 8114 | 8655 | 8236 | 8777 | 8879 | 9421 |
| 7643 | 8184 | 8286 | 8827 | 8408 | 8949 | 9052 | 9593 |
| 8553 | 9094 | 9196 | 9738 | 9318 | 9859 | 9962 | 10503 |
| 7847 | 8389 | 8491 | 9032 | 8613 | 9154 | 9256 | 9798 |
| 8758 | 9299 | 9401 | 9943 | 9523 | 10064 | 10167 | 10708 |
| 8930 | 9471 | 9573 | 10115 | 9695 | 10237 | 10339 | 10880 |
| 9840 | 10381 | 10484 | 11025 | 10606 | 11147 | 11249 | 11790 |
| 8091 | 8632 | 8735 | 9276 | 8856 | 9398 | 9500 | 10041 |
| 9001 | 9542 | 9645 | 10186 | 9767 | 10308 | 10410 | 10952 |
| 9173 | 9715 | 9817 | 10358 | 9939 | 10480 | 10582 | 11124 |

TABLE 31-continued

| | | | | | | | |
|---|---|---|---|---|---|---|---|
| 10084 | 10625 | 10727 | 11269 | 10849 | 11390 | 11493 | 12034 |
| 9378 | 9919 | 10022 | 10563 | 10144 | 10685 | 10787 | 11329 |
| 10288 | 10830 | 10932 | 11473 | 11054 | 11595 | 11698 | 12239 |
| 10461 | 11002 | 11104 | 11646 | 11226 | 11767 | 11870 | 12411 |
| 11371 | 11912 | 12015 | 12556 | 12136 | 12678 | 12780 | 13321 |
| 3062 | 3603 | 3705 | 4247 | 3827 | 4368 | 4471 | 5012 |
| 3972 | 4513 | 4616 | 5157 | 4737 | 5279 | 5381 | 5922 |
| 4144 | 4685 | 4788 | 5329 | 4910 | 5451 | 5553 | 6095 |
| 5054 | 5596 | 5698 | 6239 | 5820 | 6361 | 6464 | 7005 |
| 4349 | 4890 | 4993 | 5534 | 5114 | 5656 | 5758 | 6299 |
| 5259 | 5801 | 5903 | 6444 | 6025 | 6566 | 6668 | 7210 |
| 5431 | 5973 | 6075 | 6616 | 6197 | 6738 | 6841 | 7382 |
| 6342 | 6883 | 6985 | 7527 | 7107 | 7648 | 7751 | 8292 |
| 4593 | 5134 | 5236 | 5777 | 5358 | 5899 | 6002 | 6543 |
| 5503 | 6044 | 6146 | 6688 | 6268 | 6810 | 6912 | 7453 |
| 5675 | 6216 | 6319 | 6860 | 6440 | 6982 | 7084 | 7625 |
| 6585 | 7127 | 7229 | 7770 | 7351 | 7892 | 7994 | 8536 |
| 5880 | 6421 | 6524 | 7065 | 6645 | 7187 | 7289 | 7830 |
| 6790 | 7331 | 7434 | 7975 | 7556 | 8097 | 8199 | 8740 |
| 6962 | 7504 | 7606 | 8147 | 7728 | 8269 | 8371 | 8913 |
| 7873 | 8414 | 8516 | 9058 | 8638 | 9179 | 9282 | 9823 |
| 4882 | 5423 | 5526 | 6067 | 5648 | 6189 | 6291 | 6833 |
| 5792 | 6334 | 6436 | 6977 | 6558 | 7099 | 7202 | 7743 |
| 5965 | 6506 | 6608 | 7150 | 6730 | 7271 | 7374 | 7915 |
| 6875 | 7416 | 7519 | 8060 | 7640 | 8182 | 8284 | 8825 |
| 6170 | 6711 | 6813 | 7354 | 6935 | 7476 | 7579 | 8120 |
| 7080 | 7621 | 7723 | 8265 | 7845 | 8386 | 8489 | 9030 |
| 7252 | 7793 | 7896 | 8437 | 8017 | 8559 | 8661 | 9202 |
| 8162 | 8704 | 8806 | 9347 | 8928 | 9469 | 9571 | 10113 |
| 6413 | 6954 | 7057 | 7598 | 7179 | 7720 | 7822 | 8363 |
| 7323 | 7865 | 7967 | 8508 | 8089 | 8630 | 8732 | 9274 |
| 7496 | 8037 | 8139 | 8680 | 8261 | 8802 | 8905 | 9446 |
| 8406 | 8947 | 9049 | 9591 | 9171 | 9713 | 9815 | 10356 |
| 7700 | 8242 | 8344 | 8885 | 8466 | 9007 | 9109 | 9651 |
| 8611 | 9152 | 9254 | 9796 | 9376 | 9917 | 10020 | 10561 |
| 8783 | 9324 | 9427 | 9968 | 9548 | 10090 | 10192 | 10733 |
| 9693 | 10234 | 10337 | 10878 | 10459 | 11000 | 11102 | 11643 |
| 5227 | 5768 | 5870 | 6412 | 5992 | 6533 | 6636 | 7177 |
| 6137 | 6678 | 6781 | 7322 | 6902 | 7444 | 7546 | 8087 |
| 6309 | 6850 | 6953 | 7494 | 7075 | 7616 | 7718 | 8259 |
| 7219 | 7761 | 7863 | 8404 | 7985 | 8526 | 8629 | 9170 |
| 6514 | 7055 | 7158 | 7699 | 7279 | 7821 | 7923 | 8464 |
| 7424 | 7965 | 8068 | 8609 | 8190 | 8731 | 8833 | 9375 |
| 7596 | 8138 | 8240 | 8781 | 8362 | 8903 | 9006 | 9547 |
| 8507 | 9048 | 9150 | 9692 | 9272 | 9813 | 9916 | 10457 |
| 6758 | 7299 | 7401 | 7942 | 7523 | 8064 | 8167 | 8708 |
| 7668 | 8209 | 8311 | 8853 | 8433 | 8974 | 9077 | 9618 |
| 7840 | 8381 | 8484 | 9025 | 8605 | 9147 | 9249 | 9790 |
| 8750 | 9292 | 9394 | 9935 | 9516 | 10057 | 10159 | 10701 |
| 8045 | 8586 | 8688 | 9230 | 8810 | 9352 | 9454 | 9995 |
| 8955 | 9496 | 9599 | 10140 | 9721 | 10262 | 10364 | 10905 |
| 9127 | 9669 | 9771 | 10312 | 9893 | 10434 | 10536 | 11078 |
| 10038 | 10579 | 10681 | 11222 | 10803 | 11344 | 11447 | 11988 |
| 7047 | 7588 | 7691 | 8232 | 7813 | 8354 | 8456 | 8998 |
| 7957 | 8499 | 8601 | 9142 | 8723 | 9264 | 9367 | 9908 |
| 8130 | 8671 | 8773 | 9315 | 8895 | 9436 | 9539 | 10080 |
| 9040 | 9581 | 9684 | 10225 | 9805 | 10347 | 10449 | 10990 |
| 8334 | 8876 | 8978 | 9519 | 9100 | 9641 | 9744 | 10285 |
| 9245 | 9786 | 9888 | 10430 | 10010 | 10551 | 10654 | 11195 |
| 9417 | 9958 | 10061 | 10602 | 10182 | 10724 | 10826 | 11367 |
| 10327 | 10868 | 10971 | 11512 | 11093 | 11634 | 11736 | 12278 |
| 8578 | 9119 | 9222 | 9763 | 9343 | 9885 | 9987 | 10528 |
| 9488 | 10030 | 10132 | 10673 | 10254 | 10795 | 10897 | 11439 |
| 9661 | 10202 | 10304 | 10845 | 10426 | 10967 | 11070 | 11611 |
| 10571 | 11112 | 11214 | 11756 | 11336 | 11877 | 11980 | 12521 |
| 9865 | 10407 | 10509 | 11050 | 10631 | 11172 | 11274 | 11816 |
| 10776 | 11317 | 11419 | 11960 | 11541 | 12082 | 12185 | 12726 |
| 10948 | 11489 | 11591 | 12133 | 11713 | 12255 | 12357 | 12898 |
| 11858 | 12399 | 12502 | 13043 | 12624 | 13165 | 13267 | 13808 |
| 5636 | 6178 | 6280 | 6821 | 6402 | 6943 | 7045 | 7587 |
| 6547 | 7088 | 7190 | 7731 | 7312 | 7853 | 7956 | 8497 |
| 6719 | 7260 | 7362 | 7904 | 7484 | 8025 | 8128 | 8669 |
| 7629 | 8170 | 8273 | 8814 | 8394 | 8936 | 9038 | 9579 |
| 6924 | 7465 | 7567 | 8108 | 7689 | 8230 | 8333 | 8874 |
| 7834 | 8375 | 8478 | 9019 | 8599 | 9141 | 9243 | 9784 |
| 8006 | 8547 | 8650 | 9191 | 8772 | 9313 | 9415 | 9956 |
| 8916 | 9458 | 9560 | 10101 | 9682 | 10223 | 10325 | 10867 |
| 7167 | 7708 | 7811 | 8352 | 7933 | 8474 | 8576 | 9117 |
| 8077 | 8619 | 8721 | 9262 | 8843 | 9384 | 9487 | 10028 |
| 8250 | 8791 | 8893 | 9435 | 9015 | 9556 | 9659 | 10200 |

TABLE 31-continued

| | | | | | | | |
|---|---|---|---|---|---|---|---|
| 9160 | 9701 | 9804 | 10345 | 9925 | 10467 | 10569 | 11110 |
| 8454 | 8996 | 9098 | 9639 | 9220 | 9761 | 9864 | 10405 |
| 9365 | 9906 | 10008 | 10550 | 10130 | 10671 | 10774 | 11315 |
| 9537 | 10078 | 10181 | 10722 | 10302 | 10844 | 10946 | 11487 |
| 10447 | 10988 | 11091 | 11632 | 11213 | 11754 | 11856 | 12398 |
| 7457 | 7998 | 8100 | 8642 | 8222 | 8763 | 8866 | 9407 |
| 8367 | 8908 | 9011 | 9552 | 9133 | 9674 | 9776 | 10317 |
| 8539 | 9081 | 9183 | 9724 | 9305 | 9846 | 9948 | 10490 |
| 9450 | 9991 | 10093 | 10634 | 10215 | 10756 | 10859 | 11400 |
| 8744 | 9285 | 9388 | 9929 | 9510 | 10051 | 10153 | 10694 |
| 9654 | 10196 | 10298 | 10839 | 10420 | 10961 | 11063 | 11605 |
| 9827 | 10368 | 10470 | 11011 | 10592 | 11133 | 11236 | 11777 |
| 10737 | 11278 | 11381 | 11922 | 11502 | 12044 | 12146 | 12687 |
| 8988 | 9529 | 9631 | 10173 | 9753 | 10294 | 10397 | 10938 |
| 9898 | 10439 | 10542 | 11083 | 10663 | 11205 | 11307 | 11848 |
| 10070 | 10611 | 10714 | 11255 | 10836 | 11377 | 11479 | 12020 |
| 10980 | 11522 | 11624 | 12165 | 11746 | 12287 | 12389 | 12931 |
| 10275 | 10816 | 10919 | 11460 | 11040 | 11582 | 11684 | 12225 |
| 11185 | 11726 | 11829 | 12370 | 11951 | 12492 | 12594 | 13136 |
| 11357 | 11899 | 12001 | 12542 | 12123 | 12664 | 12767 | 13308 |
| 12268 | 12809 | 12911 | 13453 | 13033 | 13574 | 13677 | 14218 |
| 7801 | 8343 | 8445 | 8986 | 8567 | 9108 | 9210 | 9752 |
| 8712 | 9253 | 9355 | 9896 | 9477 | 10018 | 10121 | 10662 |
| 8884 | 9425 | 9527 | 10069 | 9649 | 10190 | 10293 | 10834 |
| 9794 | 10335 | 10438 | 10979 | 10559 | 11101 | 11203 | 11744 |
| 9089 | 9630 | 9732 | 10273 | 9854 | 10395 | 10498 | 11039 |
| 9999 | 10540 | 10642 | 11184 | 10764 | 11305 | 11408 | 11949 |
| 10171 | 10712 | 10815 | 11356 | 10936 | 11478 | 11580 | 12121 |
| 11081 | 11623 | 11725 | 12266 | 11847 | 12388 | 12490 | 13032 |
| 9332 | 9873 | 9976 | 10517 | 10098 | 10639 | 10741 | 11282 |
| 10242 | 10784 | 10886 | 11427 | 11008 | 11549 | 11651 | 12193 |
| 10415 | 10956 | 11058 | 11600 | 11180 | 11721 | 11824 | 12365 |
| 11325 | 11866 | 11969 | 12510 | 12090 | 12632 | 12734 | 13275 |
| 10619 | 11161 | 11263 | 11804 | 11385 | 11926 | 12029 | 12570 |
| 11530 | 12071 | 12173 | 12715 | 12295 | 12836 | 12939 | 13480 |
| 11702 | 12243 | 12346 | 12887 | 12467 | 13009 | 13111 | 13652 |
| 12612 | 13153 | 13256 | 13797 | 13378 | 13919 | 14021 | 14562 |
| 9622 | 10163 | 10265 | 10807 | 10387 | 10928 | 11031 | 11572 |
| 10532 | 11073 | 11176 | 11717 | 11297 | 11839 | 11941 | 12482 |
| 10704 | 11246 | 11348 | 11889 | 11470 | 12011 | 12113 | 12655 |
| 11615 | 12156 | 12258 | 12799 | 12380 | 12921 | 13024 | 13565 |
| 10909 | 11450 | 11553 | 12094 | 11675 | 12216 | 12318 | 12859 |
| 11819 | 12361 | 12463 | 13004 | 12585 | 13126 | 13228 | 13770 |
| 11992 | 12533 | 12635 | 13176 | 12757 | 13298 | 13401 | 13942 |
| 12902 | 13443 | 13545 | 14087 | 13667 | 14208 | 14311 | 14852 |
| 11153 | 11694 | 11796 | 12338 | 11918 | 12459 | 12562 | 13103 |
| 12063 | 12604 | 12707 | 13248 | 12828 | 13370 | 13472 | 14013 |
| 12235 | 12776 | 12879 | 13420 | 13001 | 13542 | 13644 | 14185 |
| 13145 | 13687 | 13789 | 14330 | 13911 | 14452 | 14554 | 15096 |
| 12440 | 12981 | 13084 | 13625 | 13205 | 13747 | 13849 | 14390 |
| 13350 | 13891 | 13994 | 14535 | 14116 | 14657 | 14759 | 15301 |
| 13522 | 14064 | 14166 | 14707 | 14288 | 14829 | 14932 | 15473 |
| 14433 | 14974 | 15076 | 15618 | 15198 | 15739 | 15842 | 16383 |

There may be the following several implementations, provided in this application, for transforming a maximum-mother-code-length reliability sequence with a length of 2048 to a reliability sequence and a reliability reference sequence:

(1) It is set that $l_s=3$, $N_s=8$, and $PW_i$, $0 \le i < 8$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 32:

TABLE 32

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |

A quantized reliability reference sequence obtained according to the foregoing formula is shown in Table 33:

TABLE 33

| 8 | 16 | 32 | 64 | 128 | 256 | 512 | 1024 |
|---|---|---|---|---|---|---|---|
| 910 | 1082 | 1287 | 1531 | 1821 | 2165 | 2575 | 3062 |

It can be learned from Table 32 and Table 33 that, during storage of the quantized reliability sequence corresponding to the basic sequence, only $2^{l_s}=2^3=8$ values need to be stored; during storage of the values in the quantized reliability reference sequence, $l_{max}-l_s=11-3=8$ values need to be stored; and only a total of 8+8=16 values need to be stored. Therefore, compared with a previous case in which 2048 values need to be stored (Table 31), storage space of (2048−16)/2048=99.2% can be saved, thereby greatly reducing storage overheads and improving storage efficiency.

(2) It is set that $l_s=4$, $N_s=16$, and $PW_i$, $0 \le i < 16$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 34:

TABLE 34

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |

A quantized reliability reference sequence obtained according to the foregoing formula is shown in Table 35:

TABLE 35

| 16 | 32 | 64 | 128 | 256 | 512 | 1024 |
|---|---|---|---|---|---|---|
| 1082 | 1287 | 1531 | 1821 | 2165 | 2575 | 3062 |

It can be learned from Table 34 and Table 35 that, during storage of the quantized reliability sequence corresponding to the basic sequence, only $2^{l_s}=2^4=16$ values need to be stored; during storage of the values in the quantized reliability reference sequence, $l_{max}-l_s=11-4=7$ values need to be stored; and only a total of 16+7=23 values need to be stored. Therefore, compared with a previous case in which 2048 values need to be stored (Table 31), storage space of (2048−23)/2048=98.9% can be saved, thereby greatly reducing storage overheads and improving storage efficiency.

(3) It is set that $l_s=5$, $N_s=32$, and $PW_i$, $0 \le i < 32$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 36:

TABLE 36

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |
| 16 | 17 | 18 | 19 | 20 | 21 | 22 | 23 |
| 1082 | 1624 | 1726 | 2267 | 1848 | 2389 | 2492 | 3033 |
| 24 | 25 | 26 | 27 | 28 | 29 | 30 | 31 |
| 1993 | 2534 | 2636 | 3178 | 2758 | 3299 | 3402 | 3943 |

A quantized reliability reference sequence obtained according to the foregoing formula is shown in Table 37:

TABLE 37

| 32 | 64 | 128 | 256 | 512 | 1024 |
|---|---|---|---|---|---|
| 1287 | 1531 | 1821 | 2165 | 2575 | 3062 |

It can be learned from Table 36 and Table 37 that, during storage of the quantized reliability sequence corresponding to the basic sequence, only $2^{l_s}=2^5=32$ values need to be stored; during storage of the values in the quantized reliability reference sequence, $l_{max}-l_s=11-5=6$ values need to be stored; and only a total of 32+6=38 values need to be stored. Therefore, compared with a previous case in which 2048 values need to be stored (Table 31), storage space of (2048−38)/2048=98.1% can be saved, thereby greatly reducing storage overheads and improving storage efficiency.

(4) It is set that $l_s=6$, $N_s=64$, and $PW_i$, $0 \le i < 64$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 38:

TABLE 38

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |
| 16 | 17 | 18 | 19 | 20 | 21 | 22 | 23 |
| 1082 | 1624 | 1726 | 2267 | 1848 | 2389 | 2492 | 3033 |
| 24 | 25 | 26 | 27 | 28 | 29 | 30 | 31 |
| 1993 | 2534 | 2636 | 3178 | 2758 | 3299 | 3402 | 3943 |
| 32 | 33 | 34 | 35 | 36 | 37 | 38 | 39 |
| 1287 | 1829 | 1931 | 2472 | 2053 | 2594 | 2696 | 3238 |
| 40 | 41 | 42 | 43 | 44 | 45 | 46 | 47 |
| 2198 | 2739 | 2841 | 3382 | 2963 | 3504 | 3607 | 4148 |
| 48 | 49 | 50 | 51 | 52 | 53 | 54 | 55 |
| 2370 | 2911 | 3013 | 3555 | 3135 | 3676 | 3779 | 4320 |
| 56 | 57 | 58 | 59 | 60 | 61 | 62 | 63 |
| 3280 | 3821 | 3924 | 4465 | 4045 | 4587 | 4689 | 5230 |

A quantized reliability reference sequence obtained according to the foregoing formula is shown in Table 39:

TABLE 39

| 64 | 128 | 256 | 512 | 1024 |
|---|---|---|---|---|
| 1531 | 1821 | 2165 | 2575 | 3062 |

It can be learned from Table 38 and Table 39 that, during storage of the quantized reliability sequence corresponding to the basic sequence, only $2^{l_s}=2^6=64$ values need to be stored; during storage of the values in the quantized reliability reference sequence, $l_{max}-l_s=11-6=5$ values need to be stored; and only a total of 64+5=69 values need to be stored. Therefore, compared with a previous case in which 2048 values need to be stored (Table 31), storage space of (2048−69)/=96.6% can be saved, thereby greatly reducing storage overheads and improving storage efficiency.

(5) It is set that $l_s=7$, $N_s=128$, and $PW_i$, $0 \le i < 128$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 40:

TABLE 40

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |
| 16 | 17 | 18 | 19 | 20 | 21 | 22 | 23 |
| 1082 | 1624 | 1726 | 2267 | 1848 | 2389 | 2492 | 3033 |
| 24 | 25 | 26 | 27 | 28 | 29 | 30 | 31 |
| 1993 | 2534 | 2636 | 3178 | 2758 | 3299 | 3402 | 3943 |
| 32 | 33 | 34 | 35 | 36 | 37 | 38 | 39 |
| 1287 | 1829 | 1931 | 2472 | 2053 | 2594 | 2696 | 3238 |
| 40 | 41 | 42 | 43 | 44 | 45 | 46 | 47 |
| 2198 | 2739 | 2841 | 3382 | 2963 | 3504 | 3607 | 4148 |
| 48 | 49 | 50 | 51 | 52 | 53 | 54 | 55 |
| 2370 | 2911 | 3013 | 3555 | 3135 | 3676 | 3779 | 4320 |
| 56 | 57 | 58 | 59 | 60 | 61 | 62 | 63 |
| 3280 | 3821 | 3924 | 4465 | 4045 | 4587 | 4689 | 5230 |
| 64 | 65 | 66 | 67 | 68 | 69 | 70 | 71 |
| 1531 | 2072 | 2175 | 2716 | 2296 | 2838 | 2940 | 3481 |
| 72 | 73 | 74 | 75 | 76 | 77 | 78 | 79 |
| 2441 | 2982 | 3085 | 3626 | 3207 | 3748 | 3850 | 4391 |
| 80 | 81 | 82 | 83 | 84 | 85 | 86 | 87 |
| 2613 | 3155 | 3257 | 3798 | 3379 | 3920 | 4022 | 4564 |
| 88 | 89 | 90 | 91 | 92 | 93 | 94 | 95 |
| 3524 | 4065 | 4167 | 4708 | 4289 | 4830 | 4933 | 5474 |
| 96 | 97 | 98 | 99 | 100 | 101 | 102 | 103 |
| 2818 | 3359 | 3462 | 4003 | 3584 | 4125 | 4227 | 4768 |
| 104 | 105 | 106 | 107 | 108 | 109 | 110 | 111 |
| 3728 | 4270 | 4372 | 4913 | 4494 | 5035 | 5137 | 5679 |
| 112 | 113 | 114 | 115 | 116 | 117 | 118 | 119 |
| 3901 | 4442 | 4544 | 5086 | 4666 | 5207 | 5310 | 5851 |
| 120 | 121 | 122 | 123 | 124 | 125 | 126 | 127 |
| 4811 | 5352 | 5455 | 5996 | 5576 | 6118 | 6220 | 6761 |

A quantized reliability reference sequence obtained according to the foregoing formula is shown in Table 41:

TABLE 41

| 128 | 256 | 512 | 1024 |
|---|---|---|---|
| 1821 | 2165 | 2575 | 3062 |

It can be learned from Table 40 and Table 41 that, during storage of the quantized reliability sequence corresponding to the basic sequence, $2^{l_s}=2^7=128$ values need to be stored; during storage of the values in the quantized reliability reference sequence, only $l_{max}-l_s=11-7=4$ values need to be stored; and only a total of $128+4=132$ values need to be stored. Therefore, compared with a previous case in which 2048 values need to be stored (Table 31), storage space of $(2048-132)/2048=93.5\%$ can be saved, thereby greatly reducing storage overheads and improving storage efficiency.

(6) It is set that $l_s=8$, $N_s=256$, and $PW_i$, $0 \le i < 256$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 42:

TABLE 42

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |
| 16 | 17 | 18 | 19 | 20 | 21 | 22 | 23 |
| 1082 | 1624 | 1726 | 2267 | 1848 | 2389 | 2492 | 3033 |
| 24 | 25 | 26 | 27 | 28 | 29 | 30 | 31 |
| 1993 | 2534 | 2636 | 3178 | 2758 | 3299 | 3402 | 3943 |
| 32 | 33 | 34 | 35 | 36 | 37 | 38 | 39 |
| 1287 | 1829 | 1931 | 2472 | 2053 | 2594 | 2696 | 3238 |
| 40 | 41 | 42 | 43 | 44 | 45 | 46 | 47 |
| 2198 | 2739 | 2841 | 3382 | 2963 | 3504 | 3607 | 4148 |
| 48 | 49 | 50 | 51 | 52 | 53 | 54 | 55 |
| 2370 | 2911 | 3013 | 3555 | 3135 | 3676 | 3779 | 4320 |
| 56 | 57 | 58 | 59 | 60 | 61 | 62 | 63 |
| 3280 | 3821 | 3924 | 4465 | 4045 | 4587 | 4689 | 5230 |
| 64 | 65 | 66 | 67 | 68 | 69 | 70 | 71 |
| 1531 | 2072 | 2175 | 2716 | 2296 | 2838 | 2940 | 3481 |
| 72 | 73 | 74 | 75 | 76 | 77 | 78 | 79 |
| 2441 | 2982 | 3085 | 3626 | 3207 | 3748 | 3850 | 4391 |
| 80 | 81 | 82 | 83 | 84 | 85 | 86 | 87 |
| 2613 | 3155 | 3257 | 3798 | 3379 | 3920 | 4022 | 4564 |
| 88 | 89 | 90 | 91 | 92 | 93 | 94 | 95 |
| 3524 | 4065 | 4167 | 4708 | 4289 | 4830 | 4933 | 5474 |
| 96 | 97 | 98 | 99 | 100 | 101 | 102 | 103 |
| 2818 | 3359 | 3462 | 4003 | 3584 | 4125 | 4227 | 4768 |
| 104 | 105 | 106 | 107 | 108 | 109 | 110 | 111 |
| 3728 | 4270 | 4372 | 4913 | 4494 | 5035 | 5137 | 5679 |
| 112 | 113 | 114 | 115 | 116 | 117 | 118 | 119 |
| 3901 | 4442 | 4544 | 5086 | 4666 | 5207 | 5310 | 5851 |

TABLE 42-continued

| 120 | 121 | 122 | 123 | 124 | 125 | 126 | 127 |
|---|---|---|---|---|---|---|---|
| 4811 | 5352 | 5455 | 5996 | 5576 | 6118 | 6220 | 6761 |
| 128 | 129 | 130 | 131 | 132 | 133 | 134 | 135 |
| 1821 | 2362 | 2464 | 3005 | 2586 | 3127 | 3230 | 3771 |
| 136 | 137 | 138 | 139 | 140 | 141 | 142 | 143 |
| 2731 | 3272 | 3374 | 3916 | 3496 | 4037 | 4140 | 4681 |
| 144 | 145 | 146 | 147 | 148 | 149 | 150 | 151 |
| 2903 | 3444 | 3547 | 4088 | 3668 | 4210 | 4312 | 4853 |
| 152 | 153 | 154 | 155 | 156 | 157 | 158 | 159 |
| 3813 | 4354 | 4457 | 4998 | 4579 | 5120 | 5222 | 5764 |
| 160 | 161 | 162 | 163 | 164 | 165 | 166 | 167 |
| 3108 | 3649 | 3751 | 4293 | 3873 | 4414 | 4517 | 5058 |
| 168 | 169 | 170 | 171 | 172 | 173 | 174 | 175 |
| 4018 | 4559 | 4662 | 5203 | 4783 | 5325 | 5427 | 5968 |
| 176 | 177 | 178 | 179 | 180 | 181 | 182 | 183 |
| 4190 | 4732 | 4834 | 5375 | 4956 | 5497 | 5599 | 6141 |
| 184 | 185 | 186 | 187 | 188 | 189 | 190 | 191 |
| 5101 | 5642 | 5744 | 6285 | 5866 | 6407 | 6510 | 7051 |
| 192 | 193 | 194 | 195 | 196 | 197 | 198 | 199 |
| 3351 | 3893 | 3995 | 4536 | 4117 | 4658 | 4760 | 5302 |
| 200 | 201 | 202 | 203 | 204 | 205 | 206 | 207 |
| 4262 | 4803 | 4905 | 5447 | 5027 | 5568 | 5671 | 6212 |
| 208 | 209 | 210 | 211 | 212 | 213 | 214 | 215 |
| 4434 | 4975 | 5078 | 5619 | 5199 | 5741 | 5843 | 6384 |
| 216 | 217 | 218 | 219 | 220 | 221 | 222 | 223 |
| 5344 | 5885 | 5988 | 6529 | 6110 | 6651 | 6753 | 7294 |
| 224 | 225 | 226 | 227 | 228 | 229 | 230 | 231 |
| 4639 | 5180 | 5282 | 5824 | 5404 | 5945 | 6048 | 6589 |
| 232 | 233 | 234 | 235 | 236 | 237 | 238 | 239 |
| 5549 | 6090 | 6193 | 6734 | 6314 | 6856 | 6958 | 7499 |
| 240 | 241 | 242 | 243 | 244 | 245 | 246 | 247 |
| 5721 | 6262 | 6365 | 6906 | 6487 | 7028 | 7130 | 7671 |
| 248 | 249 | 250 | 251 | 252 | 253 | 254 | 255 |
| 6631 | 7173 | 7275 | 7816 | 7397 | 7938 | 8040 | 8582 |

A quantized reliability reference sequence obtained according to the foregoing formula is shown in Table 43:

TABLE 43

| 256 | 512 | 1024 |
|---|---|---|
| 2165 | 2575 | 3062 |

It can be learned from Table 42 and Table 43 that, during storage of the quantized reliability sequence corresponding to the basic sequence, only $2^{l_s}=2^8=256$ values need to be stored; during storage of the values in the quantized reliability reference sequence, $l_{max}-l_s=11-8=3$ values need to be stored; and only a total of 256+3=259 values need to be stored. Therefore, compared with a previous case in which 2048 values need to be stored (Table 31), storage space of (2048−258)/2048=87.4% can be saved, thereby greatly reducing storage overheads and improving storage efficiency.

(7) It is set that $l_s=9$, $N_s=512$, and $PW_i$, $0 \leq i < 512$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 44:

TABLE 44

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |
| 16 | 17 | 18 | 19 | 20 | 21 | 22 | 23 |
| 1082 | 1624 | 1726 | 2267 | 1848 | 2389 | 2492 | 3033 |
| 24 | 25 | 26 | 27 | 28 | 29 | 30 | 31 |
| 1993 | 2534 | 2636 | 3178 | 2758 | 3299 | 3402 | 3943 |
| 32 | 33 | 34 | 35 | 36 | 37 | 38 | 39 |
| 1287 | 1829 | 1931 | 2472 | 2053 | 2594 | 2696 | 3238 |
| 40 | 41 | 42 | 43 | 44 | 45 | 46 | 47 |
| 2198 | 2739 | 2841 | 3382 | 2963 | 3504 | 3607 | 4148 |
| 48 | 49 | 50 | 51 | 52 | 53 | 54 | 55 |
| 2370 | 2911 | 3013 | 3555 | 3135 | 3676 | 3779 | 4320 |
| 56 | 57 | 58 | 59 | 60 | 61 | 62 | 63 |
| 3280 | 3821 | 3924 | 4465 | 4045 | 4587 | 4689 | 5230 |
| 64 | 65 | 66 | 67 | 68 | 69 | 70 | 71 |
| 1531 | 2072 | 2175 | 2716 | 2296 | 2838 | 2940 | 3481 |
| 72 | 73 | 74 | 75 | 76 | 77 | 78 | 79 |
| 2441 | 2982 | 3085 | 3626 | 3207 | 3748 | 3850 | 4391 |
| 80 | 81 | 82 | 83 | 84 | 85 | 86 | 87 |
| 2613 | 3155 | 3257 | 3798 | 3379 | 3920 | 4022 | 4564 |
| 88 | 89 | 90 | 91 | 92 | 93 | 94 | 95 |
| 3524 | 4065 | 4167 | 4708 | 4289 | 4830 | 4933 | 5474 |
| 96 | 97 | 98 | 99 | 100 | 101 | 102 | 103 |
| 2818 | 3359 | 3462 | 4003 | 3584 | 4125 | 4227 | 4768 |
| 104 | 105 | 106 | 107 | 108 | 109 | 110 | 111 |
| 3728 | 4270 | 4372 | 4913 | 4494 | 5035 | 5137 | 5679 |
| 112 | 113 | 114 | 115 | 116 | 117 | 118 | 119 |

TABLE 44-continued

| | | | | | | | |
|---|---|---|---|---|---|---|---|
| 3901 | 4442 | 4544 | 5086 | 4666 | 5207 | 5310 | 5851 |
| 120 | 121 | 122 | 123 | 124 | 125 | 126 | 127 |
| 4811 | 5352 | 5455 | 5996 | 5576 | 6118 | 6220 | 6761 |
| 128 | 129 | 130 | 131 | 132 | 133 | 134 | 135 |
| 1821 | 2362 | 2464 | 3005 | 2586 | 3127 | 3230 | 3771 |
| 136 | 137 | 138 | 139 | 140 | 141 | 142 | 143 |
| 2731 | 3272 | 3374 | 3916 | 3496 | 4037 | 4140 | 4681 |
| 144 | 145 | 146 | 147 | 148 | 149 | 150 | 151 |
| 2903 | 3444 | 3547 | 4088 | 3668 | 4210 | 4312 | 4853 |
| 152 | 153 | 154 | 155 | 156 | 157 | 158 | 159 |
| 3813 | 4354 | 4457 | 4998 | 4579 | 5120 | 5222 | 5764 |
| 160 | 161 | 162 | 163 | 164 | 165 | 166 | 167 |
| 3108 | 3649 | 3751 | 4293 | 3873 | 4414 | 4517 | 5058 |
| 168 | 169 | 170 | 171 | 172 | 173 | 174 | 175 |
| 4018 | 4559 | 4662 | 5203 | 4783 | 5325 | 5427 | 5968 |
| 176 | 177 | 178 | 179 | 180 | 181 | 182 | 183 |
| 4190 | 4732 | 4834 | 5375 | 4956 | 5497 | 5599 | 6141 |
| 184 | 185 | 186 | 187 | 188 | 189 | 190 | 191 |
| 5101 | 5642 | 5744 | 6285 | 5866 | 6407 | 6510 | 7051 |
| 192 | 193 | 194 | 195 | 196 | 197 | 198 | 199 |
| 3351 | 3893 | 3995 | 4536 | 4117 | 4658 | 4760 | 5302 |
| 200 | 201 | 202 | 203 | 204 | 205 | 206 | 207 |
| 4262 | 4803 | 4905 | 5447 | 5027 | 5568 | 5671 | 6212 |
| 208 | 209 | 210 | 211 | 212 | 213 | 214 | 215 |
| 4434 | 4975 | 5078 | 5619 | 5199 | 5741 | 5843 | 6384 |
| 216 | 217 | 218 | 219 | 220 | 221 | 222 | 223 |
| 5344 | 5885 | 5988 | 6529 | 6110 | 6651 | 6753 | 7294 |
| 224 | 225 | 226 | 227 | 228 | 229 | 230 | 231 |
| 4639 | 5180 | 5282 | 5824 | 5404 | 5945 | 6048 | 6589 |
| 232 | 233 | 234 | 235 | 236 | 237 | 238 | 239 |
| 5549 | 6090 | 6193 | 6734 | 6314 | 6856 | 6958 | 7499 |
| 240 | 241 | 242 | 243 | 244 | 245 | 246 | 247 |
| 5721 | 6262 | 6365 | 6906 | 6487 | 7028 | 7130 | 7671 |
| 248 | 249 | 250 | 251 | 252 | 253 | 254 | 255 |
| 6631 | 7173 | 7275 | 7816 | 7397 | 7938 | 8040 | 8582 |
| 256 | 257 | 258 | 259 | 260 | 261 | 262 | 263 |
| 2165 | 2706 | 2809 | 3350 | 2930 | 3472 | 3574 | 4115 |
| 264 | 265 | 266 | 267 | 268 | 269 | 270 | 271 |
| 3075 | 3616 | 3719 | 4260 | 3841 | 4382 | 4484 | 5026 |
| 272 | 273 | 274 | 275 | 276 | 277 | 278 | 279 |
| 3247 | 3789 | 3891 | 4432 | 4013 | 4554 | 4657 | 5198 |
| 280 | 281 | 282 | 283 | 284 | 285 | 286 | 287 |
| 4158 | 4699 | 4801 | 5343 | 4923 | 5464 | 5567 | 6108 |
| 288 | 289 | 290 | 291 | 292 | 293 | 294 | 295 |
| 3452 | 3994 | 4096 | 4637 | 4218 | 4759 | 4861 | 5403 |
| 296 | 297 | 298 | 299 | 300 | 301 | 302 | 303 |
| 4363 | 4904 | 5006 | 5547 | 5128 | 5669 | 5772 | 6313 |
| 304 | 305 | 306 | 307 | 308 | 309 | 310 | 311 |
| 4535 | 5076 | 5178 | 5720 | 5300 | 5841 | 5944 | 6485 |
| 312 | 313 | 314 | 315 | 316 | 317 | 318 | 319 |
| 5445 | 5986 | 6089 | 6630 | 6210 | 6752 | 6854 | 7395 |
| 320 | 321 | 322 | 323 | 324 | 325 | 326 | 327 |
| 3696 | 4237 | 4339 | 4881 | 4461 | 5002 | 5105 | 5646 |
| 328 | 329 | 330 | 331 | 332 | 333 | 334 | 335 |
| 4606 | 5147 | 5250 | 5791 | 5372 | 5913 | 6015 | 6556 |
| 336 | 337 | 338 | 339 | 340 | 341 | 342 | 343 |
| 4778 | 5320 | 5422 | 5963 | 5544 | 6085 | 6187 | 6729 |
| 344 | 345 | 346 | 347 | 348 | 349 | 350 | 351 |
| 5689 | 6230 | 6332 | 6873 | 6454 | 6995 | 7098 | 7639 |
| 352 | 353 | 354 | 355 | 356 | 357 | 358 | 359 |
| 4983 | 5524 | 5627 | 6168 | 5749 | 6290 | 6392 | 6933 |
| 360 | 361 | 362 | 363 | 364 | 365 | 366 | 367 |
| 5893 | 6435 | 6537 | 7078 | 6659 | 7200 | 7302 | 7844 |
| 368 | 369 | 370 | 371 | 372 | 373 | 374 | 375 |
| 6066 | 6607 | 6709 | 7250 | 6831 | 7372 | 7475 | 8016 |
| 376 | 377 | 378 | 379 | 380 | 381 | 382 | 383 |
| 6976 | 7517 | 7620 | 8161 | 7741 | 8283 | 8385 | 8926 |
| 384 | 385 | 386 | 387 | 388 | 389 | 390 | 391 |
| 3985 | 4527 | 4629 | 5170 | 4751 | 5292 | 5395 | 5936 |
| 392 | 393 | 394 | 395 | 396 | 397 | 398 | 399 |
| 4896 | 5437 | 5539 | 6081 | 5661 | 6202 | 6305 | 6846 |
| 400 | 401 | 402 | 403 | 404 | 405 | 406 | 407 |
| 5068 | 5609 | 5712 | 6253 | 5833 | 6375 | 6477 | 7018 |
| 408 | 409 | 410 | 411 | 412 | 413 | 414 | 415 |
| 5978 | 6519 | 6622 | 7163 | 6744 | 7285 | 7387 | 7929 |
| 416 | 417 | 418 | 419 | 420 | 421 | 422 | 423 |
| 5273 | 5814 | 5916 | 6458 | 6038 | 6579 | 6682 | 7223 |
| 424 | 425 | 426 | 427 | 428 | 429 | 430 | 431 |
| 6183 | 6724 | 6827 | 7368 | 6948 | 7490 | 7592 | 8133 |
| 432 | 433 | 434 | 435 | 436 | 437 | 438 | 439 |

TABLE 44-continued

| | | | | | | | |
|---|---|---|---|---|---|---|---|
| 6355 | 6896 | 6999 | 7540 | 7121 | 7662 | 7764 | 8306 |
| 440 | 441 | 442 | 443 | 444 | 445 | 446 | 447 |
| 7266 | 7807 | 7909 | 8450 | 8031 | 8572 | 8675 | 9216 |
| 448 | 449 | 450 | 451 | 452 | 453 | 454 | 455 |
| 5516 | 6058 | 6160 | 6701 | 6282 | 6823 | 6925 | 7467 |
| 456 | 457 | 458 | 459 | 460 | 461 | 462 | 463 |
| 6427 | 6968 | 7070 | 7611 | 7192 | 7733 | 7836 | 8377 |
| 464 | 465 | 466 | 467 | 468 | 469 | 470 | 471 |
| 6599 | 7140 | 7242 | 7784 | 7364 | 7905 | 8008 | 8549 |
| 472 | 473 | 474 | 475 | 476 | 477 | 478 | 479 |
| 7509 | 8050 | 8153 | 8694 | 8275 | 8816 | 8918 | 9459 |
| 480 | 481 | 482 | 483 | 484 | 485 | 486 | 487 |
| 6804 | 7345 | 7447 | 7989 | 7569 | 8110 | 8213 | 8754 |
| 488 | 489 | 490 | 491 | 492 | 493 | 494 | 495 |
| 7714 | 8255 | 8358 | 8899 | 8479 | 9021 | 9123 | 9664 |
| 496 | 497 | 498 | 499 | 500 | 501 | 502 | 503 |
| 7886 | 8427 | 8530 | 9071 | 8652 | 9193 | 9295 | 9836 |
| 504 | 505 | 506 | 507 | 508 | 509 | 510 | 511 |
| 8796 | 9338 | 9440 | 9981 | 9562 | 10103 | 10205 | 10747 |

A quantized reliability reference sequence obtained according to the foregoing formula is shown in Table 45:

TABLE 45

| 512 | 1024 |
|---|---|
| 2575 | 3062 |

It can be learned from Table 44 and Table 45 that, during storage of the quantized reliability sequence corresponding to the basic sequence, only $2^{l_s}=2^9=512$ values need to be stored; during storage of the values in the quantized reliability reference sequence, $l_{max}-l_s=11-9=2$ values need to be stored; and only a total of $512+2=514$ values need to be stored. Therefore, compared with a previous case in which 2048 values need to be stored (Table 31), storage space of $(2048-514)/2048=74.9\%$ can be saved, thereby greatly reducing storage overheads and improving storage efficiency.

(8) It is set that $l_s=10$, $N_s=1024$, and $PW_i$, $0 \le i < 1024$. A reliability sequence corresponding to a basic sequence can be obtained according to the foregoing formula, and after 14-bit quantization is performed on values in the reliability sequence, an obtained quantized reliability sequence corresponding to the basic sequence is shown in Table 46:

TABLE 46

| 0 | 1 | 2 | 3 | 4 | 5 | 6 | 7 |
|---|---|---|---|---|---|---|---|
| 0 | 541 | 644 | 1185 | 765 | 1307 | 1409 | 1950 |
| 8 | 9 | 10 | 11 | 12 | 13 | 14 | 15 |
| 910 | 1451 | 1554 | 2095 | 1676 | 2217 | 2319 | 2861 |
| 16 | 17 | 18 | 19 | 20 | 21 | 22 | 23 |
| 1082 | 1624 | 1726 | 2267 | 1848 | 2389 | 2492 | 3033 |
| 24 | 25 | 26 | 27 | 28 | 29 | 30 | 31 |
| 1993 | 2534 | 2636 | 3178 | 2758 | 3299 | 3402 | 3943 |
| 32 | 33 | 34 | 35 | 36 | 37 | 38 | 39 |
| 1287 | 1829 | 1931 | 2472 | 2053 | 2594 | 2696 | 3238 |
| 40 | 41 | 42 | 43 | 44 | 45 | 46 | 47 |
| 2198 | 2739 | 2841 | 3382 | 2963 | 3504 | 3607 | 4148 |
| 48 | 49 | 50 | 51 | 52 | 53 | 54 | 55 |
| 2370 | 2911 | 3013 | 3555 | 3135 | 3676 | 3779 | 4320 |
| 56 | 57 | 58 | 59 | 60 | 61 | 62 | 63 |
| 3280 | 3821 | 3924 | 4465 | 4045 | 4587 | 4689 | 5230 |
| 64 | 65 | 66 | 67 | 68 | 69 | 70 | 71 |
| 1531 | 2072 | 2175 | 2716 | 2296 | 2838 | 2940 | 3481 |
| 72 | 73 | 74 | 75 | 76 | 77 | 78 | 79 |
| 2441 | 2982 | 3085 | 3626 | 3207 | 3748 | 3850 | 4391 |

TABLE 46-continued

| 80 | 81 | 82 | 83 | 84 | 85 | 86 | 87 |
|---|---|---|---|---|---|---|---|
| 2613 | 3155 | 3257 | 3798 | 3379 | 3920 | 4022 | 4564 |
| 88 | 89 | 90 | 91 | 92 | 93 | 94 | 95 |
| 3524 | 4065 | 4167 | 4708 | 4289 | 4830 | 4933 | 5474 |
| 96 | 97 | 98 | 99 | 100 | 101 | 102 | 103 |
| 2818 | 3359 | 3462 | 4003 | 3584 | 4125 | 4227 | 4768 |
| 104 | 105 | 106 | 107 | 108 | 109 | 110 | 111 |
| 3728 | 4270 | 4372 | 4913 | 4494 | 5035 | 5137 | 5679 |
| 112 | 113 | 114 | 115 | 116 | 117 | 118 | 119 |
| 3901 | 4442 | 4544 | 5086 | 4666 | 5207 | 5310 | 5851 |
| 120 | 121 | 122 | 123 | 124 | 125 | 126 | 127 |
| 4811 | 5352 | 5455 | 5996 | 5576 | 6118 | 6220 | 6761 |
| 128 | 129 | 130 | 131 | 132 | 133 | 134 | 135 |
| 1821 | 2362 | 2464 | 3005 | 2586 | 3127 | 3230 | 3771 |
| 136 | 137 | 138 | 139 | 140 | 141 | 142 | 143 |
| 2731 | 3272 | 3374 | 3916 | 3496 | 4037 | 4140 | 4681 |
| 144 | 145 | 146 | 147 | 148 | 149 | 150 | 151 |
| 2903 | 3444 | 3547 | 4088 | 3668 | 4210 | 4312 | 4853 |
| 152 | 153 | 154 | 155 | 156 | 157 | 158 | 159 |
| 3813 | 4354 | 4457 | 4998 | 4579 | 5120 | 5222 | 5764 |
| 160 | 161 | 162 | 163 | 164 | 165 | 166 | 167 |
| 3108 | 3649 | 3751 | 4293 | 3873 | 4414 | 4517 | 5058 |
| 168 | 169 | 170 | 171 | 172 | 173 | 174 | 175 |
| 4018 | 4559 | 4662 | 5203 | 4783 | 5325 | 5427 | 5968 |
| 176 | 177 | 178 | 179 | 180 | 181 | 182 | 183 |
| 4190 | 4732 | 4834 | 5375 | 4956 | 5497 | 5599 | 6141 |
| 184 | 185 | 186 | 187 | 188 | 189 | 190 | 191 |
| 5101 | 5642 | 5744 | 6285 | 5866 | 6407 | 6510 | 7051 |
| 192 | 193 | 194 | 195 | 196 | 197 | 198 | 199 |
| 3351 | 3893 | 3995 | 4536 | 4117 | 4658 | 4760 | 5302 |
| 200 | 201 | 202 | 203 | 204 | 205 | 206 | 207 |
| 4262 | 4803 | 4905 | 5447 | 5027 | 5568 | 5671 | 6212 |
| 208 | 209 | 210 | 211 | 212 | 213 | 214 | 215 |
| 4434 | 4975 | 5078 | 5619 | 5199 | 5741 | 5843 | 6384 |
| 216 | 217 | 218 | 219 | 220 | 221 | 222 | 223 |
| 5344 | 5885 | 5988 | 6529 | 6110 | 6651 | 6753 | 7294 |
| 224 | 225 | 226 | 227 | 228 | 229 | 230 | 231 |
| 4639 | 5180 | 5282 | 5824 | 5404 | 5945 | 6048 | 6589 |
| 232 | 233 | 234 | 235 | 236 | 237 | 238 | 239 |
| 5549 | 6090 | 6193 | 6734 | 6314 | 6856 | 6958 | 7499 |

TABLE 46-continued

| | | | | | | | |
|---|---|---|---|---|---|---|---|
| 240 | 241 | 242 | 243 | 244 | 245 | 246 | 247 |
| 5721 | 6262 | 6365 | 6906 | 6487 | 7028 | 7130 | 7671 |
| 248 | 249 | 250 | 251 | 252 | 253 | 254 | 255 |
| 6631 | 7173 | 7275 | 7816 | 7397 | 7938 | 8040 | 8582 |
| 256 | 257 | 258 | 259 | 260 | 261 | 262 | 263 |
| 2165 | 2706 | 2809 | 3350 | 2930 | 3472 | 3574 | 4115 |
| 264 | 265 | 266 | 267 | 268 | 269 | 270 | 271 |
| 3075 | 3616 | 3719 | 4260 | 3841 | 4382 | 4484 | 5026 |
| 272 | 273 | 274 | 275 | 276 | 277 | 278 | 279 |
| 3247 | 3789 | 3891 | 4432 | 4013 | 4554 | 4657 | 5198 |
| 280 | 281 | 282 | 283 | 284 | 285 | 286 | 287 |
| 4158 | 4699 | 4801 | 5343 | 4923 | 5464 | 5567 | 6108 |
| 288 | 289 | 290 | 291 | 292 | 293 | 294 | 295 |
| 3452 | 3994 | 4096 | 4637 | 4218 | 4759 | 4861 | 5403 |
| 296 | 297 | 298 | 299 | 300 | 301 | 302 | 303 |
| 4363 | 4904 | 5006 | 5547 | 5128 | 5669 | 5772 | 6313 |
| 304 | 305 | 306 | 307 | 308 | 309 | 310 | 311 |
| 4535 | 5076 | 5178 | 5720 | 5300 | 5841 | 5944 | 6485 |
| 312 | 313 | 314 | 315 | 316 | 317 | 318 | 319 |
| 5445 | 5986 | 6089 | 6630 | 6210 | 6752 | 6854 | 7395 |
| 320 | 321 | 322 | 323 | 324 | 325 | 326 | 327 |
| 3696 | 4237 | 4339 | 4881 | 4461 | 5002 | 5105 | 5646 |
| 328 | 329 | 330 | 331 | 332 | 333 | 334 | 335 |
| 4606 | 5147 | 5250 | 5791 | 5372 | 5913 | 6015 | 6556 |
| 336 | 337 | 338 | 339 | 340 | 341 | 342 | 343 |
| 4778 | 5320 | 5422 | 5963 | 5544 | 6085 | 6187 | 6729 |
| 344 | 345 | 346 | 347 | 348 | 349 | 350 | 351 |
| 5689 | 6230 | 6332 | 6873 | 6454 | 6995 | 7098 | 7639 |
| 352 | 353 | 354 | 355 | 356 | 357 | 358 | 359 |
| 4983 | 5524 | 5627 | 6168 | 5749 | 6290 | 6392 | 6933 |
| 360 | 361 | 362 | 363 | 364 | 365 | 366 | 367 |
| 5893 | 6435 | 6537 | 7078 | 6659 | 7200 | 7302 | 7844 |
| 368 | 369 | 370 | 371 | 372 | 373 | 374 | 375 |
| 6066 | 6607 | 6709 | 7250 | 6831 | 7372 | 7475 | 8016 |
| 376 | 377 | 378 | 379 | 380 | 381 | 382 | 383 |
| 6976 | 7517 | 7620 | 8161 | 7741 | 8283 | 8385 | 8926 |
| 384 | 385 | 386 | 387 | 388 | 389 | 390 | 391 |
| 3985 | 4527 | 4629 | 5170 | 4751 | 5292 | 5395 | 5936 |
| 392 | 393 | 394 | 395 | 396 | 397 | 398 | 399 |
| 4896 | 5437 | 5539 | 6081 | 5661 | 6202 | 6305 | 6846 |

TABLE 46-continued

| | | | | | | | |
|---|---|---|---|---|---|---|---|
| 400 | 401 | 402 | 403 | 404 | 405 | 406 | 407 |
| 5068 | 5609 | 5712 | 6253 | 5833 | 6375 | 6477 | 7018 |
| 408 | 409 | 410 | 411 | 412 | 413 | 414 | 415 |
| 5978 | 6519 | 6622 | 7163 | 6744 | 7285 | 7387 | 7929 |
| 416 | 417 | 418 | 419 | 420 | 421 | 422 | 423 |
| 5273 | 5814 | 5916 | 6458 | 6038 | 6579 | 6682 | 7223 |
| 424 | 425 | 426 | 427 | 428 | 429 | 430 | 431 |
| 6183 | 6724 | 6827 | 7368 | 6948 | 7490 | 7592 | 8133 |
| 432 | 433 | 434 | 435 | 436 | 437 | 438 | 439 |
| 6355 | 6896 | 6999 | 7540 | 7121 | 7662 | 7764 | 8306 |
| 440 | 441 | 442 | 443 | 444 | 445 | 446 | 447 |
| 7266 | 7807 | 7909 | 8450 | 8031 | 8572 | 8675 | 9216 |
| 448 | 449 | 450 | 451 | 452 | 453 | 454 | 455 |
| 5516 | 6058 | 6160 | 6701 | 6282 | 6823 | 6925 | 7467 |
| 456 | 457 | 458 | 459 | 460 | 461 | 462 | 463 |
| 6427 | 6968 | 7070 | 7611 | 7192 | 7733 | 7836 | 8377 |
| 464 | 465 | 466 | 467 | 468 | 469 | 470 | 471 |
| 6599 | 7140 | 7242 | 7784 | 7364 | 7905 | 8008 | 8549 |
| 472 | 473 | 474 | 475 | 476 | 477 | 478 | 479 |
| 7509 | 8050 | 8153 | 8694 | 8275 | 8816 | 8918 | 9459 |
| 480 | 481 | 482 | 483 | 484 | 485 | 486 | 487 |
| 6804 | 7345 | 7447 | 7989 | 7569 | 8110 | 8213 | 8754 |
| 488 | 489 | 490 | 491 | 492 | 493 | 494 | 495 |
| 7714 | 8255 | 8358 | 8899 | 8479 | 9021 | 9123 | 9664 |
| 496 | 497 | 498 | 499 | 500 | 501 | 502 | 503 |
| 7886 | 8427 | 8530 | 9071 | 8652 | 9193 | 9295 | 9836 |
| 504 | 505 | 506 | 507 | 508 | 509 | 510 | 511 |
| 8796 | 9338 | 9440 | 9981 | 9562 | 10103 | 10205 | 10747 |
| 512 | 513 | 514 | 515 | 516 | 517 | 518 | 519 |
| 2575 | 3116 | 3218 | 3759 | 3340 | 3881 | 3984 | 4525 |
| 520 | 521 | 522 | 523 | 524 | 525 | 526 | 527 |
| 3485 | 4026 | 4128 | 4670 | 4250 | 4792 | 4894 | 5435 |
| 528 | 529 | 530 | 531 | 532 | 533 | 534 | 535 |
| 3657 | 4198 | 4301 | 4842 | 4423 | 4964 | 5066 | 5607 |
| 536 | 537 | 538 | 539 | 540 | 541 | 542 | 543 |
| 4567 | 5109 | 5211 | 5752 | 5333 | 5874 | 5976 | 6518 |
| 544 | 545 | 546 | 547 | 548 | 549 | 550 | 551 |
| 3862 | 4403 | 4506 | 5047 | 4627 | 5169 | 5271 | 5812 |
| 552 | 553 | 554 | 555 | 556 | 557 | 558 | 559 |
| 4772 | 5313 | 5416 | 5957 | 5538 | 6079 | 6181 | 6722 |

TABLE 46-continued

| | | | | | | | |
|---|---|---|---|---|---|---|---|
| 560 | 561 | 562 | 563 | 564 | 565 | 566 | 567 |
| 4944 | 5486 | 5588 | 6129 | 5710 | 6251 | 6353 | 6895 |
| 568 | 569 | 570 | 571 | 572 | 573 | 574 | 575 |
| 5855 | 6396 | 6498 | 7040 | 6620 | 7161 | 7264 | 7805 |
| 576 | 577 | 578 | 579 | 580 | 581 | 582 | 583 |
| 4105 | 4647 | 4749 | 5290 | 4871 | 5412 | 5515 | 6056 |
| 584 | 585 | 586 | 587 | 588 | 589 | 590 | 591 |
| 5016 | 5557 | 5659 | 6201 | 5781 | 6322 | 6425 | 6966 |
| 592 | 593 | 594 | 595 | 596 | 597 | 598 | 599 |
| 5188 | 5729 | 5832 | 6373 | 5953 | 6495 | 6597 | 7138 |
| 600 | 601 | 602 | 603 | 604 | 605 | 606 | 607 |
| 6098 | 6639 | 6742 | 7283 | 6864 | 7405 | 7507 | 8049 |
| 608 | 609 | 610 | 611 | 612 | 613 | 614 | 615 |
| 5393 | 5934 | 6036 | 6578 | 6158 | 6699 | 6802 | 7343 |
| 616 | 617 | 618 | 619 | 620 | 621 | 622 | 623 |
| 6303 | 6844 | 6947 | 7488 | 7068 | 7610 | 7712 | 8253 |
| 624 | 625 | 626 | 627 | 628 | 629 | 630 | 631 |
| 6475 | 7016 | 7119 | 7660 | 7241 | 7782 | 7884 | 8426 |
| 632 | 633 | 634 | 635 | 636 | 637 | 638 | 639 |
| 7385 | 7927 | 8029 | 8570 | 8151 | 8692 | 8795 | 9336 |
| 640 | 641 | 642 | 643 | 644 | 645 | 646 | 647 |
| 4395 | 4936 | 5039 | 5580 | 5161 | 5702 | 5804 | 6345 |
| 648 | 649 | 650 | 651 | 652 | 653 | 654 | 655 |
| 5305 | 5847 | 5949 | 6490 | 6071 | 6612 | 6714 | 7256 |
| 656 | 657 | 658 | 659 | 660 | 661 | 662 | 663 |
| 5478 | 6019 | 6121 | 6662 | 6243 | 6784 | 6887 | 7428 |
| 664 | 665 | 666 | 667 | 668 | 669 | 670 | 671 |
| 6388 | 6929 | 7031 | 7573 | 7153 | 7695 | 7797 | 8338 |
| 672 | 673 | 674 | 675 | 676 | 677 | 678 | 679 |
| 5682 | 6224 | 6326 | 6867 | 6448 | 6989 | 7091 | 7633 |
| 680 | 681 | 682 | 683 | 684 | 685 | 686 | 687 |
| 6593 | 7134 | 7236 | 7778 | 7358 | 7899 | 8002 | 8543 |
| 688 | 689 | 690 | 691 | 692 | 693 | 694 | 695 |
| 6765 | 7306 | 7409 | 7950 | 7530 | 8072 | 8174 | 8715 |
| 696 | 697 | 698 | 699 | 700 | 701 | 702 | 703 |
| 7675 | 8216 | 8319 | 8860 | 8441 | 8982 | 9084 | 9625 |
| 704 | 705 | 706 | 707 | 708 | 709 | 710 | 711 |
| 5926 | 6467 | 6570 | 7111 | 6691 | 7233 | 7335 | 7876 |
| 712 | 713 | 714 | 715 | 716 | 717 | 718 | 719 |
| 6836 | 7377 | 7480 | 8021 | 7602 | 8143 | 8245 | 8787 |

TABLE 46-continued

| 720 | 721 | 722 | 723 | 724 | 725 | 726 | 727 |
|---|---|---|---|---|---|---|---|
| 7008 | 7550 | 7652 | 8193 | 7774 | 8315 | 8418 | 8959 |
| 728 | 729 | 730 | 731 | 732 | 733 | 734 | 735 |
| 7919 | 8460 | 8562 | 9104 | 8684 | 9225 | 9328 | 9869 |
| 736 | 737 | 738 | 739 | 740 | 741 | 742 | 743 |
| 7213 | 7754 | 7857 | 8398 | 7979 | 8520 | 8622 | 9164 |
| 744 | 745 | 746 | 747 | 748 | 749 | 750 | 751 |
| 8124 | 8665 | 8767 | 9308 | 8889 | 9430 | 9533 | 10074 |
| 752 | 753 | 754 | 755 | 756 | 757 | 758 | 759 |
| 8296 | 8837 | 8939 | 9481 | 9061 | 9602 | 9705 | 10246 |
| 760 | 761 | 762 | 763 | 764 | 765 | 766 | 767 |
| 9206 | 9747 | 9850 | 10391 | 9971 | 10513 | 10615 | 11156 |
| 768 | 769 | 770 | 771 | 772 | 773 | 774 | 775 |
| 4740 | 5281 | 5383 | 5924 | 5505 | 6046 | 6149 | 6690 |
| 776 | 777 | 778 | 779 | 780 | 781 | 782 | 783 |
| 5650 | 6191 | 6293 | 6835 | 6415 | 6956 | 7059 | 7600 |
| 784 | 785 | 786 | 787 | 788 | 789 | 790 | 791 |
| 5822 | 6363 | 6466 | 7007 | 6587 | 7129 | 7231 | 7772 |
| 792 | 793 | 794 | 795 | 796 | 797 | 798 | 799 |
| 6732 | 7274 | 7376 | 7917 | 7498 | 8039 | 8141 | 8683 |
| 800 | 801 | 802 | 803 | 804 | 805 | 806 | 807 |
| 6027 | 6568 | 6670 | 7212 | 6792 | 7334 | 7436 | 7977 |
| 808 | 809 | 810 | 811 | 812 | 813 | 814 | 815 |
| 6937 | 7478 | 7581 | 8122 | 7703 | 8244 | 8346 | 8887 |
| 816 | 817 | 818 | 819 | 820 | 821 | 822 | 823 |
| 7109 | 7651 | 7753 | 8294 | 7875 | 8416 | 8518 | 9060 |
| 824 | 825 | 826 | 827 | 828 | 829 | 830 | 831 |
| 8020 | 8561 | 8663 | 9204 | 8785 | 9326 | 9429 | 9970 |
| 832 | 833 | 834 | 835 | 836 | 837 | 838 | 839 |
| 6270 | 6812 | 6914 | 7455 | 7036 | 7577 | 7679 | 8221 |
| 840 | 841 | 842 | 843 | 844 | 845 | 846 | 847 |
| 7181 | 7722 | 7824 | 8366 | 7946 | 8487 | 8590 | 9131 |
| 848 | 849 | 850 | 851 | 852 | 853 | 854 | 855 |
| 7353 | 7894 | 7997 | 8538 | 8118 | 8660 | 8762 | 9303 |
| 856 | 857 | 858 | 859 | 860 | 861 | 862 | 863 |
| 8263 | 8804 | 8907 | 9448 | 9029 | 9570 | 9672 | 10213 |
| 864 | 865 | 866 | 867 | 868 | 869 | 870 | 871 |
| 7558 | 8099 | 8201 | 8743 | 8323 | 8864 | 8967 | 9508 |
| 872 | 873 | 874 | 875 | 876 | 877 | 878 | 879 |
| 8468 | 9009 | 9112 | 9653 | 9233 | 9775 | 9877 | 10418 |

TABLE 46-continued

| | | | | | | | |
|---|---|---|---|---|---|---|---|
| 880 | 881 | 882 | 883 | 884 | 885 | 886 | 887 |
| 8640 | 9181 | 9284 | 9825 | 9406 | 9947 | 10049 | 10591 |
| 888 | 889 | 890 | 891 | 892 | 893 | 894 | 895 |
| 9550 | 10092 | 10194 | 10735 | 10316 | 10857 | 10960 | 11501 |
| 896 | 897 | 898 | 899 | 900 | 901 | 902 | 903 |
| 6560 | 7101 | 7204 | 7745 | 7325 | 7867 | 7969 | 8510 |
| 904 | 905 | 906 | 907 | 908 | 909 | 910 | 911 |
| 7470 | 8012 | 8114 | 8655 | 8236 | 8777 | 8879 | 9421 |
| 912 | 913 | 914 | 915 | 916 | 917 | 918 | 919 |
| 7643 | 8184 | 8286 | 8827 | 8408 | 8949 | 9052 | 9593 |
| 920 | 921 | 922 | 923 | 924 | 925 | 926 | 927 |
| 8553 | 9094 | 9196 | 9738 | 9318 | 9859 | 9962 | 10503 |
| 928 | 929 | 930 | 931 | 932 | 933 | 934 | 935 |
| 7847 | 8389 | 8491 | 9032 | 8613 | 9154 | 9256 | 9798 |
| 936 | 937 | 938 | 939 | 940 | 941 | 942 | 943 |
| 8758 | 9299 | 9401 | 9943 | 9523 | 10064 | 10167 | 10708 |
| 944 | 945 | 946 | 947 | 948 | 949 | 950 | 951 |
| 8930 | 9471 | 9573 | 10115 | 9695 | 10237 | 10339 | 10880 |
| 952 | 953 | 954 | 955 | 956 | 957 | 958 | 959 |
| 9840 | 10381 | 10484 | 11025 | 10606 | 11147 | 11249 | 11790 |
| 960 | 961 | 962 | 963 | 964 | 965 | 966 | 967 |
| 8091 | 8632 | 8735 | 9276 | 8856 | 9398 | 9500 | 10041 |
| 968 | 969 | 970 | 971 | 972 | 973 | 974 | 975 |
| 9001 | 9542 | 9645 | 10186 | 9767 | 10308 | 10410 | 10952 |
| 976 | 977 | 978 | 979 | 980 | 981 | 982 | 983 |
| 9173 | 9715 | 9817 | 10358 | 9939 | 10480 | 10582 | 11124 |
| 984 | 985 | 986 | 987 | 988 | 989 | 990 | 991 |
| 10084 | 10625 | 10727 | 11269 | 10849 | 11390 | 11493 | 12034 |
| 992 | 993 | 994 | 995 | 996 | 997 | 998 | 999 |
| 9378 | 9919 | 10022 | 10563 | 10144 | 10685 | 10787 | 11329 |
| 1000 | 1001 | 1002 | 1003 | 1004 | 1005 | 1006 | 1007 |
| 10288 | 10830 | 10932 | 11473 | 11054 | 11595 | 11698 | 12239 |
| 1008 | 1009 | 1010 | 1011 | 1012 | 1013 | 1014 | 1015 |
| 10461 | 11002 | 11104 | 11646 | 11226 | 11767 | 11870 | 12411 |
| 1016 | 1017 | 1018 | 1019 | 1020 | 1021 | 1022 | 1023 |
| 11371 | 11912 | 12015 | 12556 | 12136 | 12678 | 12780 | 13321 |

A quantized reliability reference sequence obtained according to the foregoing formula is shown in Table 47:

TABLE 47

| 1024 |
|------|
| 3062 |

It can be learned from Table 46 and Table 47 that, during storage of the quantized reliability sequence corresponding to the basic sequence, $2^{l_s}=2^{10}=1024$ values need to be stored; during storage of the values in the quantized reliability reference sequence, only $l_{max}-l_s=11-10=1$ value needs to be stored; and only a total of 1024+1=1025 values need to be stored. Therefore, compared with a previous case in which 2048 values need to be stored (Table 31), storage space of (2048−1025)/2048=49.9% can be saved, thereby greatly reducing storage overheads and improving storage efficiency.

It should be noted that, different reliability sequences corresponding to basic sequences may be obtained by setting values of β. In the foregoing embodiment, $\beta=2^{0.25}$ is used as an example. In another implementation, it may be set that $\beta=2^{0.5}$, $\beta=2^{0.75}$, and the like.

In addition, based on different requirements, different $l_s$ may be further selected, a value range thereof is $0 \le l_s < l_{max}$. A length of a reliability sequence corresponding to a basic sequence and corresponding to i and a length of a reliability reference sequence corresponding to $l_s$ are respectively $2^{l_s}$ and $l_{max}-l_s$.

All reliability sequences corresponding to mother code sequences with different lengths of $N_{max}$, such as $N_{max}$=258, 512, 1024, 2048, 4096, may be stored by using the method provided in the embodiments of this application.

Based on Embodiment 1, transformation calculation is performed, by using the PW formula, on the reliability sequence with the length of $N^{max}=2^{l_{max}}$ and corresponding to the mother code sequence to obtain the reliability sequence with the length of $N_s=2^{l_s}$ and corresponding to the basic sequence, and this embodiment provides a corresponding reading manner. The following provides description separately by using Embodiment 2 to Embodiment 4.

Embodiment 2

During construction of a coding sequence, for example, a polar code, a coding length is M, and an information length is $K_{info}$. During construction of the polar code by reading the reliability sequence $N_s$ provided in Embodiment 1 and corresponding to the basic sequence, there are the two following cases:

(1) When $N \le N_s$, N elements are obtained from the reliability sequence corresponding to the basic sequence, where values of the N elements are greater than those of the $N_s-N$ elements in the $N_s$ elements, and bit positions that are corresponding to the N elements and that are in the basic sequence form the coding sequence.

(2) When $N > N_s$, the reliability sequence corresponding to the basic sequence is extended based on an element in the reliability reference sequence to form a reliability sequence with a length of N, where bit positions that are corresponding to the reliability sequence with the length of N and that are in the mother code sequence form the coding sequence.

A code length N of the reliability sequence is determined based on the coding length M and the information length $K_{info}$. In a possible implementation, $N=2^{\lceil \log_2 M \rceil}$, where M is the coding length, and $\lceil \cdot \rceil$ is a rounding up operation.

Figure 3:
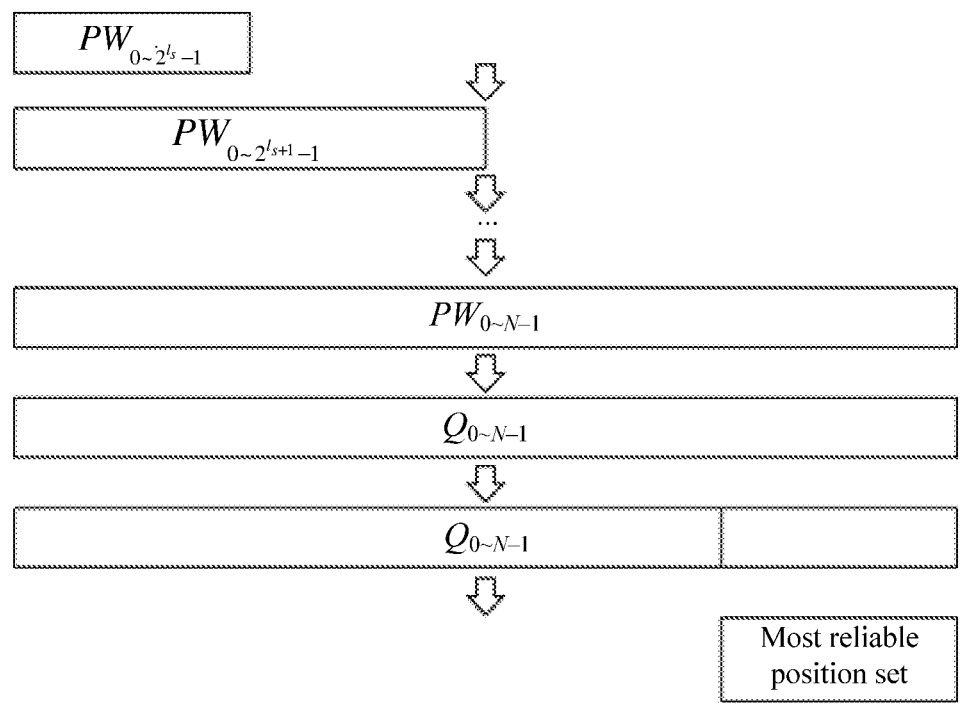
FIG. 3 is a schematic diagram of Embodiment 2 of a method for constructing a coding sequence according to this application.
Figure 4:
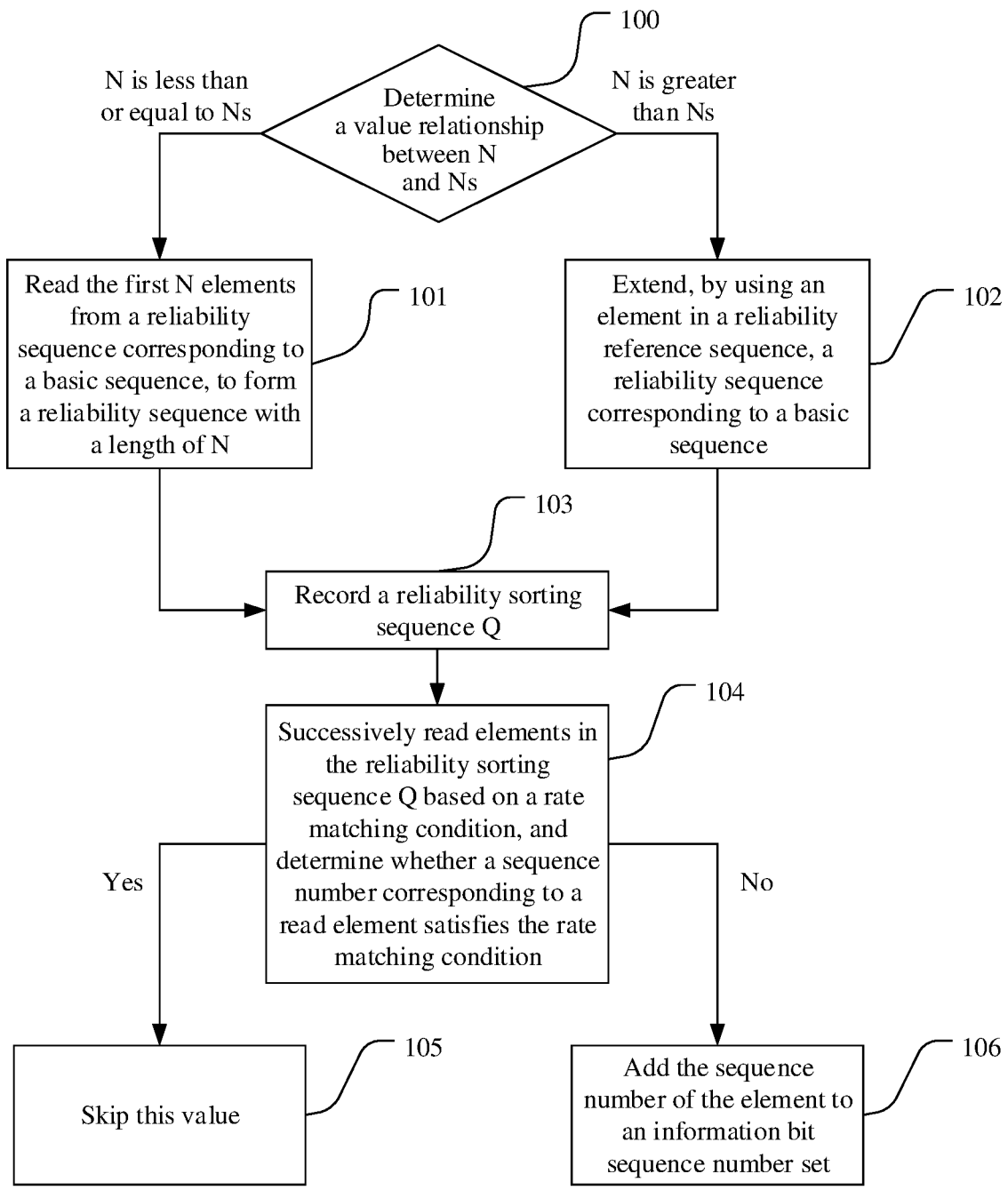
FIG. 4 is another schematic diagram of Embodiment 2 of a method for constructing a coding sequence according to this application.
Figure 5:
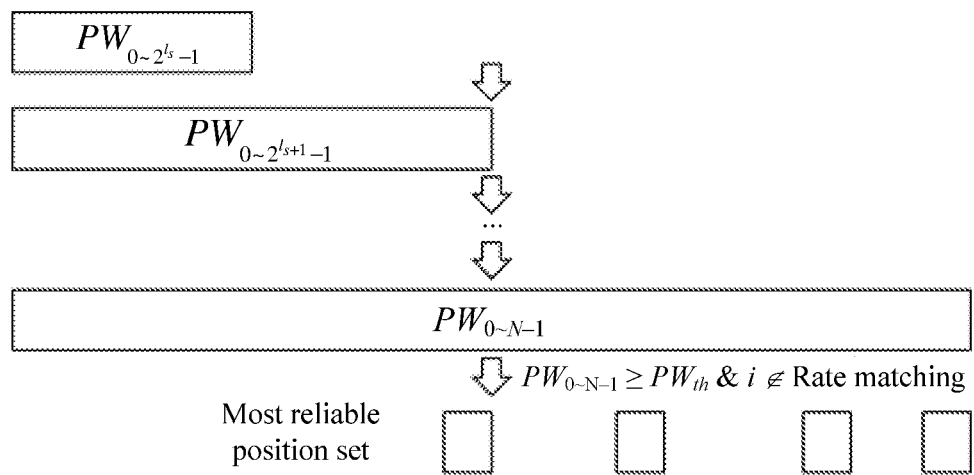
FIG. 5 is a schematic diagram of Embodiment 3 of a method for constructing a coding sequence according to this application.

FIG. 3 is a schematic diagram of reading a reliability sequence according to this embodiment, and a reading process is shown in FIG. 4, and includes the following operations:

Operation 100. Determine a value relationship between N and $N_s$; when $N \le N_s$, proceed to operation 101; or when $N > N_s$, proceed to operation 102.

Operation 101. When $N \le N_s$, read the first N elements from the reliability sequence with the length of $N_s$ and corresponding to the basic sequence, to form a reliability sequence with a length of N, where values of the N elements are greater than those of the $N_s-N$ elements in the $N_s$ elements; and form a coding sequence by using bit positions that are corresponding to the N elements and that are in the basic sequence.

When $N=N_s$, the first N elements in the reliability sequence corresponding to the basic sequence are all elements in the reliability sequence with the length of N.

Operation 102. When $N > N_s$, extend, by using an element in a reliability reference sequence $\{PW_i, i=2^{l_s}, 2^{l_s+1}, \ldots, 2^{l_{max}-1}\}$, a reliability sequence $\{PW_i, 0 \le i \le 2^{l_s}\}$ with a length of $N_s$ and corresponding to the basic sequence.

During each extension, $\{PW_i, 0 \le i \le 2^{l_s}\}$ is extended to $\{PW_i, 0 \le i \le 2^{l_s+1}\}$, where $$PW_{i+2^{l_1}} = PW_i + (\beta)^{l_s}, i = 0, 1, \ldots 2^{l_1} - 1,$$

the foregoing operation is repeated, until a length of an extended reliability sequence is N.

Operation 103. Record a reliability sorting sequence Q, where the reliability sorting sequence Q is obtained through sorting performed on elements in the reliability sequence with the length of N based on reliability values.

Operation 104. Successively read the elements from the reliability sorting sequence Q from back to front (from front to back) according to a rate matching condition.

Operation 105. If a sequence number corresponding to a read element satisfies the rate matching condition, skip the element.

Otherwise, in operation 106, the sequence number of the element is added to an information bit sequence number set A.

Operation 105 and operation 106 are circulated until a set size of read sequence numbers is K.

In this case, the information bit sequence number set A is a most reliable sequence number set, and its complementary set $A^c$ (relative to a set $\{0, 1, \ldots, N-1\}$) is a frozen-bit sequence number set.

When the method for constructing a polar code by reading a reliability sorting sequence in Embodiment 2 is implemented, storage overheads are small, and different rate matching manners can be flexibly adapted.

Embodiment 3

In Embodiment 3, during polar code construction based on the reliability sequence N provided in Embodiment 1 and corresponding to the basic sequence, a threshold $PW_{th}$ is stored in advance for a coding length M, an information length K, and a rate matching manner of each polar code that may appear in a system. The threshold may be stored in a form of a threshold table. The threshold indicates that reliability of a sub-channel is greater than or equal to (or greater than) the threshold and that a sequence number of the sub-channel does not satisfy a rate matching condition that a sub-channel sequence number set size is K. $K=K_{info}+K_{check}$, where $K_{info}$ is a value of an information length, and $K_{check}$ is a value of a length of a CRC bit and/or a dynamic check bit.

As shown in the schematic diagram 4 and a flowchart 5, operation 200 to operation 202 in Embodiment 3 are the same as operation 100 to operation 102 in Embodiment 1. Operation 200 to operation 202 are as follows: When $N \leq N_s$, read N elements from the reliability sequence with the length of $N_s$ and corresponding to the basic sequence, to form a reliability sequence with a length of N, where values of the N elements are greater than those of the $N_s-N$ elements in the $N_s$ elements; and form a coding sequence by using bit positions that are corresponding to the N elements and that are in the basic sequence; and when $N > N_s$, extend, by using an element in a reliability reference sequence $\{PW_i, i=2^{l_s}, 2^{l_s+1}, \ldots, 2^{l_{max}-1}\}$, a reliability sequence $\{PW_i, 0 \leq i \leq 2^{l_s}\}$ with a length of $N_s$ and corresponding to the basic sequence until a length of an extended reliability sequence is N, where the reliability sequence with the length of N is a basis for constructing a coding sequence; and form a coding sequence by using bit positions that are corresponding to N elements in the reliability sequence and that are in the basic sequence.

Operation 203. Search for a threshold of a polar code that needs to be constructed.

Then, both each element $PW_i$ of the reliability sequence with the length of N and a sequence number thereof are compared with the threshold $PW_{th}$ based on rate matching and the reliability sequence with the length of N.

In operation 204, it is determined whether a value of $PW_i$ of the reliability sequence with the length of N is greater than or equal to (or greater than) the threshold $PW_{th}$.

Operation 205. Determine whether a sequence number i corresponding to $PW_i$ satisfies a rate matching condition.

Operation 206. Add all elements that satisfy operation 204 but do not satisfy operation 205 to an information bit sequence number set A.

Operation 205 and operation 206 are circulated until a set size of read sequence numbers is K.

In this case, the information bit sequence number set A is a most reliable sequence number set, and its complementary set $A^c$ (relative to a set $\{0, 1, \ldots, N-1\}$) is a frozen-bit sequence number set.

During reading the reliability sequence corresponding to the basic sequence in Embodiment 3, N reliability values obtained after extension may be simultaneously compared with the threshold, a comparison process supports parallel processing, and has high processing efficiency, thereby improving efficiency of constructing a polar code.

Embodiment 4

In Embodiment 4, during polar code construction based on the reliability sequence $N_s$ provided in Embodiment 1 and corresponding to the basic sequence, a threshold $PW_{th}$ is stored in advance for a coding length M, an information length K, and a rate matching manner of each polar code that may appear in a system. The threshold may be stored in a form of a threshold table. The threshold indicates that reliability of a sub-channel is greater than or equal to (or greater than) the threshold and that a sequence number of the sub-channel does not satisfy a rate matching condition that a sub-channel sequence number set size is K.

Referring to a schematic diagram 6 and a flowchart 7 for reading a reliability sequence, a method in Embodiment 4 includes the following operations:

Operation 300. Determine a value relationship between N and $N_s$; when $N \leq N_s$, proceed to operation 301; or when $N > N_s$, proceed to operation 302.

Operation 301. When $N \leq N_s$, obtain N elements from the reliability sequence corresponding to the basic sequence, where values of the N elements are greater than those of the $N_s-N$ elements in the $N_s$ elements; and form a coding sequence by using bit positions that are corresponding to the N elements and that are in the basic sequence, where when $N=N_s$, the first N elements in the reliability sequence are all elements in the reliability sequence.

Operation 302. Obtain, based on $N_{seg}$ times, N elements from the reliability sequence corresponding to the basic sequence, and form a coding sequence by using bit positions that are corresponding to the N elements and that are in a mother code sequence, where $N_{seg}=N/N_s$.

Operation 303. Search for a threshold $PW_{th}$ of a to-be-constructed polar code.

Operation 304. During the $x^{th}$ time of reading an information bit sequence number set (a binary value of x is indicated as $B_{l_z-1} B_{l_z-2} \ldots B_0$, and $l_x = \log_2 \lceil M/N_{short} \rceil$), calculate $PW_{th,x-1}$, where $$PW_{th,x-1} = PW_{th} - \sum_{n=0}^{l_x-1} B_n PW_{2^{l_1}+n},$$

and $$PW_{2^{l_1}+n}$$

is read from a reliability n=0 reference sequence.

Then, both each element $PW_i$ of the reliability sequence corresponding to the basic sequence and a sequence number thereof are compared with the threshold $PW_{th,x-1}$ based on a rate matching condition and the reliability sequence with the length of $N_s$.

Figure 6:
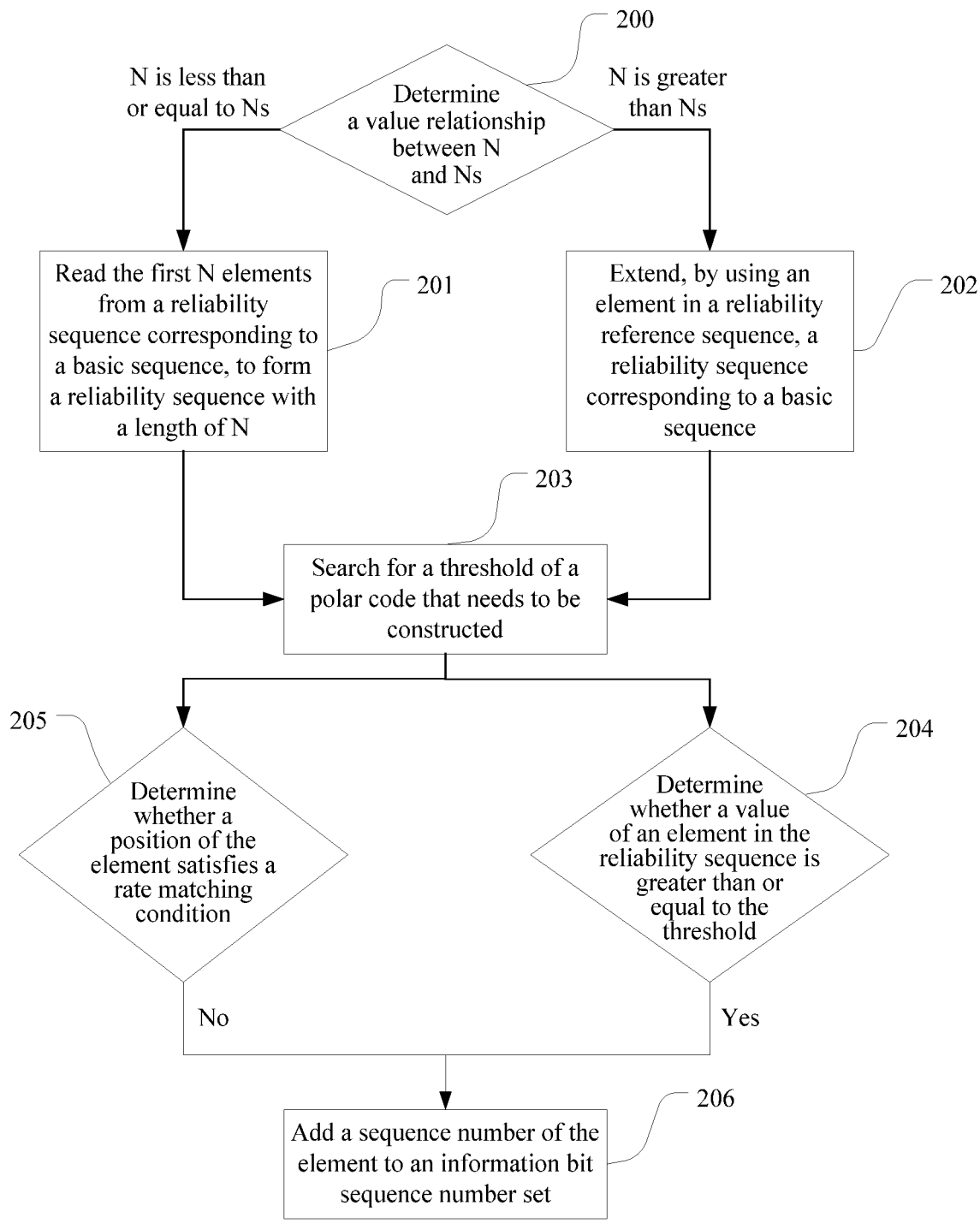
FIG. 6 is another schematic diagram of Embodiment 3 of a method for constructing a coding sequence according to this application.
Figure 7:
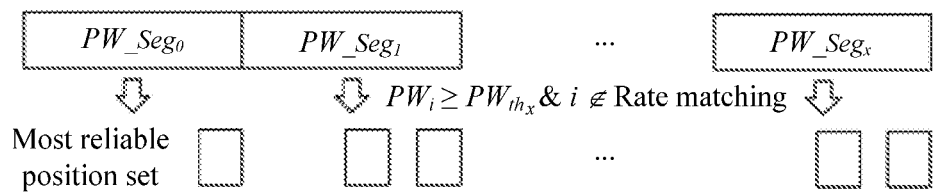
FIG. 7 is a schematic diagram of Embodiment 4 of a method for constructing a coding sequence according to this application.

In operation 305, it is determined whether a value of $PW_i$ of the reliability sequence corresponding to the basic sequence is greater than or equal to (or greater than) the threshold $PW_{th,x-1}$. It should be noted that, during the $x+1^{th}$ time of reading, both each element $PW_i$ of the reliability sequence corresponding to the basic sequence and a sequence number thereof are compared with the threshold $PW_{th,x}$ based on the rate matching condition and the reliability sequence with the length of $N_s$ (as shown in FIG. 6).

Operation 306. Determine whether an extension sequence number $i+(x-1)gN_s$ corresponding to a sequence number i of $PW_i$ satisfies a rate matching condition.

Operation 307. Add all sequence numbers $i+(x-1)gN_s$, of elements, that satisfy operation 305 but do not satisfy operation 306 to the information bit sequence number set A.

Operation 305 to operation 307 are circulated until a set size of read sequence numbers is K.

In this case, the information bit sequence number set A is a most reliable sequence number set, and its complementary set $A^c$ (relative to a set $\{0, 1, \ldots, N-1\}$) is a frozen-bit sequence number set.

In another implementation process, a frozen-bit sequence number set $A^c$ is read first, and then its complementary set is selected to obtain an information bit sequence number set A.

During implementation of the method for constructing a polar code by reading a reliability sorting sequence provided in Embodiment 4, extension does not need to be performed on a stored short reliability sequence, segmentation and parallel reading of the short reliability sequence are supported (all segments can be compared with a threshold). Therefore, a reading delay is relatively small, thereby improving efficiency of constructing a polar code.

According to the method for constructing a polar code provided in the embodiments of this application, some transformations are performed on a maximum-mother-code-length reliability sequence with a maximum mother code length of $N_{max}$, and the maximum-mother-code-length reliability sequence is indicated by a reliability sequence and a reliability reference sequence. Then, a polar code is constructed based on the stored reliability sequence and reliability reference sequence. The reliability sequence is a subset of the maximum-mother-code-length reliability sequence, and an element in the reliability reference sequence indicates an offset between the reliability sequence and the maximum-mother-code-length reliability sequence. During storage, only the reliability sequence and the reliability reference sequence are stored. Because a sum of a length of the reliability sequence and a length of the reliability reference sequence is far less than a length of the original reliability sequence, storage overheads can be reduced, and the maximum-mother-code-length reliability sequence can also be indicated.

In the foregoing embodiments provided in this application, each solution for constructing a polar code provided in the embodiments of this application is described from a perspective of storing a reliability sequence, reading a reliability sequence, and obtaining an information bit sequence number set. It can be understood that, the foregoing method may be implemented in each network element. To implement the foregoing functions, each network element such as a terminal, a base station, or a control node includes a corresponding hardware structure and/or software module for performing each function. A person skilled in the art should easily be aware that, in combination with the examples described in the embodiments disclosed in this specification, units and algorithms operations may be implemented by hardware or a combination of hardware and computer software in this application. Whether a function is implemented by hardware or in a manner of driving hardware by a computer software depends on a particular application and a design constraint of the technical solution. A person skilled in the art may use different methods to implement the described functions for each particular application, but it should not be considered that the implementation goes beyond the scope of this application.

Figure 9:
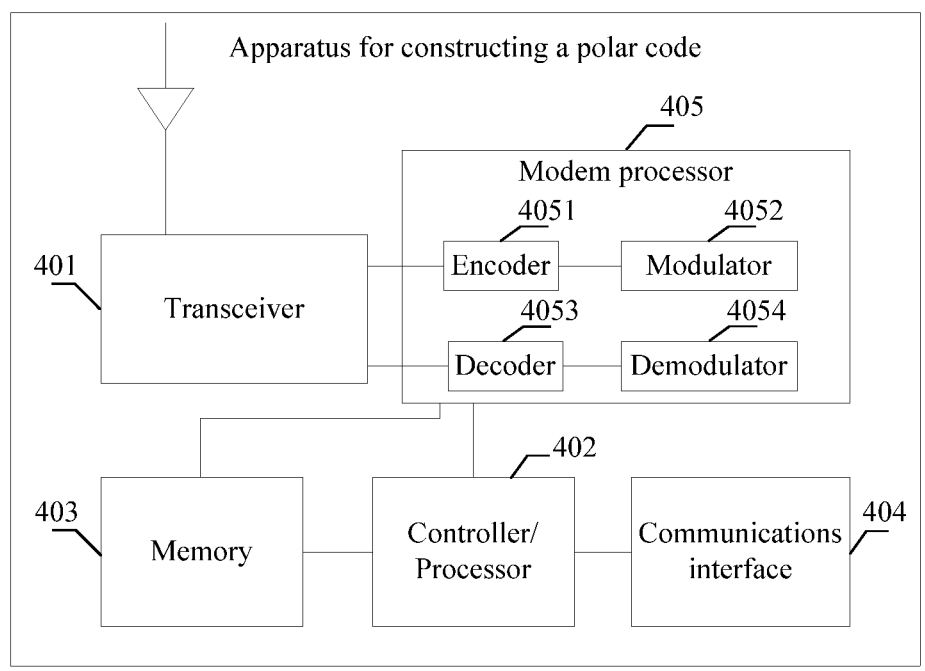
FIG. 9 is a schematic diagram of an apparatus for constructing a coding sequence according to this application.

As shown in FIG. 9, in an implementation, an apparatus for constructing a coding sequence provided in this application includes a memory 403 and a controller/processor 402.

The memory 403 stores a reliability sequence corresponding to a basic sequence, where a length of the reliability sequence corresponding to the basic sequence is less than or equal to a length of a reliability sequence corresponding to a mother code sequence; the length of the reliability sequence corresponding to the mother code sequence is $N_{max}=2^{l_{max}}$; and the length of the reliability sequence corresponding to the basic sequence is $N_s 2^{l_s}$, where $0 \leq l_s < l_{max}$. The memory 403 is further configured to store a reliability reference sequence, where the reliability reference sequence includes at least one element remaining after the reliability sequence corresponding to the basic sequence is excluded from the reliability sequence corresponding to the mother code sequence; and a length of the reliability reference sequence is $l_{max} - l_s$.

The reliability sequence corresponding to the basic sequence and the reliability reference sequence are used for constructing a coding sequence, for example, a polar code sequence.

The controller/processor 402 is configured to construct a coding sequence such as a polar code sequence by using the reliability sequence and the reliability reference sequence that are stored in the memory 403.

In an implementation, the reliability sequence corresponding to the basic sequence is $\{PW_i, 0 \leq i \leq 2^{l_s}\}$, where $PW_i = \sum_{j=0}^{n-1} B_j(\beta)^j$, and $(i)_{dec} \overset{\Delta}{=} (B_{n-1} B_{n-2} \ldots B_0)_{bin}$. The reliability reference sequence is $\{PW_i, i=2^{l_s}, 2^{l_s+1}, \ldots, 2^{l_{max}-1}\}$ or $(\beta)^{l_s}, (\beta)^{l_s+1}, \ldots, (\beta)^{l_{max}-1}$.

When $l_{max} \in [7, 8, 9, 10, 11, 12]$, a value range of the length of the reliability sequence corresponding to the mother code sequence is $N_{max}=2^{l_{max}} \in [128, 512, 1024, 2048, 4096]$.

$l_s \in [1, 2, 3, 4, 5, 6]$, and a value range of the length of the reliability sequence corresponding to the basic sequence is $N_s = 2^{l_s} \in [1, 4, 8, 16, 32, 64]$.

For mother code sequences with different lengths of $N^{max}=2^{l_{max}}$, a manner for generating reliability sequences and reliability reference sequences corresponding to the mother code sequences, refer to description in the foregoing method Embodiment 1, and details are not repeated herein.

In addition, the controller/processor 402 is further configured to: quantize the reliability sequence corresponding to the basic sequence to obtain the reliability quantization sequence, and quantize the reliability reference sequence to obtain the reliability quantization reference sequence.

The memory 401 is further configured to store the reliability quantization sequence and the reliability quantization reference sequence.

A function of the foregoing controller/processor 402 may be implemented by a circuit or by general purpose hardware by executing software code. When the function of the foregoing controller/processor 402 may be implemented by general purpose hardware by executing software code, the memory 403 is further configured to store program code that can be executed by the controller/processor 402. When running the program code stored in the memory 403, the controller/processor 402 performs the foregoing function.

In an implementation, the controller/processor 402 is configured to: when $N \leq N_s$, obtain N elements from the reliability sequence corresponding to the basic sequence, where values of the N elements are greater than those of the $N_s - N$ elements in the $N_s$ elements; and form a coding sequence by using bit positions that are corresponding to the N elements and that are in the basic sequence.

The controller/processor 402 is further configured to extend, based on an element in the reliability reference sequence, the reliability sequence corresponding to the basic sequence, to form a reliability sequence with a length of N; and form a coding sequence by using bit positions that are corresponding to the reliability sequence with the length of N and that are in the mother code sequence. The reliability sequence with the length of N is obtained by the processor by extending, by using an element in the reliability reference sequence $\{PW_i, i=2^{l_s}, 2^{l_s+1}, \ldots, 2^{l_{max}-1}\}$, the reliability sequence $\{PW_i, 0 \leq i \leq 2^{l_s}\}$ with the length of $N_s$ and corresponding to the basic sequence.

In addition, the memory 403 is further configured to record a reliability sorting sequence Q, where the reliability sorting sequence Q is obtained by the controller/processor 402 by performing sorting on elements in the reliability sequence with the length of N based on reliability values. The controller/processor 402 is further configured to obtain an information bit sequence number set A, where a quantity of elements in the information bit sequence number set A is equal to a threshold K; and the elements in the information bit sequence number set A are elements that are in the reliability sorting sequence Q and whose sequence numbers do not satisfy a rate matching condition.

In another implementation, the controller/processor 402 is further configured to obtain an information bit sequence number set A, where a quantity of elements in the information bit sequence number set A is equal to a threshold K; and the elements in the information bit sequence number set A are elements that are in the reliability sequence with the length of N, whose values are greater than or equal to a threshold $PW_{th}$ of a polar code, and whose sequence numbers do not satisfy a rate matching condition.

In another implementation, the controller/processor 402 is further configured to: when $N \leq N_s$, obtain N elements from the reliability sequence corresponding to the basic sequence, where values of the N elements are greater than those of the $N_s-N$ elements in the $N_s$ elements; and form a coding sequence by using bit positions that are corresponding to the N elements and that are in the basic sequence.

When $N > N_s$, the controller/processor 402 is further configured to obtain, based on $N_{seg}$ times, N elements from the reliability sequence corresponding to the basic sequence, and form a coding sequence by using bit positions that are corresponding to the N elements and that are in the mother code sequence, where $N_{seg} = N/N_s$.

Bit positions that are corresponding to K elements in the N elements and that are in the mother code sequence are used for information bit transmission.

The K elements are elements that are in the reliability sequence with the length of N, whose values are greater than or equal to a threshold $PW_{th}$ of a polar code, and whose sequence numbers do not satisfy a rate matching condition. The processor selects a complementary set of the K elements used for information bit transmission, to obtain N–K elements used for frozen bit transmission.

Alternatively, bit positions that are corresponding to the N–K elements in the N elements other than the K elements and that are in the mother code sequence are used for frozen bit transmission. The N–K elements used for frozen bit transmission are elements that are in the reliability sequence with the length of N and whose values are less than a threshold $PW_{th}$ of the coding sequence or whose sequence numbers satisfy rate matching. The controller/processor 402 selects a complementary set of the N–K elements used for frozen bit transmission, to obtain the K elements used for information bit transmission. The K elements used for information bit transmission and the N–K elements used for frozen bit transmission form the N elements with a coding length.

During the $x^{th}$ time of reading in the $N_{seg}$ times of reading, the controller/processor 402 reads $N_s$ elements in the reliability sequence with the length of N, and corresponding to the basic sequence; calculates a threshold $PW_{th,x-1}$ based on a threshold $PW_{th}$ of the coding sequence, calculates a sequence number $i+(x-1)gN_s$ based on a sequence number i of the $N_s$ elements; selects an element that is in the $N_s$ elements, whose reliability is greater than or equal to the threshold $PW_{th,x-1}$, and whose sequence number $i+(x-1)gN_s$ does not satisfy a rate matching condition; and adds the sequence number $i+(x-1)gN_s$ of the element to an information bit sequence number set A used for information bit transmission, where a quantity of elements in the information bit sequence number set A is equal to a threshold K.

The controller/processor 402 selects a complementary set of the information bit sequence number set A to obtain N–K elements used for frozen bit transmission, and forms N elements with the coding length by using the K elements in the information bit sequence number set A that are used for information bit transmission and the N–K elements used for frozen bit transmission.

Alternatively, the obtaining, based on $N_{seg}$ times, N elements from the reliability sequence corresponding to the basic sequence includes:

during the $x^{th}$ time of reading in the $N_{seg}$ times of reading, reading, by the controller/processor 402, $N_s$ elements in the reliability sequence with the length of $N_s$, and calculating a threshold $PW_{th,x-1}$ based on a threshold $PW_{th}$ of a polar code;

calculating, by the controller/processor 402, a sequence number $i+(x-1)gN_s$ based on a sequence number i of the $N_s$ elements, selecting an element that is in the $N_s$ elements and whose reliability is less than the threshold $PW_{th,x-1}$ or whose sequence number $i+(x-1)gN_s$ satisfies a rate matching condition, and adding the sequence number $i+(x-1)gN_s$ of the element to a frozen-bit sequence number set $A^c$ used for frozen bit transmission;

selecting, by the controller/processor 402, a complementary set of the frozen-bit sequence number set $A^c$ to obtain K elements used for information bit transmission, to form an information bit sequence number set A, where a quantity of the elements in the information bit sequence number set A is equal to a threshold K; and forming the N elements with a coding length by using the K elements in the information bit sequence number set A that are used for information bit transmission and the N–K elements used for frozen bit transmission.

For processing operations, refer to the method Embodiment 2 to Embodiment 4, and details are not repeated herein.

Further, the apparatus for constructing a polar code may further include an encoder 4051, a modulator 4052, a demodulator 4054, and a decoder 4053. The encoder 4051 is configured to obtain data/signaling that is to be sent by a network side device to a terminal or data/signaling that is to be sent by the terminal to the network side device, and encode the data/signaling. The modulator 4052 modulates data/signaling obtained by encoding by the encoder 4051 and transmits modulated data/signaling to a transceiver 401, and the transceiver 401 sends the modulated data/signaling to the terminal or another network side device.

The demodulator 4054 is configured to obtain the data/signaling sent by the terminal or the another network side device, and perform demodulation on the data/signaling. The decoder 4053 is configured to decode data/signaling obtained through demodulation by the demodulator 4054.

The foregoing encoder 4051, modulator 4052, demodulator 4054, and decoder 4053 can be implemented by an integrated modem processor 405. These units perform processing according to a wireless access technology used in a wireless access network (for example, an access technology used for an LTE system and another evolved system).

Figure 8:
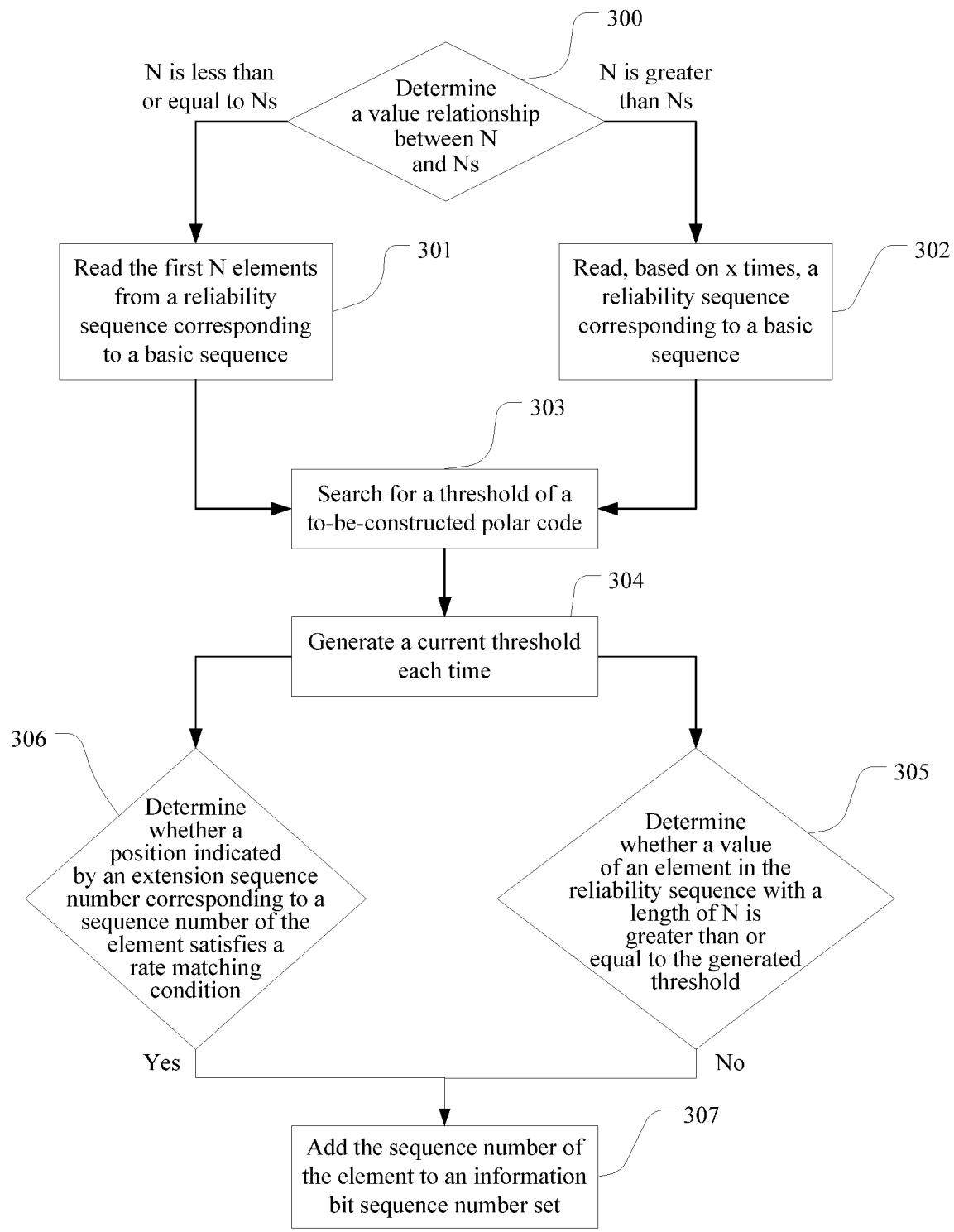
FIG. 8 is another schematic diagram of Embodiment 5 of a method for constructing a coding sequence according to this application.

The network side device may further include a communications interface 404, configured to support communication between the apparatus for constructing a polar code and another network entity. It can be understood that, FIG. 8 only shows a simplified design of the apparatus for constructing a polar code. In actual application, the foregoing transceiver 401 may include a transmitter and a receiver, and the apparatus may include any quantity of transmitters, any quantity of processors, any quantity of controllers/processors, any quantity of memories, any quantity of communications interface, and/or the like.

In an implementation, the foregoing apparatus may be a terminal or a network side device. The network side device may be a base station or a control node.

In this application, a controller/processor of the foregoing base station, terminal, or control node may be a central processing unit (CPU), a general purpose processor, a digital signal processor (DSP), an application-specific integrated circuit (ASIC), a field programmable gate array (FPGA) or another programmable logic device, a transistor logic device, a hardware component, or any combination thereof. The controller/processor may implement or execute various example logical blocks, modules, and circuits described with reference to content disclosed in this application. Alternatively, the processor may be a combination of processors implementing a computing function, for example, a combination of one or more microprocessors, or a combination of the DSP and a microprocessor.

Method or algorithm operations described with reference to the content disclosed in this application may be implemented by hardware, or may be implemented by a processor by executing a software instruction (for example, program code). The software instruction may be formed by a corresponding software module. The software module may be located in a RAM memory, a flash memory, a ROM memory, an EPROM memory, an EEPROM memory, a register, a hard disk, a removable magnetic disk, a CD-ROM, or a storage medium of any other form known in the art. For example, a storage medium is coupled to a processor, so that the processor can read information from the storage medium or write information into the storage medium. Certainly, the storage medium may be alternatively a component of the processor. The processor and the storage medium may be located in the ASIC. In addition, the ASIC may be located in a terminal. Certainly, the processor and the storage medium may exist in the terminal as discrete components.

A person skilled in the art should be aware that in the foregoing one or more examples, functions described in this application may be implemented by hardware, software, firmware, or any combination thereof. When the present invention is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general-purpose or dedicated computer.

The objectives, technical solutions, and benefits of this application are further described in detail in the foregoing embodiments. It should be understood that the foregoing descriptions are merely specific embodiments of this application, but are not intended to limit the protection scope of this application. Any modification, equivalent replacement or improvement made based on technical solutions of this application shall fall within the protection scope of this application.

What is claimed is:

1. A method comprising:
    storing, by a terminal or a network device, a reliability sequence corresponding to a basic sequence, wherein a length of the reliability sequence corresponding to the basic sequence is less than or equal to a length of a reliability sequence corresponding to a mother code sequence;
    storing a reliability reference sequence, wherein the reliability reference sequence comprises at least one element that remains after the reliability sequence corresponding to the basic sequence is excluded from the reliability sequence corresponding to the mother code sequence;
    constructing a coding sequence by using the reliability sequence corresponding to the basic sequence and an element from the at least one element in the reliability reference sequence; and
    coding data using the coding sequence, the data to be communicated by the terminal or the network device.

2. The method for constructing a coding sequence according to claim 1, wherein the length of the reliability sequence corresponding to the mother code sequence is $N_{max}=2^{l_{max}}$, and the length of the reliability sequence corresponding to the basic sequence is $N_s=2^{l_s}$, wherein $0 \le l_s < l_{max}$.

3. The method for constructing a coding sequence according to claim 2, wherein an $i^{th}$ element in the reliability sequence corresponding to the basic sequence is $PW_i = \sum_{j=0}^{n-1} B_j(\beta)^j$, wherein $0 \le i \le 2^{l_s}$, $(i)_{dec} \triangleq (B_{n-1} B_{n-2} \ldots B_0)_{bin}$, $(i)_{dec}$ indicates that i is a decimal number, $(B_{n-1} B_{n-2} \ldots B_0)_{bin}$ indicates a binary number; and $\beta$ is an exponent base.

4. The method for constructing a coding sequence according to claim 2, wherein $l_{max} \in [8, 9, 10, 11, 12]$; the length of the reliability sequence corresponding to the mother code sequence is $N_{max}=2^{l_{max}} \in [256, 512, 1024, 2048, 4096]$; $l_s \in [0, 1, 2, 3, 4, 5, 6, 7, 8, 9, 10, 11]$; and the length of the reliability sequence corresponding to the basic sequence is $N_s=2^{l_s} \in [1, 2, 4, 8, 16, 32, 64, 128, 256, 512, 1024, 2048]$.

5. The method for constructing a coding sequence according to claim 2, wherein constructing a coding sequence with a length of N, a coding length of M, and an information length of $K_{info}$ by using the reliability sequence corresponding to the basic sequence and the reliability reference sequence comprises:
    when $N \le N_s$, obtaining$_N$ elements from the reliability sequence corresponding to the basic sequence, wherein values of the N elements are greater than those of the $N_s$–N elements in the $N_s$ elements; and forming the coding sequence by using bit positions that are corresponding to the N elements and that are in the basic sequence; or
    when $N > N_s$, extending, based on an element in the reliability reference sequence, the reliability sequence corresponding to the basic sequence, to form a reliability sequence with a length of N, and forming the coding sequence by using bit positions that are corresponding to the reliability sequence with the length of N and that are in the mother code sequence.

6. The method for constructing a coding sequence according to claim 2, wherein the constructing a coding sequence by using the basic sequence and the reliability reference sequence comprises:
    when $N \le N_s$, obtaining N elements from the reliability sequence corresponding to the basic sequence, wherein values of the N elements are greater than those of the $N_s$–N elements in the $N_s$ elements, and forming the coding sequence by using bit positions that are corresponding to the N elements and that are in the basic sequence; or
    when $N > N_s$, obtaining, based on $N_{seg}$ times, N elements from the reliability sequence corresponding to the basic sequence, and forming the coding sequence by using bit positions that are corresponding to the N elements and that are in the mother code sequence, wherein $N_{seg}=N/N_s$.

7. The method for constructing a coding sequence according to claim 6, wherein bit positions that are corresponding to K elements in the N elements and that are in the mother code sequence are used for information bit transmission;

the K elements are elements that are in the reliability sequence with the length of N, whose values are greater than or equal to a threshold $PW_{th}$ of a polar code, and whose sequence numbers do not satisfy a rate matching condition;

a complementary set of the K elements used for information bit transmission is selected to obtain N—K elements used for frozen bit transmission; and the K elements used for information bit transmission and the N−K elements used for frozen bit transmission form the N elements with a coding length.

8. The method for constructing a coding sequence according to claim 6, wherein bit positions that are corresponding to the N−K elements in the N elements other than the K elements and that are in the mother code sequence are used for frozen bit transmission, and the N−K elements used for frozen bit transmission are elements that are in the reliability sequence with the length of N and whose values are less than a threshold $PW_{th}$ of the coding sequence or whose sequence numbers satisfy rate matching;

a complementary set of the N−K elements used for frozen bit transmission is selected to obtain the K elements used for information bit transmission; and the K elements used for information bit transmission and the N−K elements used for frozen bit transmission form the N elements with a coding length.

9. The method for constructing a coding sequence according to claim 6, wherein the obtaining, based on $N_{seg}$ times, N elements from the reliability sequence corresponding to the basic sequence comprises:

during the $x^{th}$ time of reading in the $N_{seg}$ times of reading, reading $N_s$ elements in the reliability sequence with the length of $N_s$ and corresponding to the basic sequence, calculating a threshold $PW_{th,x-1}$ based on a threshold $PW_{th}$ of the coding sequence, calculating a sequence number $i+(x-1)\cdot N_s$ based on a sequence number i of the $N_s$ elements, selecting an element that is in the $N_s$ elements, whose reliability is greater than or equal to the threshold $PW_{th,x-1}$, and whose sequence number $i+(x-1)\cdot N_s$ does not satisfy a rate matching condition, and adding the sequence number $i+(x-1)\cdot N_s$ of the element to an information bit sequence number set A used for information bit transmission, wherein a quantity of elements in the information bit sequence number set A is equal to a threshold K;

selecting a complementary set of the information bit sequence number set A to obtain N−K elements used for frozen bit transmission; and forming the N elements with a coding length by using the K elements in the information bit sequence number set A that are used for information bit transmission and the N−K elements used for frozen bit transmission.

10. The method for constructing a coding sequence according to claim 6, wherein the obtaining, based on $N_{seq}$ times, N elements from the reliability sequence corresponding to the basic sequence comprises:

during the $x^{th}$ time of reading in the $N_{seq}$ times of reading, reading $N_s$ elements in the reliability sequence with the length of $N_s$, and calculating a threshold $PW_{th,x-1}$ based on a threshold $PW_{th}$ of a polar code;

calculating a sequence number $i+(x-1)\cdot N_s$ based on a sequence number i of the $N_s$ elements, selecting an element that is in the $N_s$ elements and whose reliability is less than the threshold $PW_{th,x-1}$ or whose sequence number $i+(x-1)\cdot N_s$ satisfies a rate matching condition, and adding the sequence number $i+(x-1)\cdot N_s$ of the element to a frozen-bit sequence number set $A^c$ used for frozen bit transmission;

selecting a complementary set of the frozen-bit sequence number set $A^c$ to obtain K elements used for information bit transmission, to form an information bit sequence number set A, wherein a quantity of the elements in the information bit sequence number set A is equal to a threshold K; and forming the N elements with a coding length by using the K elements in the information bit sequence number set A that are used for information bit transmission and the N−K elements used for frozen bit transmission.

11. An apparatus, comprising:

a memory, configured to store a reliability sequence corresponding to a basic sequence, wherein a length of the reliability sequence corresponding to the basic sequence is less than or equal to a length of a reliability sequence corresponding to a mother code sequence, wherein the memory is further configured to store a reliability reference sequence, wherein the reliability reference sequence comprises at least one element that remains after the reliability sequence corresponding to the basic sequence is excluded from the reliability sequence corresponding to the mother code sequence; and a processor, configured to construct a coding sequence by using the reliability sequence corresponding to the basic sequence and the reliability reference sequence that are stored in the memory, where the processor is further configured to code data using the coding sequence, the data to be communicated by a terminal or a network device.

12. The apparatus for constructing a coding sequence according to claim 11, wherein the length of the reliability sequence corresponding to the mother code sequence is $N_{max}=2^{l_{max}}$, and the length of the reliability sequence corresponding to the basic sequence is $N_s=2^{l_s}$, wherein $0 \le l_s < l_{max}$.

13. The apparatus for constructing a coding sequence according to claim 12, wherein an $i^{th}$ element in the reliability sequence corresponding to the basic sequence is $PW_i = \sum_{j=0}^{n-1} B_j (\beta)^j$, and $(i)_{dec} \triangleq (B_{n-1} \ B_{n-2} \ \ldots \ B_0)_{bin}$, wherein $(i)_{dec}$ indicates that i is a decimal number, $(B_{n-1} \ B_{n-2} \ \ldots \ B_0)_{bin}$ indicates a binary number; and β is an exponent base.

14. The apparatus for constructing a coding sequence according to claim 12, wherein $l_{max} \in [8, 9, 10, 11, 12]$, the length of the reliability sequence corresponding to the mother code sequence is $N_{max}=2^{l_{max}} \in [256, 512, 1024, 2048, 4096]$, $l_s \in [0, 1, 2, 3, 4, 5, 6, 7, 8, 9, 10, 11]$; and the length of the reliability sequence corresponding to the basic sequence is $N_s=2^{l_s} \in [1, 2, 4, 8, 16, 32, 64, 128, 256, 512, 1024, 2048]$.

15. The apparatus for constructing a coding sequence according to claim 12, wherein that the processor is further configured to construct a coding sequence with a length of N, a coding length of M, and an information length of $K_{info}$ by using the reliability sequence corresponding to the basic sequence and the reliability reference sequence comprises:

when $N \le N_s$, obtaining N elements from the reliability sequence corresponding to the basic sequence, wherein values of the N elements are greater than those of the $N_s$−N elements in the $N_s$ elements; and forming the coding sequence by using bit positions that are corresponding to the N elements and that are in the basic sequence; or when $N > N_s$, extending, based on an element in the reliability reference sequence, the reliability sequence corresponding to the basic sequence, to form a reliability sequence with a length of N, and forming the coding sequence by using bit positions that are corresponding to the reliability sequence with the length of N and that are in the mother code sequence.

16. The apparatus for constructing a coding sequence according to claim 12, wherein the apparatus further comprises:

the processor, configured to obtain N elements from the reliability sequence corresponding to the basic sequence, wherein values of the $N_s$ elements are greater than those of the $N_s$−N elements in the $N_s$ elements, and form the coding sequence by using bit positions that are corresponding to the N elements and that are in the basic sequence; or when $N > N_s$, obtain, based on $N_{seg}$ times, N elements from the reliability sequence corresponding to the basic sequence, and form the coding sequence by using bit positions that are corresponding to the N elements and that are in the mother code sequence, wherein $N_{seg} = N/N_s$.

17. The apparatus for constructing a coding sequence according to claim 16, wherein bit positions that are in the mother code sequence and that are corresponding to K elements in the N elements obtained by the processor are used for information bit transmission;

the K elements are elements that are in the reliability sequence with the length of N, whose values are greater than or equal to a threshold $PW_{th}$ of a polar code, and whose sequence numbers do not satisfy a rate matching condition;

the processor selects a complementary set of the K elements used for information bit transmission, to obtain N−K elements used for frozen bit transmission; and the K elements used for information bit transmission and the N−K elements used for frozen bit transmission form N elements with a coding length.

18. The apparatus for constructing a coding sequence according to claim 16, wherein bit positions that are in the mother code sequence and that are corresponding to the N−K elements in the N elements, other than the K elements, obtained by the processor are used for frozen bit transmission, and the N−K elements used for frozen bit transmission are elements that are in the reliability sequence with the length of N and whose values are less than a threshold $PW_{th}$ of the coding sequence or whose sequence numbers satisfy rate matching;

the processor selects a complementary set of the N−K elements used for frozen bit transmission, to obtain the K elements used for frozen bit transmission; and the K elements used for information bit transmission and the N−K elements used for frozen bit transmission form the N elements with a coding length.

19. The apparatus for constructing a coding sequence according to claim 16, wherein that the processor obtains, based on $N_{seq}$ times, N elements from the reliability sequence corresponding to the basic sequence comprises:

during the $x^{th}$ time of reading in the $N_{seg}$ times of reading in the information bit sequence number set, reading $N_s$ elements in the reliability sequence with the length of $N_s$ and corresponding to the basic sequence; calculating a threshold $PW_{th,x-1}$ based on a threshold $PW_{th}$ of the coding sequence, calculating a sequence number $i+(x-1)\cdot N_s$ based on a sequence number i of the $N_s$ elements; selecting an element that is in the $N_s$ elements, whose reliability is greater than or equal to the threshold $PW_{th,x-1}$, and whose sequence number $i+(x-1)\cdot N_s$, does not satisfy a rate matching condition, and adding the sequence number $i+(x-1)\cdot N_s$ of the element to an information bit sequence number set A used for information bit transmission, wherein a quantity of elements in the information bit sequence number set A is equal to a threshold K;

selecting, by the processor, a complementary set of the information bit sequence number set A to obtain N−K elements used for frozen bit transmission; and forming the N elements with a coding length by using the K elements in the information bit sequence number set A that are used for information bit transmission and the N−K elements used for frozen bit transmission.

20. The apparatus for constructing a coding sequence according to claim 16, wherein that the processor obtains, based on $N_{seq}$ times, N elements from the reliability sequence corresponding to the basic sequence comprises:

during the $x^{th}$ time of reading in the $N_{seq}$ times of reading, reading $N_s$ elements in the reliability sequence corresponding to the basic sequence with the length of $N_s$, and calculating a threshold $PW_{th,x-1}$ based on a threshold $PW_{th}$ of a polar code;

calculating a sequence number $i+(x-1)\cdot N_s$ based on a sequence number i of the $N_s$ elements, selecting an element that is in the $N_s$ elements and whose reliability is less than the threshold $PW_{th,x-1}$ or whose sequence number $i+(x-1)\cdot N_s$ satisfies a rate matching condition, and adding the sequence number $i+(x-1)\cdot N_s$, of the element to a frozen-bit sequence number set $A^c$ used for frozen bit transmission;

selecting, by the processor, a complementary set of the frozen-bit sequence number set $A^c$ to obtain an information bit sequence number set A used for information bit transmission, wherein a quantity of elements in the information bit sequence number set A is equal to a threshold K; and forming the N elements with a coding length by using the K elements in the information bit sequence number set A that are used for information bit transmission and the N−K elements used for frozen bit transmission.

* * * * *